(12) United States Patent
Okamoto

(10) Patent No.: US 10,050,237 B2
(45) Date of Patent: Aug. 14, 2018

(54) ORGANIC ELECTROLUMINESCENCE ELEMENT

(71) Applicant: KONICA MINOLTA, INC., Chiyoda-ku (JP)

(72) Inventor: Ken Okamoto, Hachioji (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 15/525,161

(22) PCT Filed: Nov. 5, 2015

(86) PCT No.: PCT/JP2015/081135
§ 371 (c)(1),
(2) Date: May 8, 2017

(87) PCT Pub. No.: WO2016/076187
PCT Pub. Date: May 19, 2016

(65) Prior Publication Data
US 2017/0338446 A1    Nov. 23, 2017

(30) Foreign Application Priority Data
Nov. 14, 2014 (JP) .................................. 2014-231166

(51) Int. Cl.
*H01L 51/52* (2006.01)

(52) U.S. Cl.
CPC ...... *H01L 51/5278* (2013.01); *H01L 51/5206* (2013.01); *H01L 51/5221* (2013.01); *H01L 2251/533* (2013.01)

(58) Field of Classification Search
CPC . H01L 51/52; H01L 51/5278; H01L 51/5206; H01L 51/5221; H01L 51/5044
See application file for complete search history.

(56) References Cited

U.S. PATENT DOCUMENTS

2010/0301744 A1* 12/2010 Osaka ................... C07C 211/54
                                                          313/504
2014/0014933 A1*  1/2014 Sasaki ................. H01L 51/5044
                                                          257/40
(Continued)

FOREIGN PATENT DOCUMENTS

JP    2012-234733    11/2012
JP    2013-153198     8/2013

OTHER PUBLICATIONS

Preliminary Report on Patentability dated May 16, 2017 which issued in the corresponding International Patent Application No. PCT/JP2015/081135.

*Primary Examiner* — Phuc Dang
(74) *Attorney, Agent, or Firm* — Cozen O'Connor

(57) ABSTRACT

An object of the present invention is to provide an organic electroluminescent element containing: a plurality of light emitting units interposed between a pair of an anode and a cathode; and a charge generating unit formed between the light emitting units, wherein a light emitting layer of a light emitting unit located in an N-th order from the anode and a light emitting layer of a light emitting unit located in an (N+1)-th order from the anode each contain an emission dopant to emit light of the same emission color; and a largest maximum emission wavelength in a photoluminescent spectrum of the emission dopant in the light emitting layer of the N-th light emitting unit is shorter than a largest maximum emission wavelength in a photoluminescent spectrum of the emission dopant in the light emitting layer of the (N+1)-th light emitting unit.

4 Claims, 2 Drawing Sheets

(56) References Cited

U.S. PATENT DOCUMENTS

| | | | |
|---|---|---|---|
| 2015/0188073 A1* | 7/2015 | Ahn | H01L 27/3209 257/40 |
| 2015/0188076 A1* | 7/2015 | Kum | H01L 51/5278 257/40 |
| 2016/0163768 A1* | 6/2016 | Song | H01L 27/322 257/40 |

* cited by examiner

ORGANIC ELECTROLUMINESCENCE ELEMENT

RELATED APPLICATIONS

This is a U.S. National Phase Application under 35 USC 371 of International Application PCT/JP2015/081135 filed on Nov. 5, 2015.

This application claims the priority of Japanese application no. 2014-231166 filed Nov. 14, 2014, the entire content of which is hereby incorporated by reference.

TECHNICAL FIELD

The present invention relates to an organic electroluminescent element. More specifically, the present invention relates to an organic electroluminescent element of high efficiency and long life.

BACKGROUND

In order to achieve an organic electroluminescence (EL) element of long life, it is known that one of the effective methods is to make a multi-unit type organic electroluminescent element (for example, refer to Non-patent document 1).

As applications of this organic electroluminescent element, there are many kinds of applications for outdoors as a single color light such as: an electric bulletin board, a traffic light, various lightings, a light for passenger car, motorbike, or bicycle, and a lighting source. From the viewpoint of efficiency, life, and reliability, LEDs, incandescent lamps, and fluorescent lamps have been used until now.

As a factor of decreased efficiency of an organic EL element and decreased light emission life with the same luminescence, the following are known. One is an absorption loss in which the emission light from the light emitting layer located near to the reflective electrode side is absorbed by the layers (in particular, organic layers) existing nearer to the transparent electrode side than the light emitting layer that emits the light. The other is a light degradation of the materials produced when the emission light is absorbed by the materials such as emission dopants contained in the light emitting layer located nearer to the transparent electrode side than the light emitting layer that emits the light.

Particularly, in a multi-unit type organic electroluminescent element having an emitting light of the same emission color, the emitting light from the reflective electrode side is absorbed by the emission dopant contained in a light emitting layer located in a light emitting layer nearer to the transparent electrode than the light emitting layer that emits the light. Further, by the light degradation of the dopant contained in the light emitting layer located in the transparent electrode side, decreased efficiency and decreased light emission life were produced.

PRIOR ART DOCUMENTS

Non-Patent Documents

Non-patent document 1: "Organic EL display" p. 51 (Ohmsha, Ltd.)

SUMMARY OF THE INVENTION

Problems to be Solved by the Invention

The present invention has been made in view of the above-described problems and situation. An object of the present invention is to provide an organic electroluminescent element of high efficiency and long life.

Means to Solve the Problems

The present inventors have made investigation into the reasons of the above-described problems in order to solve the problems. As a result, it was found to provide an organic electroluminescent element of high efficiency and long life by making a constitution as follows:

a light emitting layer of a light emitting unit located in an N-th order from the anode and a light emitting layer of a light emitting unit located in an (N+1)-th order from the anode each contain an emission dopant to emit light of the same emission color; and a largest maximum emission wavelength in a photoluminescent spectrum of the emission dopant in the light emitting layer of the N-th light emitting unit and a largest maximum emission wavelength in a photoluminescent spectrum of the emission dopant in the light emitting layer of the (N+1)-th light emitting unit have a predetermined ranking.

Thus, the present invention was achieved.

That is, the above-described problems of the present invention are solved by the following embodiments.

1. An organic electroluminescent element comprising: a plurality of light emitting units interposed between a pair of an anode and a cathode; and a charge generating unit formed between the light emitting units, wherein a light emitting layer of a light emitting unit located in an N-th order from the anode and a light emitting layer of a light emitting unit located in an (N+1)-th order from the anode each contain an emission dopant emitting light of the same emission color; and a largest maximum emission wavelength in a photoluminescent spectrum of the emission dopant in the light emitting layer of the N-th light emitting unit is shorter than a largest maximum emission wavelength in a photoluminescent spectrum of the emission dopant in the light emitting layer of the (N+1)-th light emitting unit.

2. An organic electroluminescent element of the embodiment 1, wherein the largest maximum emission wavelength in the photoluminescent spectrum of the emission dopant in the light emitting layer of the N-th light emitting unit is shorter by 1 to 50 nm than the largest maximum emission wavelength in the photoluminescent spectrum of the emission dopant in the light emitting layer of the (N+1)-th light emitting unit.

3. An organic electroluminescent element of the embodiment 2, wherein the largest maximum emission wavelength in the photoluminescent spectrum of the emission dopant in the light emitting layer of the N-th light emitting unit is shorter by 5 to 50 nm than the largest maximum emission wavelength in the photoluminescent spectrum of the emission dopant in the light emitting layer of the (N+1)-th light emitting unit.

4. An organic electroluminescent element of the embodiment 3, wherein the largest maximum emission wavelength in the photoluminescent spectrum of the emission dopant in the light emitting layer of the N-th light emitting unit is shorter by 20 to 50 nm than the largest maximum emission wavelength in the photoluminescent spectrum of the emission dopant in the light emitting layer of the (N+1)-th light emitting unit.

5. An organic electroluminescent element of any one of the embodiments 1 to 4, wherein an absorption spectrum of a material incorporated from the anode till the light emitting layer of the (N+1)-th light emitting unit and the photoluminescent spectrum of the emission dopant contained in the light emitting layer of the (N+1)-th light emitting unit satisfy the following conditional expression (1).

$$\lambda_{Am(lw)} - \lambda_{N+1(sw)} \leq 50 \text{ nm} \quad \text{Conditional expression (1):}$$

In the conditional expression (1), $\lambda_{Am(lw)}$ (nm) is a terminal wavelength of a longer wavelength side of the absorption spectrum of the material incorporated from the anode till the light emitting layer of the (N+1)-th light emitting unit; and $\lambda_{N+1(sw)}$ (nm) is a terminal wavelength of a shorter wavelength side of the photoluminescent spectrum of the emission dopant contained in the light emitting layer of the (N+1)-th light emitting unit.

6. An organic electroluminescent element of any one of the embodiments 1 to 5, wherein all of the light emitting layers in the plurality of light emitting units contain the emission dopant having an emission light of the same emission color.

Effects of the Invention

By the above-described embodiments of the present invention, it is possible to provide an organic electroluminescent element of high efficiency and long life.

A formation mechanism or an action mechanism of the effects of the present invention is not clearly identified, but it is supposed as follows.

In the present invention, an organic electroluminescent element of high efficiency and long life is achieved by making the following constitution: a largest maximum emission wavelength in a photoluminescent (PL) spectrum of the emission dopant in the light emitting layer of the N-th light emitting unit is made to be shorter than a largest maximum emission wavelength in a PL spectrum of the emission dopant in the light emitting layer of the (N+1)-th light emitting unit.

FIG. 1 illustrates a PL spectrum $P_{N+1}$ of the emission dopant used in the light emitting layer of the (N+1)-th light emitting unit, and a photoluminescent (PL) spectrum $P_N$ and an absorption spectrum $A_N$ of the emission dopant used in the light emitting layer of the N-th light emitting unit.

As described above, in a known multi-unit type organic EL element having an emitting light of the same emission color, the emitting light from the reflective electrode side is absorbed by the emission dopant contained in a light emitting layer located in a light emitting layer nearer to the transparent electrode than the light emitting layer that emits the light. Further, by the light degradation of the dopant contained in the light emitting layer located in the transparent electrode side, decreased efficiency and decreased light emission life were produced.

In contrast to this, the present invention utilizes the following embodiment by suitably combining the emission dopant used in each light emitting unit. A largest maximum emission wavelength $\lambda_{N(max)}$ in a PL spectrum $P_N$ of the emission dopant in the light emitting layer of the N-th light emitting unit is made to be shorter than a largest maximum emission wavelength $\lambda_{N+1(max)}$ in a PL spectrum $P_{N+1}$ of the emission dopant in the light emitting layer of the (N+1)-th light emitting unit. By this, an overlapped portion S of a tail in the short wavelength side of the PL spectrum $P_{N+1}$ and a tail in the long wavelength side of the absorption spectrum $A_N$ is made to be small. As a result, it will be decreased an absorption loss caused by the absorption of the emitting light from the light emitting layer of the (N+1)-th light emitting unit by the light emitting layer material (including a host compound) contained in the N-th light emitting unit. Further, it will be prevented light degradation of the dopant material to result in achieving high efficiency and long life of the organic EL element.

EMBODIMENTS TO CARRY OUT THE INVENTION

Figure 1:
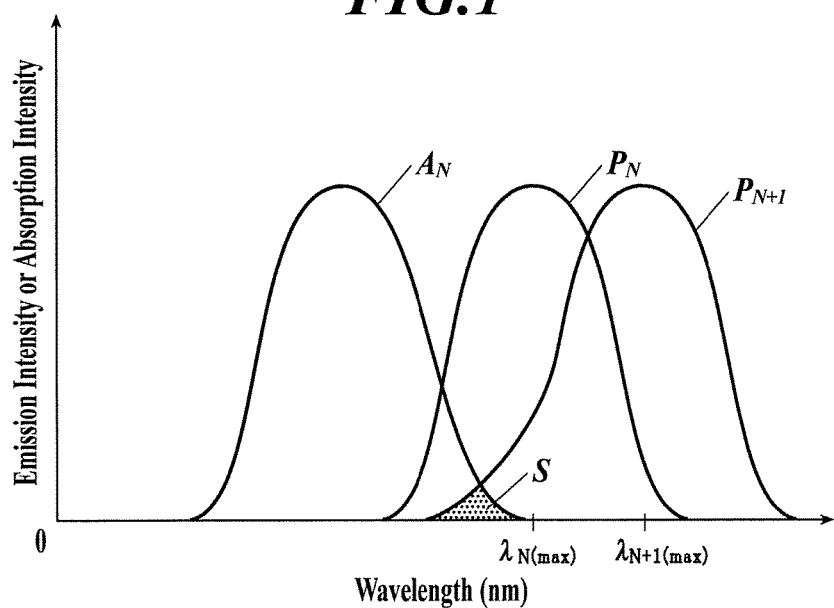
FIG. 1 is a drawing illustrating an example of a PL spectrum and an absorption spectrum of an organic EL element of the present invention.

An organic electroluminescent element of the present invention is characterized in the following: a light emitting layer of a light emitting unit located in an Nth order from an anode and a light emitting layer of a light emitting unit located in an (N+1)-th order each contain an emission dopant to emit light of the same emission color; and a largest maximum emission wavelength in a photoluminescent spectrum of the emission dopant in the light emitting layer of the N-th light emitting unit is shorter than a largest maximum emission wavelength in a photoluminescent spectrum of the emission dopant in the light emitting layer of the (N+1)-th light emitting unit.

These features are technical features commonly owned by the invention according to the above-described embodiments.

As an embodiment of the present invention, from the viewpoint of improving a light emission efficiency and emission life, it is preferable that the largest maximum emission wavelength in the photoluminescent spectrum of the emission dopant in the light emitting layer of the N-th light emitting unit is shorter by 1 to 50 nm than the largest maximum emission wavelength in the photoluminescent spectrum of the emission dopant in the light emitting layer of the (N+1)-th light emitting unit. More preferably, it is shorter by 5 to 50 nm, and still more preferably, it is shorter by 20 to 50 nm.

From the viewpoint of preventing: absorption loss by the organic layer; and light degradation of the emission dopant, it is preferable that an absorption spectrum of a material incorporated from the anode till the light emitting layer of the (N+1)-th light emitting unit located and the photoluminescent spectrum of the emission dopant contained in the light emitting layer of the (N+1)-th light emitting unit satisfy the following conditional expression (1) described later.

Further, from the viewpoint of acquiring a device of small color shift and high reliability, it is preferable that all of the light emitting layers in a plurality of light emitting units contain an emission dopant to emit light of the same emission color.

The present invention and the constitution elements thereof, as well as configurations and embodiments, will be detailed in the following. In the present description, when two figures are used to indicate a range of value before and after "to", these figures themselves are included in the range as a lowest limit value and an upper limit value.

《Constitution of Organic EL Element》

An organic electroluminescent element of the present invention contains: a plurality of light emitting units interposed between an anode and a cathode; and a charge generating unit formed between the light emitting units. It is characterized in that:

a light emitting layer of a light emitting unit located in an N-th order from the anode and a light emitting layer of a light emitting unit located in an (N+1)-th order each contain an emission dopant to emit light of the same emission color; and a largest maximum emission wavelength in a photoluminescent (PL) spectrum of the emission dopant in the light emitting layer of the N-th light emitting unit is shorter than a largest maximum emission wavelength in a photoluminescent spectrum of the emission dopant in the light emitting layer of the (N+1)-th light emitting unit.

One of the effective methods to achieve this is to make longer wavelength of the PL spectrum of the light emitting layer of the (N+1)-th light emitting unit. This is controlled by changing the emission dopant contained in the light emitting layer of the N-th light emitting unit and the emission dopant contained in the light emitting layer of the (N+1)-th light emitting unit.

An organic EL element of the present invention may prevent Forester transition due to the separation of each light emitting unit by the charge generating unit. Therefore, it may be increased color purity of the same emission color.

A largest maximum emission wavelength in a PL spectrum of the emission dopant in the light emitting layer of the N-th light emitting unit is shorter than a largest maximum emission wavelength in a photoluminescent spectrum of the emission dopant in the light emitting layer of the (N+1)-th light emitting unit preferably by 1 to 50 nm, more preferably by 2 to 50 nm, and most preferably by 20 to 50 nm.

N is preferably an integer of 1 to 4.

Representative element constitutions of an organic EL element of the present invention are indicated in the following, however, the present invention is not limited to these.

(I) Anode/first light emitting unit/charge generating unit/second light emitting unit/cathode (II) Anode/first light emitting unit/charge generating unit/second light emitting unit/charge generating unit/third light emitting unit/cathode (III) Anode/first light emitting unit/charge generating unit/second light emitting unit/charge generating unit/third light emitting unit/charge generating unit/fourth light emitting unit/cathode (IV) Anode/first light emitting unit/charge generating unit/second light emitting unit/charge generating unit/third light emitting unit/charge generating unit/fourth light emitting unit/charge generating unit/fifth light emitting unit/cathode Preferable examples of a layer constitution of each light emitting unit are indicated in the following, however, the present invention is not limited to these.

Specific examples of a preferable layer constitution of each light emitting unit are indicated below, however, the present invention is not limited to these.

(i) (Anode side)/light emitting layer/electron transport layer/(cathode side)

(ii) (Anode side)/hole transport layer/light emitting layer/electron transport layer/(cathode side)

(iii) (Anode side)/hole transport layer/light emitting layer/electron transport layer/electron injection layer/(cathode side)

(iv) (Anode side)/hole injection layer/hole transport layer/light emitting layer/electron transport layer/electron injection layer/(cathode side)

It may be placed a hole blocking layer between a light emitting layer and a cathode or a charge generating unit when required. Further, it may be placed an electron blocking layer (it is also called as an electron barrier layer) between a light emitting layer and an anode or a charge generating unit.

In addition, it may be formed a different second or third hole transport layer or electron transport layer.

In the above-described element constitutions, the embodiments of N being 1 to 4 are described. That is, the embodiments having light emitting units of 2 to 5 are described. However, the number of the light emitting units may be 6 or more.

The present invention is characterized in that a light emitting layer of a light emitting unit located in an N-th order from the anode and a light emitting layer of a light emitting unit located in an (N+1)-th order from the anode each contain an emission dopant to emit light of the same emission color. Here, "the same emission color" indicates a color belonging to the same color type. For example, light of red color is a red color light in the wavelength range of about 550 to 700 nm. A light of green color is a green color light in the wavelength range of about 480 to 600 nm. A light of blue color is a blue color light in the wavelength range of about 400 to 530 nm. Preferably, the lights of the same emission color each have a difference of a largest emission maximum wavelength of 50 nm or less in an absolute value with each other.

The organic EL element of the present invention is preferably characterized in that an absorption spectrum of a material incorporated from the anode till the light emitting layer of the (N+1)-th light emitting unit and the PL spectrum of the emission dopant contained in the light emitting layer of the (N+1)-th light emitting unit satisfy the following conditional expression (1).

$$\lambda_{Am(lw)} - \lambda_{N+1(sw)} \leq 50 \text{ nm.} \qquad \text{Conditional expression (1):}$$

In the conditional expression:

$\lambda_{Am(lw)}$ is a terminal wavelength of a longer wavelength side of the absorption spectrum of the material incorporated from the anode till the light emitting layer of the (N+1)-th light emitting unit from the anode; and $\lambda_{N+1(sw)}$ is a terminal wavelength of a shorter wavelength side of the photoluminescent spectrum of the emission dopant contained in the light emitting layer of the (N+1)-th light emitting unit from the anode.

The present invention is described by referring to FIGs. Here, an explanation of an organic EL element is done by using the above-described constitution (I) and the above-described light emitting unit (ii) as an example.

Figure 2:
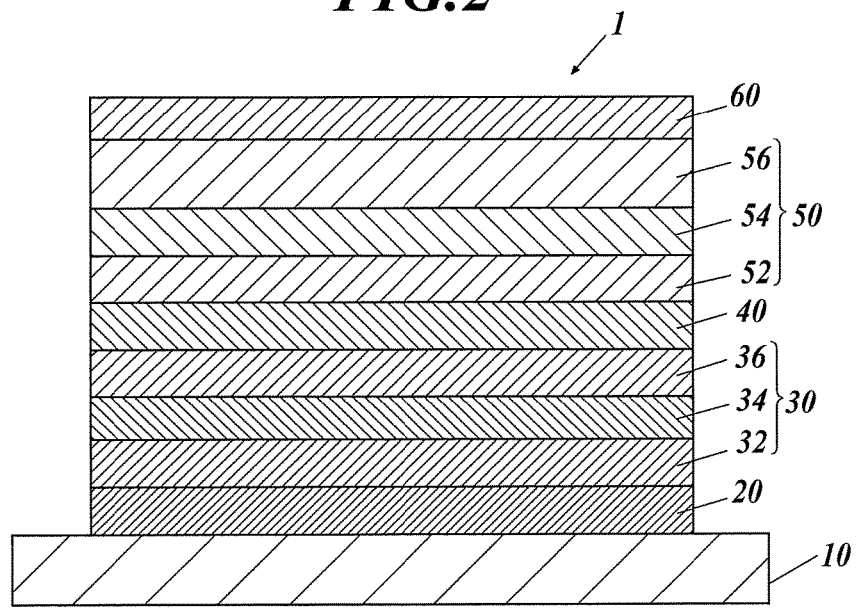
FIG. 2 is a schematic cross-sectional drawing illustrating an example of an organic EL element of the present invention.

As illustrated in FIG. 2, an organic EL element 1 is composed of a transparent substrate 10 laminated thereon in the following order: an anode 20, a first light emitting unit 30 (a hole transport layer 32, a light emitting layer 34, and an electron transport layer 36), a charge generating unit 40, a second light emitting unit 50 (a hole transport layer 52, a light emitting layer 54, and an electron transport layer 56), and a cathode.

Further, the organic EL element 1 contains a luminescent organic material in the light emitting layers 34 and 54. It is a light emitting element containing a plurality of light emitting layers having the emission dopant to emit light of the same emission color selected from Blue (B), Green (G), and Red (R) as an luminescent organic material.

The organic EL element 1 is a so-called bottom emission type that has a constitution in which the anode 20 is composed of a transparent electrode, the cathode 60 is made to function as a reflective electrode, and a light is extracted from the side of the transparent substrate 10.

Figure 3A:
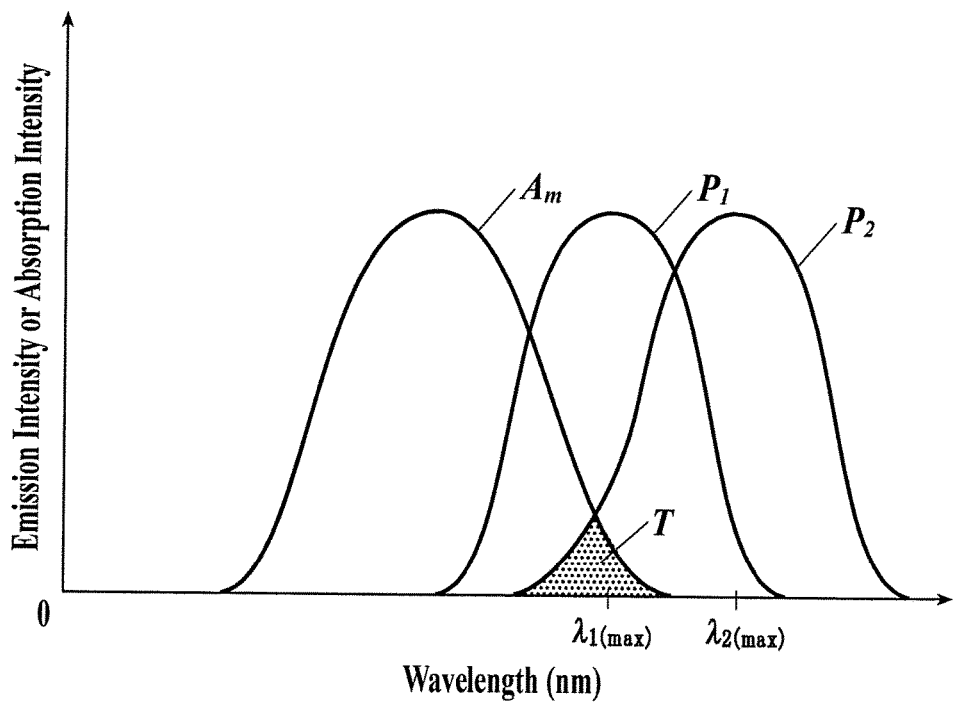
FIG. 3A is a drawing illustrating an example of a PL spectrum and an absorption spectrum of an organic EL element of the present invention.

Here, as illustrated in FIG. 3A, a largest maximum emission wavelength $\lambda_{1(max)}$ in a PL spectrum $P_1$ of the emission dopant in the light emitting layer 34 is located in a shorter side than a largest maximum emission wavelength $\lambda_{2(max)}$ in a PL spectrum $P_2$ of the emission dopant in the light emitting layer 54.

In addition, in FIG. 3A, a symbol $A_m$ indicates an absorption spectrum of the layers from the anode 20 to the light emitting layer 54 of the light emitting unit 50. Namely, $A_m$ indicates an absorption spectrum induced by the materials incorporated from the hole transport layer 32 in the light emitting unit 30 till the hole transport layer 52 in the light emitting unit 50.

When the emission light from the light emitting layer 54 is extracted from the side of the transparent substrate 10, the following is preferable: to restrain the absorption loss induced by the materials incorporated from the hole transport layer 32 in the light emitting unit 30 till the hole transport layer 52 in the light emitting unit 50. Further, in order to reduce light degradation of the emission dopant in the light emitting layer 34, it is preferable to minimize an area of an overlapped portion T formed by the PL spectrum $P_2$ and the absorption spectrum $A_m$.

Figure 3B:
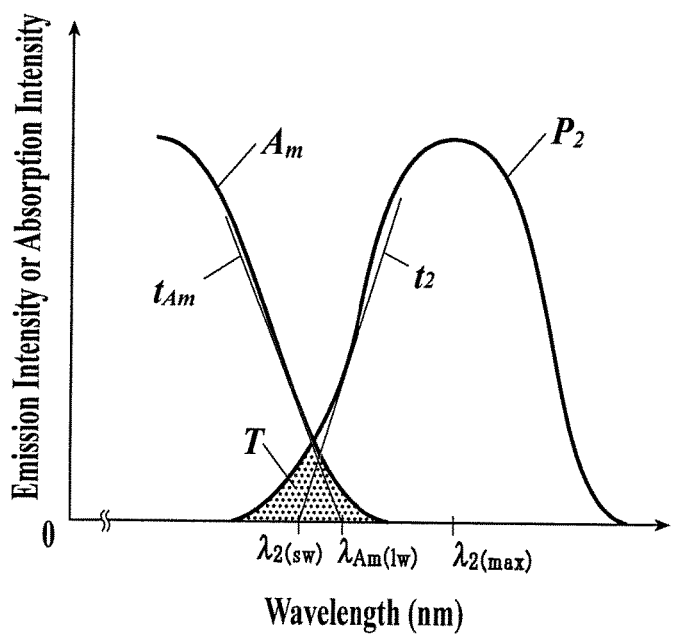
FIG. 3B is a drawing illustrating an example of a PL spectrum and an absorption spectrum of an organic EL element of the present invention.

Accordingly, in the present invention, it was found the following as illustrated in FIG. 3B. A terminal wavelength of a shorter wavelength side $\lambda_{2(sw)}$ of the PL spectrum $P_2$ and a terminal wavelength of a longer wavelength side $\lambda_{Am(lw)}$ of the absorption spectrum $A_m$ were compared. It was found that it is possible to minimize the area of the overlapped portion T, and to reduce absorption loss and light degradation of the emission dopant when the difference of ($\lambda_{Am(lw)} - \lambda_{2(sw)}$) is 50 nm or less.

In the present invention, "a terminal wavelength of a shorter wavelength side of a PL spectrum" indicates a wavelength value of an intersection point obtained from a horizontal axis and a tangential line drawn at the rising point of a shorter wavelength side of a PL spectrum. Here, the PL spectrum is represented to have a vertical line of emission intensity and a horizontal line of wavelength.

The tangential line at the rising point of a shorter wavelength side of a PL spectrum is drawn as follows. It is explained by the PL spectrum $P_2$ illustrated in FIG. 3B as taking an example.

From the sorter wavelength side of the PL spectrum $P_2$ to the maximum value of the PL spectrum $P_2$ located at the shortest wavelength side, a tangential line is drawn at each point of the spectrum while moving from the shorter wavelength side of the PL spectrum $P_2$ to the shortest maximum wavelength of the PL spectrum $P_2$ among maximum values of the PL spectrum $P_2$. These tangential lines increase their slope when the curve rises. The tangential line $t_2$ drawn at the point exhibiting a maximum slope value (an inflection point) is made to be a tangential line drawn at the rising point of a shorter wavelength side of a PL spectrum $P_2$.

The local maximum point having an emission (peak) intensity of 10% or less of the maximum emission (peak) intensity of a PL spectrum is not included in the maximum value of the above-described shortest wavelength side. In the present invention, a tangential line at the rising point in the shorter wavelength side of the PL spectrum is defined as a line drawn at a point placed nearest to the maximum value in the shorter wavelength side, and having a maximum slope.

"A terminal wavelength of a longer wavelength side of the absorption spectrum" indicates the wavelength obtained as follows. In the same manner as a PL spectrum, an absorption spectrum is represented to have a vertical line of absorption intensity and a horizontal line of wavelength. A tangential line is drawn at a rising point of a longer wavelength side of the absorption spectrum. An intersection point of the tangential line ($t_{Am}$ in FIG. 3B) with the horizontal line is the above-described required wavelength.

Here, the above-described conditional expression (1) is determined by comparing a terminal wavelength of a shorter wavelength side of the PL spectrum $P_2$ and a terminal wavelength of a longer wavelength side of the absorption spectrum $A_m$. It may be directly calculated the area of the overlapped portion T, and the definition may be done based on the evaluation results.

The PL spectrum and the absorption spectrum indicated in FIG. 3A and FIG. 3B are expedient drawings used for brief explanation of the present invention. The shape of each spectrum is not specifically limited to this. The intensity of the largest maximum emission wavelength and the intensity of the largest absorption maximum wavelength of each spectrum may be respectively different.

In the following, it will be described in detail the constituting members of an organic EL element of the present invention such as: an anode, a first light emitting unit, a charge generating unit, a second light emitting unit, and a cathode. Further it will be described a substrate on which is placed an organic EL element of the present invention. In addition, each constitution of an organic EL element of the present invention described below is only an example. It may be suitably applied other constitution within the range enabling to constitute the above-described organic EL element.

<Light Emitting Unit>

An organic EL element of the present invention contains the two light emitting layers which are placed adjacently and emit light of the same emission color. When the organic EL element has three or more light emitting layers, it is preferable that all of the light emitting layers emit light of the same emission color.

A light emitting unit may contain the following organic layers according to circumstances in addition to a light emitting layer: a hole injection layer, a hole transport layer, an electron blocking layer, a hole blocking layer, an electron transport layer, and an electron injection layer.

(Light Emitting Layer)

A light emitting layer is a layer which provide a place of emitting light via an exciton produce by recombination of electrons and holes injected from an electrode or an adjacent layer. The light emitting portion may be either within the light emitting layer or at an interface between the light emitting layer and an adjacent layer thereof.

It is preferable that a light emitting layer contains at least one kind of organic light emitting material.

The light emitting layer may contain a mixture of a phosphorescent material and a fluorescent material. However, preferably, the light emitting layer is composed of a phosphorescent material only or a phosphorescent material only.

The fluorescence emitting layer and the phosphorescent emitting each are preferably a light emitting layer of host-dopant type.

Any number of layers may be used for constituting a light emitting layer. It may be contained a plurality of constituting layers having the same emitting spectrum and the same emission maximum wavelength.

A total thickness of the light emitting layer is not particularly limited. However, in view of layer homogeneity, required voltage during light emission, and stability of the emitted light color against a drive electric current, the total layer thickness is preferably adjusted to be in the range of 5 to 200 nm, more preferably, it is in the range of 10 to 150 nm. Each light emitting layer is preferably adjusted to be in the range of 5 to 200 nm, more preferably, it is in the range of 10 to 40 nm.

(1) Emission Dopant

As an emission dopant, it is preferable to employ: a fluorescence emitting dopant (also referred to as a fluorescent dopant and a fluorescent compound) and a phosphorescence emitting dopant (also referred to as a phosphorescent dopant and a phosphorescent emitting material). A concentration of a light emitting compound in a light emitting layer may be arbitrarily decided based on the specific compound employed and the required conditions of the device. A concentration of a light emitting compound may be uniform in a thickness direction of the light emitting layer, or it may have any concentration distribution.

The light emitting layer may contain other material than the host compound and the emission dopant. This material is served as an assist-dopant and aids the light emission.

(1.1) Phosphorescence Emitting Dopant

The phosphorescence emitting dopant is a compound which is observed emission from an excited triplet state thereof. Specifically, it is a compound which emits phosphorescence at a room temperature (25° C.) and exhibits a phosphorescence quantum yield of at least 0.01 at 25° C. The phosphorescence quantum yield is preferably at least 0.1.

The phosphorescence quantum yield will be determined via a method described in page 398 of Bunko II of Dai 4 Han Jikken Kagaku Koza 7 (Spectroscopy II of 4th Edition Lecture of Experimental Chemistry 7) (1992, published by Maruzen Co. Ltd.). The phosphorescence quantum yield in a solution will be determined using appropriate solvents. However, it is only necessary for the phosphorescent dopant of the present invention to exhibit the above phosphorescence quantum yield (0.01 or more) using any of the appropriate solvents.

Two kinds of principles regarding emission of a phosphorescent dopant are cited. One is an energy transfer-type, wherein carriers recombine on a host compound on which the carriers are transferred to produce an excited state of the host compound, and then via transfer of this energy to a phosphorescent dopant, emission from the phosphorescence-emitting dopant is realized. The other is a carrier trap-type, wherein a phosphorescence-emitting dopant serves as a carrier trap and then carriers recombine on the phosphorescent dopant to generate emission from the phosphorescent dopant. In each case, the excited state energy level of the phosphorescent dopant is required to be lower than that of the host compound.

A phosphorescence dopant may be suitably selected and employed from the known materials used for a light emitting layer for an organic EL element.

Examples of a known phosphorescence dopant are compound described in the following publications.

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991, WO 2008/101842, WO 2003/040257, US 2006/835469, US 2006/0202194, US 2007/0087321, US 2005/0244673, Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290, WO 2002/015645, WO 2009/000673, US 2002/0034656, U.S. Pat. No. 7,332,232, US 2009/0108737, US 2009/0039776, U.S. Pat. No. 6,921,915, U.S. Pat. No. 6,687,266, US 2007/0190359, US 2006/0008670, US 2009/0165846, US 2008/0015355, U.S. Pat. No. 7,250,226, U.S. Pat. No. 7,396,598, US 2006/0263635, US 2003/0138657, US 2003/0152802, U.S. Pat. No. 7,090,928, Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2002/002714, WO 2006/009024, WO 2006/056418, WO 2005/019373, WO 2005/123873, WO 2005/123873, WO 2007/004380, WO 2006/082742, US 2006/0251923, US 2005/0260441, U.S. Pat. No. 7,393,599, U.S. Pat. No. 7,534,505, U.S. Pat. No. 7,445,855, US 2007/0190359, US 2008/0297033, U.S. Pat. No. 7,338,722, US 2002/0134984, U.S. Pat. No. 7,279,704, US 2006/098120, US 2006/103874, WO 2005/076380, WO 2010/032663, WO 2008/140115, WO 2007/052431, WO 2011/134013, WO 2011/157339, WO 2010/086089, WO 2009/113646, WO 2012/020327, WO 2011/051404, WO 2011/004639, WO 2011/073149, US 2012/228583, US 2012/212126, JP-A 2012-069737, JP-A 2012-195554, JP-A 2009-114086, JP-A 2003-81988, JP-A 2002-302671 and JP-A 2002-363552.

In particular, preferable phosphorescence emitting dopants are compounds represented by Formulas (4), (5), or (6) described in paragraphs [0185] to [0235] of JP-A 2013-4245, and exemplified compounds (Pt-1 to Pt-3, Os-1, and Ir-1 to Ir-45).

Among them, preferable phosphorescence emitting dopants are organic metal complexes containing Ir as a center metal. More preferable are complexes containing at least one coordination mode selected from a metal-carbon bond, a metal-nitrogen bond, a metal-oxygen bond and a metal-sulfur bond.

(1.2) Fluorescence Emitting Dopant

The fluorescence emitting dopant is a compound which is observed emission from an excited singlet state thereof. The compound is not limited as long as emission from an excited singlet state is observed.

As specific known fluorescence emitting dopants usable in the present invention, listed are compounds such as: an anthracene derivative, a pyrene derivative, a chrysene derivative, a fluoranthene derivative, a perylene derivative, a fluorene derivative, an arylacetylene derivative, a styrylarylene derivative, a styrylamine derivative, an arylamine derivative, a boron complex, a coumarin derivative, a pyran derivative, a cyanine derivative, a croconium derivative, a squarylium derivative, an oxobenzanthracene derivative, a fluorescein derivative, a rhodamine derivative, a pyrylium derivative, a perylene derivative, a polythiophene derivative, and a rare earth complex compound.

In addition, it may be used an emission dopant utilizing delayed fluorescence. Specific examples of utilizing delayed fluorescence are compounds described in: WO 2011/156793, JP-A 2011-213643, and JP-A 2010-93181. However, the present invention is not limited to them.

(2) Host Compound

A host compound is a compound which mainly plays a role of injecting or transporting a charge in a light emitting layer. In an organic EL element, an emission from the host compound itself is substantially not observed.

Preferably, it is a compound exhibiting a phosphorescent emission yield of less than 0.1 at a room temperature (25° C.), more preferably a compound exhibiting a phosphorescent emission yield of less than 0.01. Among the compounds incorporated in the light emitting layer, a mass ratio of the host compound in the light emitting layer is preferably at least 20%.

It is preferable that the excited energy level of the host compound is higher than the excited energy level of the dopant contained in the same layer.

Host compounds may be used singly or may be used in combination of two or more compounds. By using a plurality of host compounds, it is possible to adjust transfer of charge, thereby it is possible to achieve an organic EL element of high efficiency.

A host compound used in a light emitting layer is not specifically limited. A known compound previously used in an organic EL element may be used. It may be a compound having a low molecular weight, or a polymer having a high molecular weight. Further, it may be a compound having a reactive group such as a vinyl group or an epoxy group.

As a known host compound, preferably, it has a hole transporting ability or an electron transporting ability, as well as preventing elongation of an emission wavelength. In addition, from the viewpoint of stably driving an organic EL element at high temperature, it is preferable that a host compound has a high glass transition temperature (T) of 90° C. or more, more preferably, has a Tg of 120° C. or more.

Here, a glass transition temperature (Tg) is a value obtained using DSC (Differential Scanning Colorimetry) based on the method in conformity to JIS-K-7121.

A host compound in a light emitting layer incorporating a phosphorescent dopant preferably has a lowest excited triplet level ($T_1$) of 2.1 eV or larger. When $T_1$ is 2.1 eV or larger, light emission of high efficiency may be obtained. The lowest excited triplet level ($T_1$) is a peak energy corresponding to the band transition of the lowest vibration in a phosphorescent spectrum of a host compound solution dissolved in a solvent measured at a liquid nitrogen temperature or a liquid helium temperature.

As specific examples of a known host compound used in an organic EL element of the present invention, the compounds described in the following Documents are cited. However, the present invention is not to them.

Japanese patent application publication (JP-A) Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837; US Patent Application Publication (US) Nos. 2003/0175553, 2006/0280965, 2005/0112407, 2009/0017330, 2009/0030202, 2005/0238919; WO 2001/039234, WO 2009/021126, WO 2008/056746, WO 2004/093 207, WO 2005/089025, WO 2007/063796, WO 2007/063754, WO 2004/107822, WO 2005/030900, WO 2006/114966, WO 2009/086028, WO 2009/003898, WO 2012/023947, JP-A 2008-074939, JP-A 2007-254297, and EP 2034538. However, the host compounds in the present invention are not limited to them.

(Hole Injection Layer)

A hole injection layer (it is also called as "an anode buffer layer") is a layer which is arranged between an anode and a light emitting layer to decrease an operating voltage and to improve an emission luminance. An example of a hole injection layer is detailed in volume 2, chapter 2 "Electrode materials" (pp. 123-166) of "Organic EL Elements and Industrialization Front thereof (Nov. 30, 1998, published by N.T.S. Co. Ltd.)".

A hole injection layer is provided according to necessity, and as described above, it is placed between an anode and a light emitting layer, or between an anode or a charge generating layer and a light emitting layer or a hole transport layer.

A hole injection layer is also detailed in JP-A Nos. 9-45479, 9-260062 and 8-288069.

(1) Compound Having a Structure Represented by Formula (1)

As a constituting material for a hole injection layer, it may be suitably used a compound having a structure represented by Formula (1) described below.

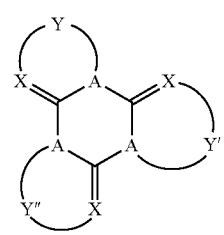

Formula (1)

In Formula (1), A represents C or N. X represents N or CR°. R° represents one selected from the group consisting of: a hydrogen atom, a halogen atom, a cyano group, a nitro group, a formyl group, an acetyl group, a benzoyl group, an amide group (—$CONHR^1$ or —$CONR^1R^2$), a styryl group, an ethynyl group, a quinolyl group, a quinazolyl group, a phenanthrolyl group, a biquinolyl group, an anthraquinonyl group, a benzoquinonyl group, a quinonyl group, an acridinyl group, a substituted or unsubstituted alkyl group, aryl group, aralkyl group, alkylamino group, arylamino group, aralkylamino group, and heterocyclic group. $R^1$ and $R^2$ each independently represent: a substituted or unsubstituted alkyl group having 1 to 60 carbon atoms, aryl group, or 5 to 7 membered heterocyclic group. Y, Y' and Y" each represent a substituted or unsubstituted 5 membered aromatic heterocyclic group including A and X as a ring member, or a substituted or unsubstituted 6 membered aromatic heterocyclic group including A and X as a ring member. Y, Y' and Y" may be the same or different with each other.

An alkyl group represented by R° in Formula (1) has preferably 1 to 20 carbon atoms. Examples thereof are: a straight alkyl group such as a methyl group, an ethyl group, a propyl group, and a hexyl group, and a branched alkyl group such as an isopropyl group, and a t-butyl group.

As an aryl group, it may be cited: a monocyclic aromatic hydrocarbon ring group such as a phenyl group; and a polycyclic aromatic hydrocarbon ring group such as a naphthyl group, an anthracenyl group, a pyrenyl group, and a perylenyl group.

As an aralkyl group, it may be cited: an alkyl group having 1 to 20 carbon atoms substituted with an aromatic hydrocarbon ring group such as a phenyl group, a biphenyl group, a naphthyl group, a terphenyl group, an anthracenyl group, a pyrenyl group, or a perylenyl group.

As an alkylamino group, it may be cited: an amino group substituted with an aliphatic hydrocarbon group having 1 to 20 carbon atoms.

As an arylamino group, it may be cited: an amino group substituted with an aromatic hydrocarbon ring group such as a phenyl group, a biphenyl group, a naphthyl group, a terphenyl group, an anthracenyl group, a pyrenyl group, or a perylenyl group.

As an aralkylamino group, it may be cited: an amino group substituted with an aromatic hydrocarbon ring group such as a phenyl group, a biphenyl group, a naphthyl group, a terphenyl group, an anthracenyl group, a pyrenyl group, a perylenyl group, or an aliphatic hydrocarbon group having 1 to 20 carbon atoms As a heterocyclic group, it may be cited: a pyrrolyl group, a thienyl group, an indolyl group, an oxazolyl group, an imidazolyl group, a thiazolyl group, a pyridyl group, a pyrimidinyl group, a piperazinyl group, a thiophenyl group, a furanyl group, and a pyridazinyl group.

As an alkyl group having 1 to 60 carbon atoms represented by $R^1$ or $R^2$ in Formula (1), it may be cited: a straight alkyl group such as a methyl group, an ethyl group, a propyl group, and a hexyl group, and a branched alkyl group such as an isopropyl group, and a t-butyl group.

As an aryl group, it may be cited: a monocyclic aromatic hydrocarbon ring group such as a phenyl group; and a polycyclic aromatic hydrocarbon ring group such as a naphthyl group, an anthracenyl group, a pyrenyl group, and a perylenyl group.

As a 5 to 7 membered heterocyclic group, it may be cited: a pyrrolyl group, a thienyl group, an indolyl group, an oxazolyl group, an imidazolyl group, a thiazolyl group, a pyridyl group, a pyrimidinyl group, a piperazinyl group, a thiophenyl group, a furanyl group, and a pyridazinyl group.

As a 5 membered aromatic heterocyclic ring represented by Y, Y' and Y'" in Formula (1), it may be cited: a pyrazole ring, an imidazole ring, a thiazole ring, an oxazole ring, an isoxazole ring, an indole ring, a triazole ring, a benzimidazole ring, a benzopyrazole ring, a benzothiazole ring, a benzoxazole ring, and a benzisoxazole ring.

As a 6 membered aromatic heterocyclic ring, it may be cited: a pyridine ring, a pyridazine ring, a pyrimidine ring, a pyrazine ring, and a triazine ring.

In Formula (1), $R^0$ to $R^2$, Y, Y', and Y'" may have a substituent. Examples of a substituent include: a straight or a branched alkyl group (for example, a methyl group, an ethyl group, a propyl group, an isopropyl group, a t-butyl group, a pentyl group, a hexyl group, an octyl group, a dodecyl group, a tridecyl group, a tetradecyl group, and a pentadecyl group); an alkenyl group (for example, a vinyl group, and an allyl group); an alkynyl group (for example, an ethynyl group and a propargyl group); an aromatic hydrocarbon ring group (also called an aromatic carbon ring group or an aryl group, for example, a group derived from a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, an indene ring, a fluorene ring, a fluoranthene ring, a naphthacene ring, a pentacene ring, a perylene ring, a pentaphene ring, a picene ring, a pyrene ring, a pyranthrene ring, an anthanthrene ring, or a tetralin ring); an aromatic heterocyclic group (for example, a group derived from a furan ring, a dibenzofuran ring, a thiophene ring, a dibenzothiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, thiazole ring, an indole ring, an indazole ring, a benzimidazole ring, a benzothiazole ring, a benzoxazole ring, a quinoxaline ring, quinazoline ring, cinnoline ring, a quinoline ring, an isoquinoline ring, a phthalazine ring, a naphthyridine ring, a carbazole ring, a carboline ring, or a diazacarbazole ring (indicating a ring structure in which one of the carbon atoms constituting the carboline ring of the carbolinyl group is replaced with nitrogen atoms, a carboline ring and a diazacarbazole ring may be called as an azacarbazole ring); a non-aromatic hydrocarbon ring group (for example, a cyclopentyl group, and a cyclohexyl group); a non-aromatic heterocyclic group (for example, a pyrrolidyl group, an imidazolidyl group, a morpholyl group, and an oxazolidyl group); an alkoxy group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethyhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethymexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group); a sulfinyl group (for example, a methylsulfinyl group, an ethylsufinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group), an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a halogen atom (for example, a fluorine atom, a chlorine atom and a bromine atom); a fluorinated hydrocarbon group (for example, a fluoromethyl group, trifluoromethyl group, a pentafluoroethyl group and a pentafluorophenyl group); a cyano group; a nitro group; a hydroxyl group; a mercapto group; a silyl group (for example, a trimethylsilyl group, a triisopropylsilyl group, a triphenylsilyl group, and a phenyldiethylsilyl group), and a deuterium atom.

A compound having a structure represented by Formula (1) is preferably a compound having a structure represented by Formula (2) described below.

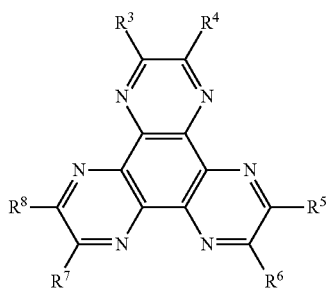

Formula (2)

In Formula (2), $R^3$ to $R^8$ each independently represent one selected from the group consisting of: a hydrogen atom, a halogen atom, a cyano group, a nitro group, a sulfonyl group ($-SO_2R^9$), a sulfinyl group ($-SOR^9$), a sulfonamido group) ($-SO_2NR^9R^{10}$), a sulfonato group ($-SO_3R^9$), a trifluoromethyl group, an ester group ($-COOR^9$), an amide group ($-CONHR^9$ or $-CONR^9R^{10}$), a substituted or unsubstituted straight or branched alkoxy group having 1 to 12 carbon atoms, a substituted or unsubstituted straight or branched alkyl group having 1 to 12 carbon atoms, aromatic hydrocarbon ring group, arylamino group, non-aromatic heterocyclic group, aromatic heterocyclic group, and aralkylamino group. $R^9$ and $R^{10}$ each independently represent: a substituted or unsubstituted alkyl group having 1 to 60 carbon atoms, aryl group, or 5 to 7 membered heterocyclic group.

$R^9$ and $R^{10}$ in Formula (2) are synonymous with $R^1$ and $R^2$ in Formula (2).

$R^9$ and $R^{10}$ in Formula (2) may be substituted with a substituent. As a substituent, the same substituent cited for Formula (1) may be cited.

A compound having a structure represented by Formula (1) is preferably a compound having a structure represented by Formula (3) described below.

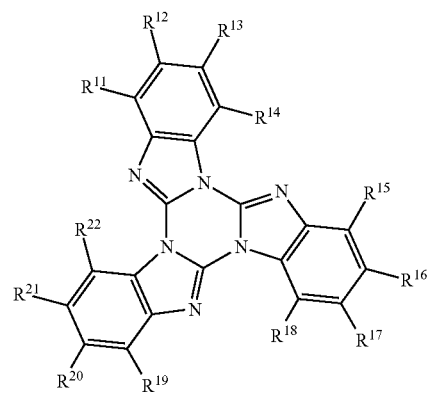

Formula (3)

In Formula (3), $R^{11}$ to $R^{22}$ each independently represent one selected from the group consisting of: a halogen atom, an amino group, a cyano group, a nitro group, an alkoxy group, an aryloxy group, an alkylthio group, an arylthio group, an acyl group, an alkoxycarbonyl group, an aryloxycarbonyl group, an alkylsulfonyl group, a substituted or unsubstituted aliphatic hydrocarbon group, aromatic hydrocarbon ring group, aliphatic heterocyclic group, and aromatic heterocyclic group. $R^{11}$ to $R^{22}$ each may form a ring with a neighboring group with each other.

As an alkoxy group represented by $R^{11}$ to $R^{22}$ in Formula (3), it may be cited an alkoxy group having 1 to 18 carbon atoms such as: a methoxy group, an ethoxy group, a propoxy group, an isopropoxy group, a butoxy group, an isobutoxy group, a tert-butoxy group, a pentyloxy group, a hexyloxy group, an octyloxy group, a tert-octyloxy group, a 2-bornyloxy group, 2-isobornyloxy group, and 1-adamantyloxy group.

As an aryloxy group, it may be cited an aryloxy group having 6 to 30 carbon atoms such as: a phenoxy group, 4-tert-butylphenoxy group, 1-naphthyloxy group, 2-naphthyloxy group, 9-anthryloxy group, 2-phenanthryloxy group, 1-naphthacenyl group, 1-pyrenyl group, 2-chrycenyl group, 3-perylenyl group, and 1-pentacenyl group.

As an alkylthio group, it may be cited an alkylthio group having 1 to 18 carbon atoms such as: a methylthio group, an ethylthio group, a propylthio group, a butylthio group, an isobutylthio group, a tert-butylthio group, a pentylthio group, an isopentylthio group, a hexylthio group, an isohexylthio group, a heptylthio group, and an octylthio group.

As an arylthio group, it may be cited an arylthio group having 6 to 30 carbon atoms such as: a phenylthio group, 4-methylphenylthio group, 4-tert-butylphenylthio group, and 1-naphthylthio group.

As an acyl group, it may be cited an acyl group having 2 to 18 carbon atoms such as: an acetyl group, a propionyl group, a pivaloyl group, a cyclohexylcarbonyl group, a benzoyl group, a toluoyl group, an anisoyl group, and a cinnamoyl group.

As an alkoxycarbonyl group, it may be cited an alkoxycarbonyl group having 2 to 18 carbon atoms such as: a methoxycarbonyl group, an ethoxycarbonyl group, a propoxycarbonyl group, a butoxycarbonyl group, a pentyloxycarbonyl group, a hexyloxycarbonyl group, a heptyloxycarbonyl group, an octyloxycarbonyl group, and a benzyloxycarbonyl group.

As an aryloxycarbonyl group, it may be cited an aryloxycarbonyl group having 7 to 30 carbon atoms such as: a phenoxycarbonyl group, a 1-naphthyloxycarbonyl group, and a 2-phenanthryloxycarbonyl group.

As an alkylsufonyl group, it may be cited an alkylsufonyl group having 1 to 18 carbon atoms such as: a mesyl group, an ethylsulfonyl group, a propylsulfonyl group, a butylsulfonyl group, a pentylsulfonyl group, a hexylsulfonyl group, a heptylsulfonyl group, an octylsulfonyl group, and a nonylsulfonyl group.

As an arylsufonyl group, it may be cited an arylsufonyl group having 6 to 30 carbon atoms such as: a benzenesulfonyl group, a p-toluenesulfonyl group, and a 1-naphthylsulfonyl group.

As an aliphatic hydrocarbon group, it may be cited a monovalent aliphatic hydrocarbon group having 1 to 18 carbon atoms described in the following: an alkyl group (for example, an alkyl group having 1 to 18 carbon atoms such as a methyl group, an ethyl group, a propyl group, an isopropyl group, a butyl group, a sec-butyl group, a tert-butyl group, a pentyl group, an isopentyl group, a hexyl group, an isohexyl group, a heptyl group, an octyl group, a nonyl group, a decyl group, a dodecyl group, a pentadecyl group, and an octadecyl group), an alkenyl group (for example, an alkenyl group having 2 to 18 carbon atoms such as a vinyl group, a 1-propenyl group, 2-propenyl group, an isopropenyl group, a 1-butenyl group, a 2-butenyl group, a 3-butenyl group, a 1-octenyl group, a 1-decenyl group, and a 1-octadecenyl group), an alkynyl group (for example, an alkynyl group having 2 to 18 carbon atoms such as an ethynyl group, a 1-propynyl group, a 2-propynyl group, a 1-butynyl group, a 2-butynyl group, a 3-butynyl group, a 1-octynyl group, a 1-decynyl group, and a 1-octadecynyl group), a cycloalkyl group (for example, a cycloalkyl group having 3 to 18 carbon atoms such as a cyclopropyl group, a cyclobutyl group, a cyclopentyl group, a cyclohexyl group, a cycloheptyl group, a cyclooctyl group, a cyclooctadecyl group, a 2-bornyl group, a 2-isobornyl group, and a 1-adamantyl group).

As an aromatic hydrocarbon ring group, it may be cited a condensed ring hydrocarbon group having 10 to 30 carbon atoms such as: a naphthyl group, a 2-naphthyl group, a 1-anthryl group, a 2-anthryl group, a 5-anthryl group, a 1-phenanthryl group, a 9-phenanthryl group, a 1-acenaphthyl group, a 2-triphenylenyl group, a 1-chrysenyl group, a 2-azulenyl group, a 1-pyrenyl group, a 2-triphenylyl group, a 1-pyrenyl group, a 2-pyrenyl group, a 1-perylenyl group, a 2-perylenyl group, a 3-perylenyl group, a 2-indenyl group, a 1-acenaphthylenyl group, a 2-naphthacenyl group, and a 2-pentacenyl group); and a ring assembly hydrocarbon group having 12 to 30 carbon atoms such as: an o-biphenylyl group, a m-biphenylyl group, a p-biphenylyl group, a terphenylyl group, and a 7-(2-naphthyl)-2-naphthyl group.

As an aliphatic heterocyclic group, it may be cited a monovalent aliphatic heterocyclic group having 3 to 18 carbon atoms such as: a 3-isochromanyl group, a 7-chromanyl group, a 3-coumarinyl group, a piperidino group, a morpholino group, and a 2-morpholinyl group.

As an aromatic heterocyclic group, it may be cited a monovalent aromatic heterocyclic group having 3 to 30 carbon atoms such as: a 2-furyl group, a 3-furyl group, a 2-thienyl group, a 3-thienyl group, a 2-benzofuryl group, a 2-benzothienyl group, a 2-pyridyl group, a 3-pyridyl group, a 4-pyridyl group, a 2-quinolyl group, and an 5-isoquinolyl group.

$R^{11}$ and $R^{22}$ in Formula (3) may be substituted with a substituent. As a substituent, the same substituent cited for Formula (1) may be cited.

(2) Compound Having a Structure Represented by Formula (4)

As a constituting material for a hole injection layer, it may be also suitably used a compound having a structure represented by Formula (4) described below.

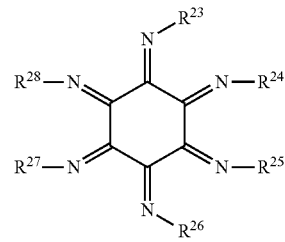

Formula (4)

In Formula (4), $R^{23}$ to $R^{28}$ each independently represent a substituted or unsubstituted alkyl group, aryl group, aralkyl group, or heterocyclic group. $R^{23}$ to $R^{28}$ each may be the same or different. $R^{23}$ and $R^{24}$, $R^{25}$ and $R^{26}$, $R^{27}$ and $R^{28}$, or $R^{23}$ and $R^{28}$, $R^{24}$ and $R^{25}$, $R^{26}$ and $R^{27}$, each pair may be combined to form a condensed ring.

As an alkyl group represented by $R^{23}$ to $R^{28}$ in Formula (4), it may be cited: a straight alkyl group such as a methyl group, an ethyl group, a propyl group, a hexyl group; and a branched alkyl group such as an isopropyl group and t-butyl group.

As an aryl group, it may be cited: a monocyclic aromatic hydrocarbon ring group such as a phenyl group; and a polycyclic aromatic hydrocarbon ring group such as a naphthyl group and an anthracenyl group.

As an aralkyl group, it may be cited: a benzyl group, a phenylpropyl group, and a naphthylmethyl group.

As a heterocyclic group, it may be cited: a mono-heterocyclic group and a condensed heterocyclic group such as a pyrrolyl group, a thienyl group, a pyridyl group, a phenazyl group, a pyridazyl group, and an acridyl group.

As a substituent on $R^{23}$ to $R^{28}$ in Formula (4), it may be cited: a halogen atom, a cyano group, a nitro group, a formyl group, an acetyl group, a benzoyl group, an amide group, a styryl group, an ethynyl group, a monocyclic aromatic ring and a polycyclic aromatic condensed ring such as a phenyl group, a naphthyl group, and an anthranyl group, a pyridyl group, a pyridazyl group, a phenazyl group, a pyrrolyl group, an imidazolyl group, and a polycyclic condensed ring such as a quinolyl group and an acridyl group.

As a condensed ring formed with $R^{23}$ and $R^{24}$, $R^{25}$ and $R^{26}$, $R^{27}$ and $R^{28}$, or $R^{23}$ and $R^{28}$, $R^{24}$ and $R^{25}$, and $R^{27}$, it may be cited: a benzo group, a naphtho group, and a pyrido group.

(3) Other Material

In the present invention, a compound containing a structure represented by one of Formulas (5) to (12) indicated below is also suitably used.

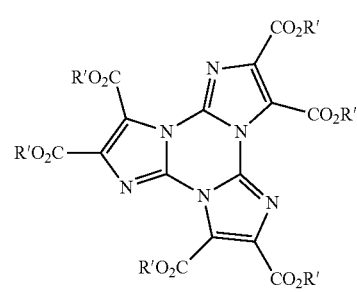

Formula (5)

-continued

Formula (6)
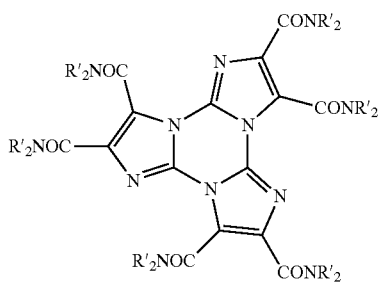

Formula (7)
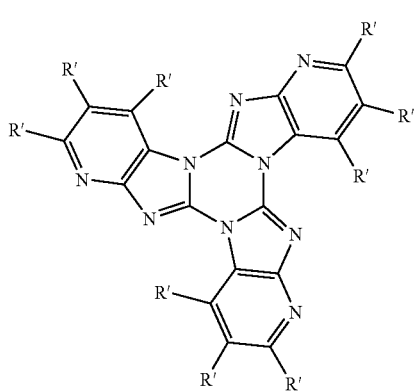

Formula (8)
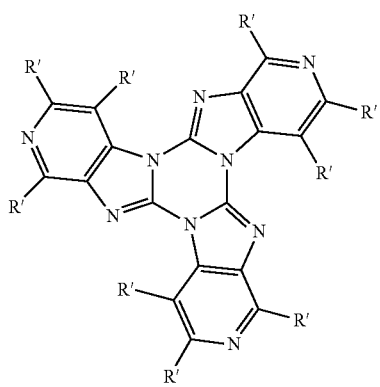

Formula (9)
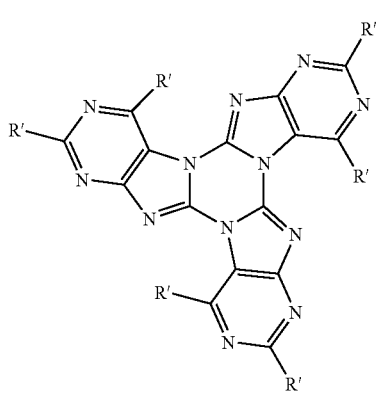

-continued

Formula (10)
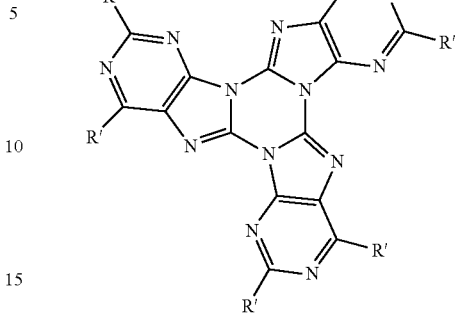

Formula (11)
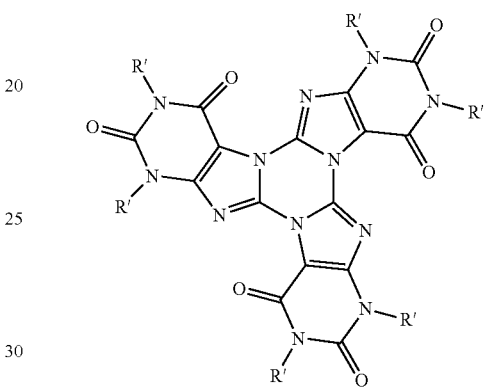

Formula (12)
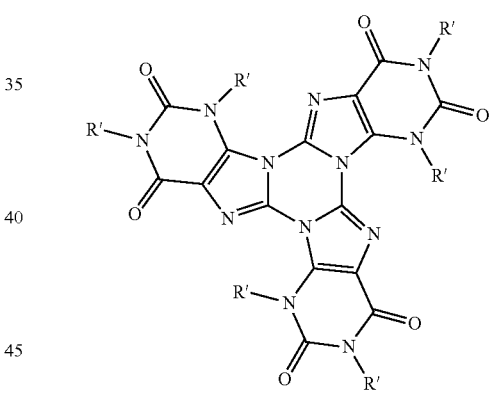

R's in Formulas (5) to (12) each independently represents a hydrogen atom, a substituted or unsubstituted aryl group having 5 to 60 core atoms, or alkyl group having 1 to 50 core atoms.

As an aryl group having 5 to 60 core atoms, it may be cited: a phenyl group, a naphthyl group, a biphenylyl group, an anthranyl group, a phenanthryl group, a pyrenyl group, a chrysenyl group, a fluoranthenyl group, a fluorenyl group, a pyridinyl group, a quinolyl group, an isoquinolyl group, and a phenanthryl group.

As an alkyl group having 1 to 50 core atoms, it may be cited: a methyl group, an ethyl group, a butyl group, a pentyl group, a hexyl group, a trifluoromethyl group, and a trifluoroethyl group.

R' in Formulas (5) to (12) may be substituted with a substituent. As a substituent, the same substituent cited for Formula (1) may be cited.

Specific compounds containing a structure represented by one of Formulas (5) to (12) are listed in the following. In addition, in the exemplified compounds, "Tol" represents any one of o-, m-, and p-methylphenyl group.

HI-1
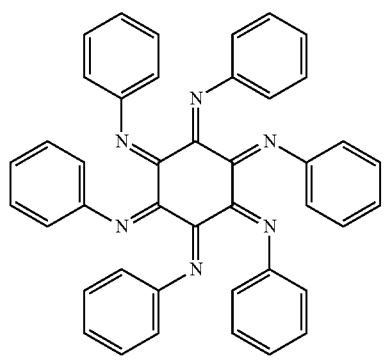
HI-2
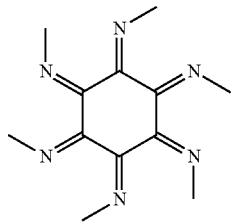
HI-3
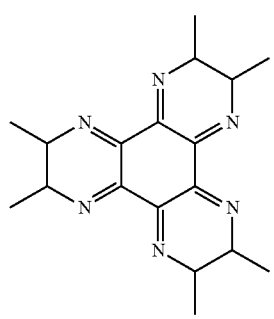
HI-4
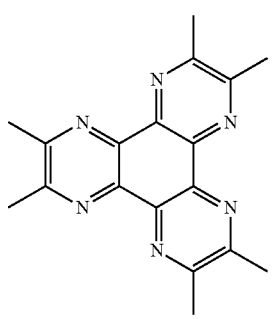
HI-5
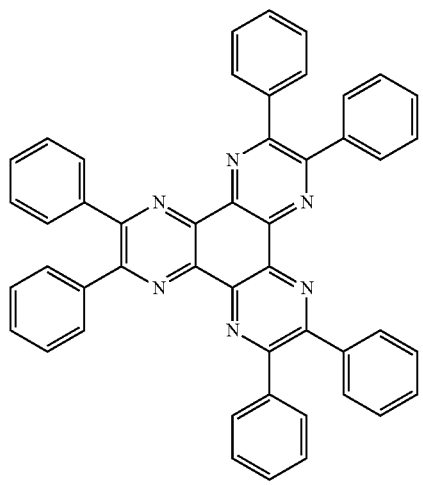
HI-6
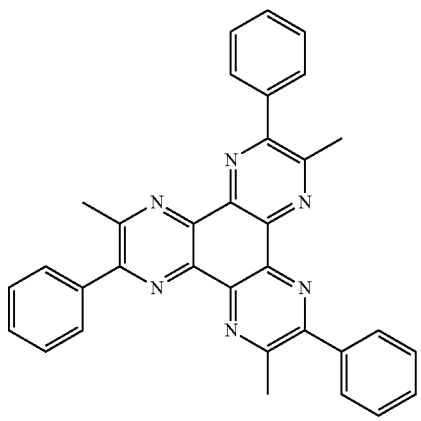
HI-7
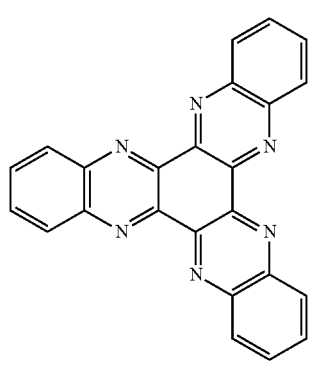
HI-8
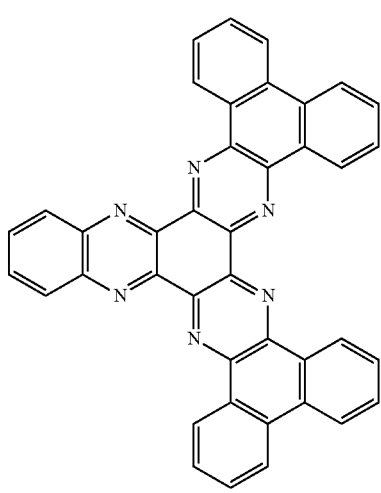

-continued
HI-9
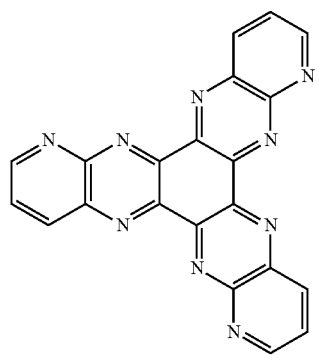
HI-10
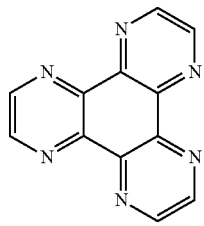
HI-11
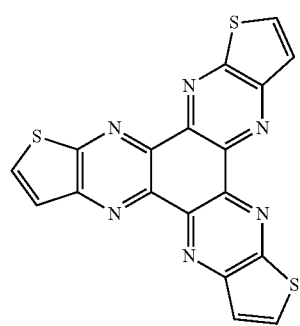
HI-12
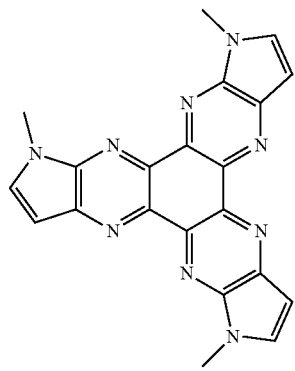
HI-13
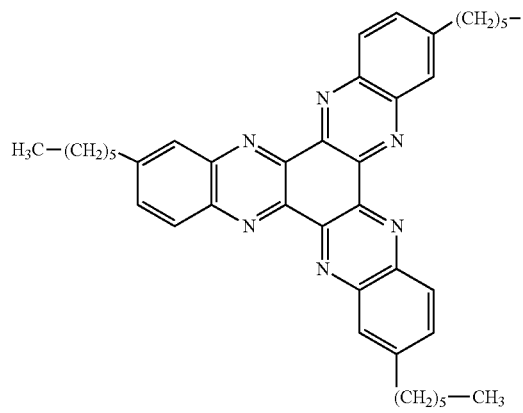
HI-14
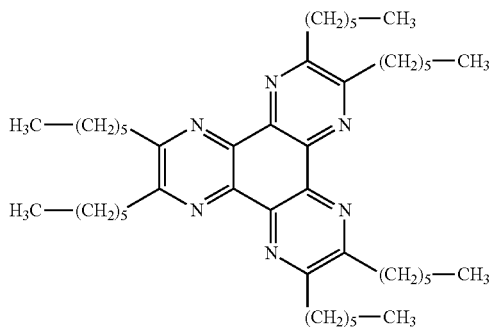
HI-15
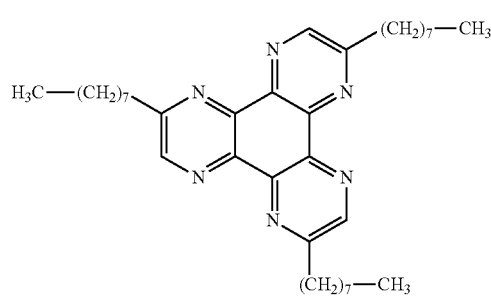
HI-16
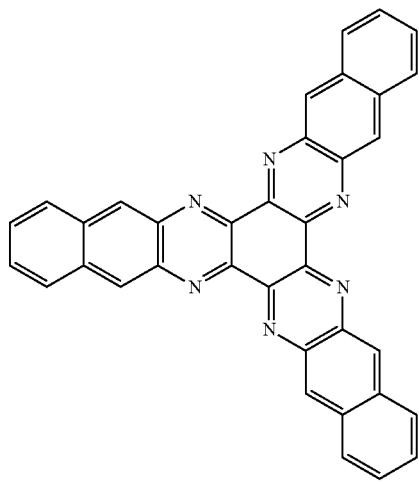

-continued
HI-17
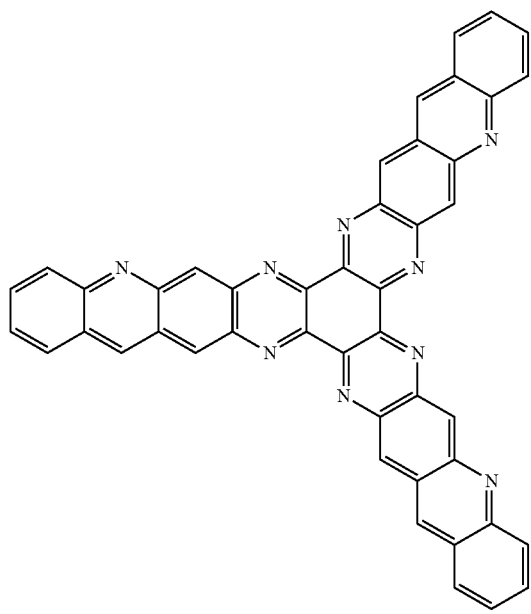
HI-18
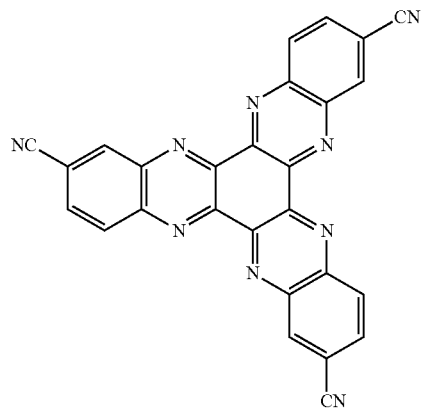
HI-19
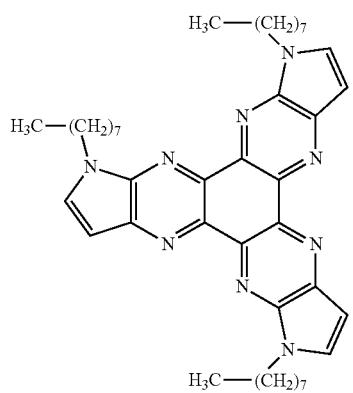
HI-20
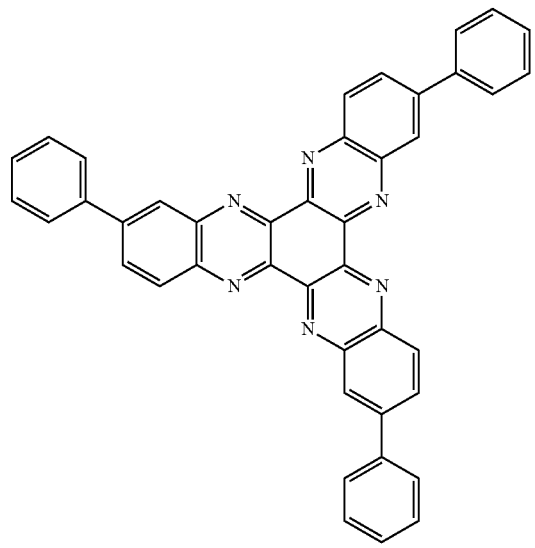
HI-21
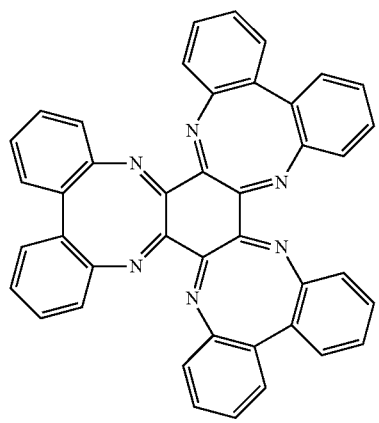
HI-22
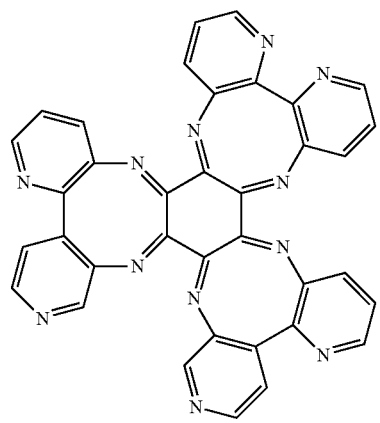

-continued
HI-23
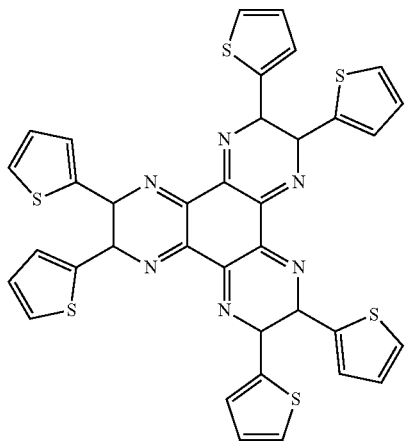
HI-24
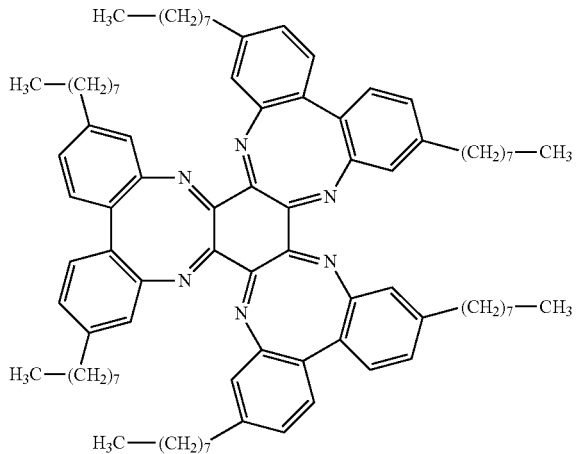
HI-25
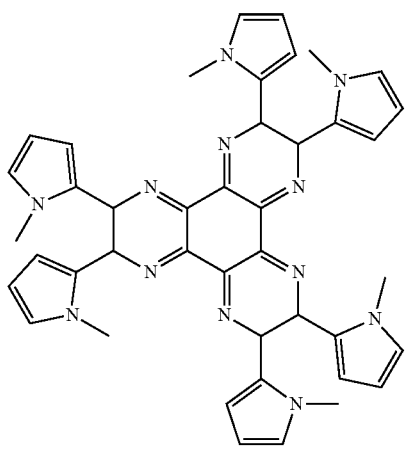
HI-26
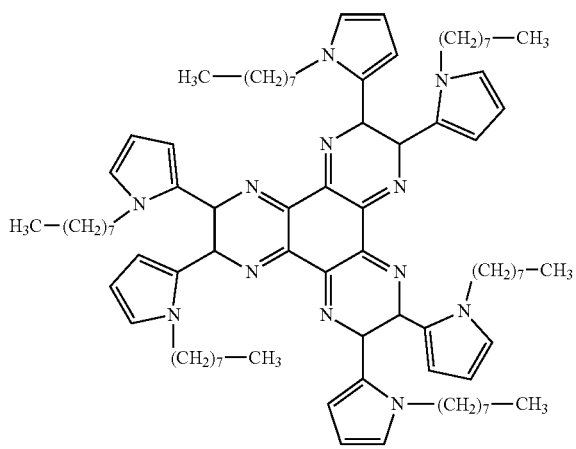
HI-27
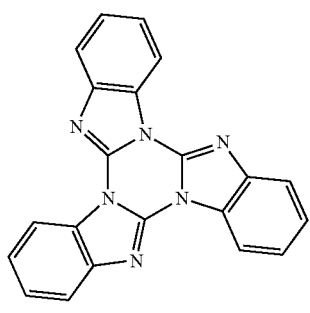
HI-28
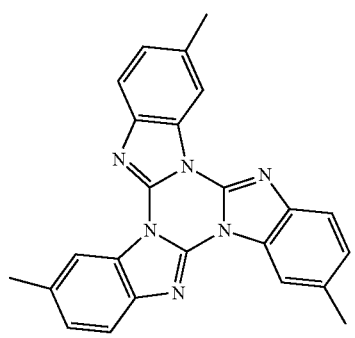

-continued
HI-29
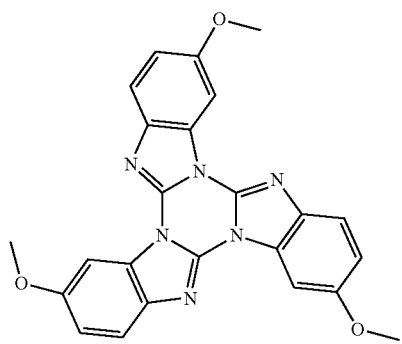
HI-30
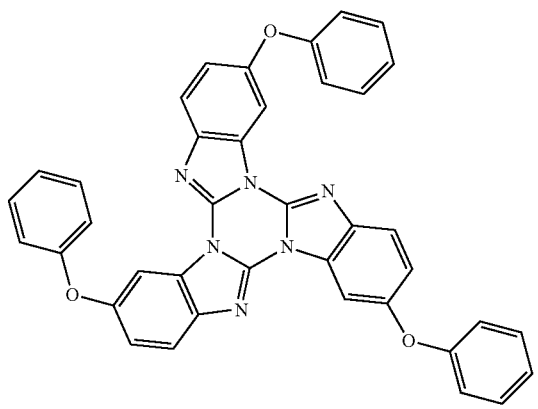
HI-31
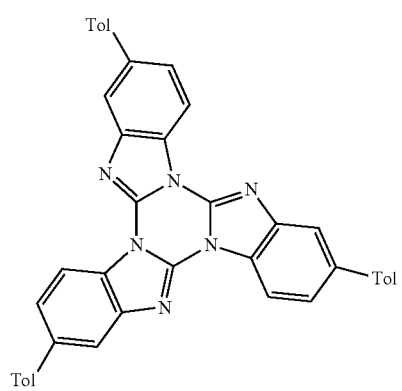
HI-32
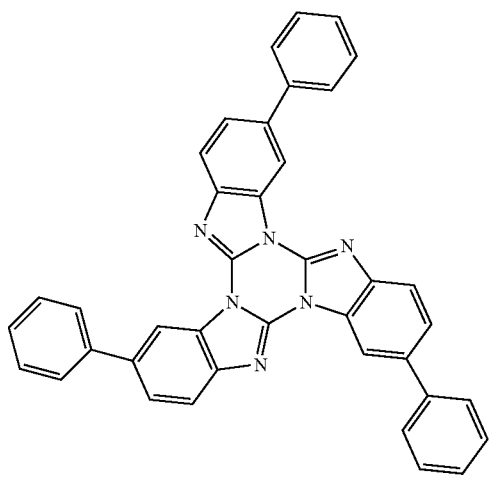
HI-33
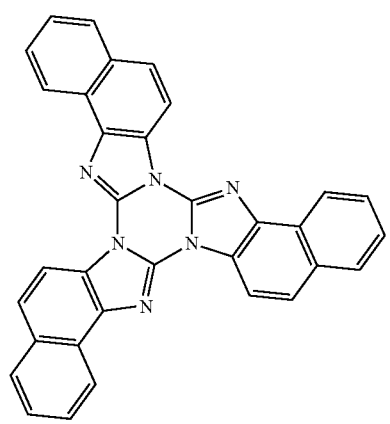
HI-34
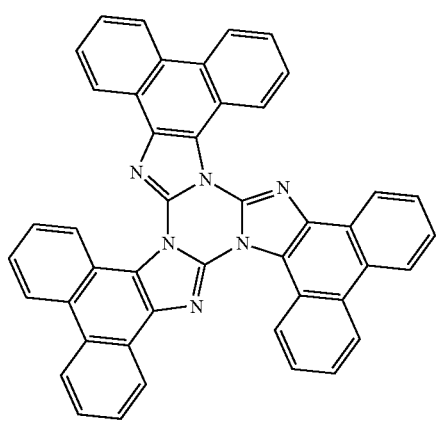

-continued
HI-36
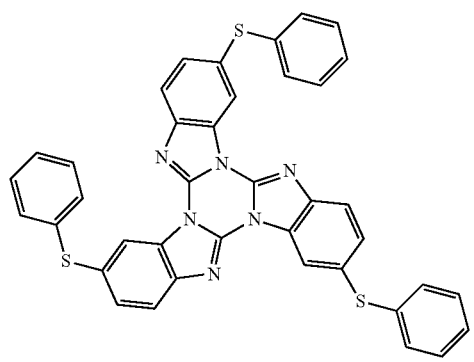
HI-35
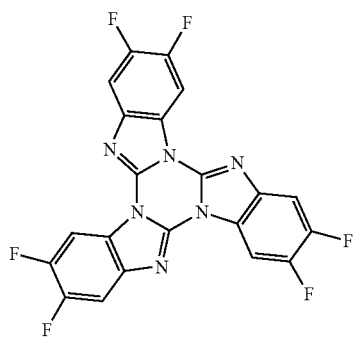
HI-37
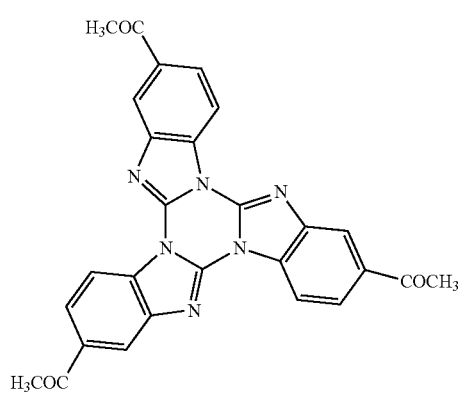
HI-38
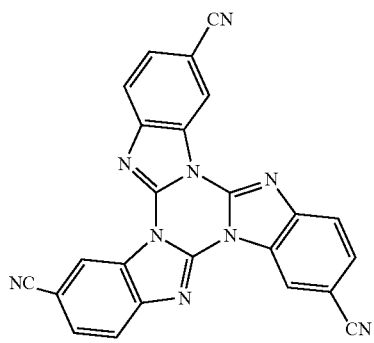
HI-39
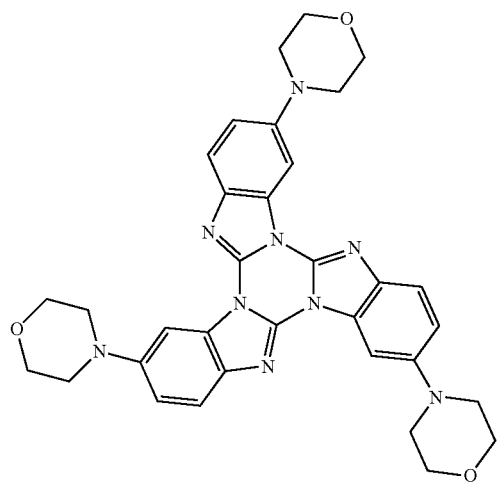
HI-40
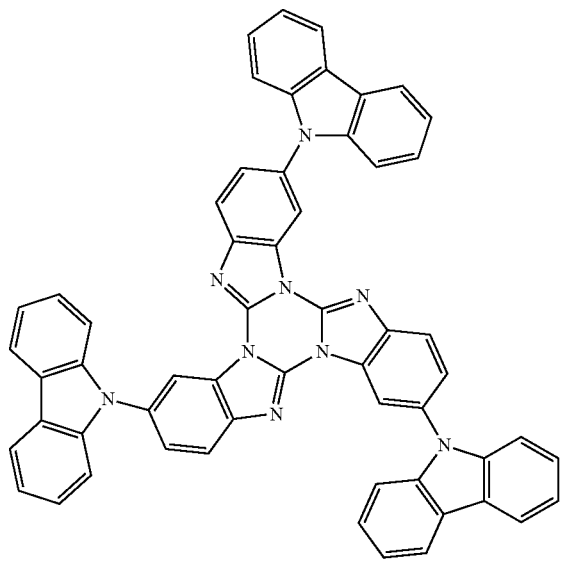

-continued
HI-41
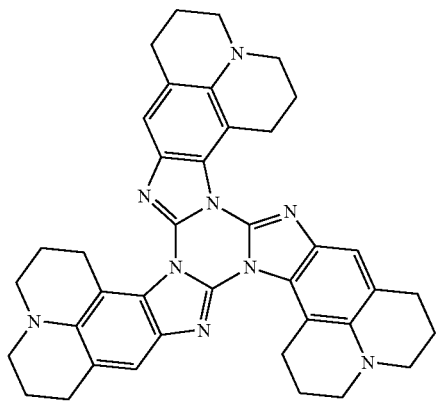
HI-42
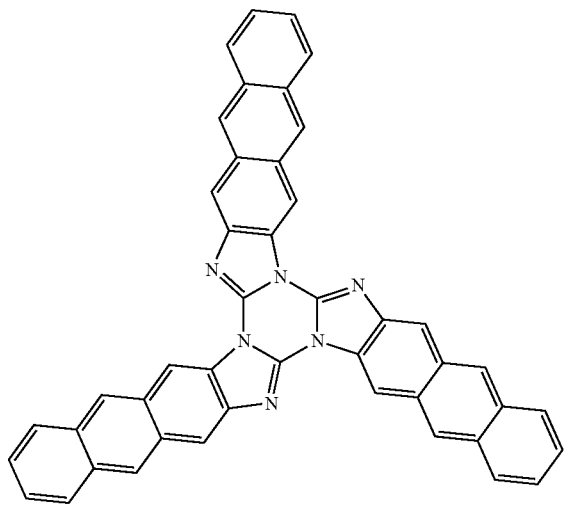
HI-43
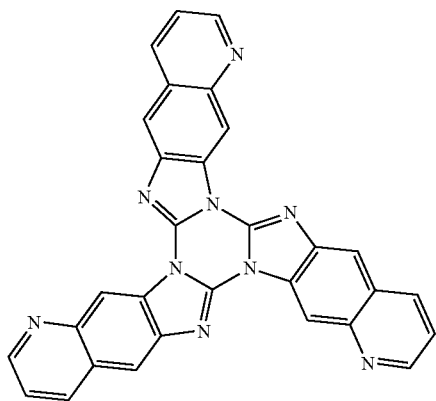
HI-44
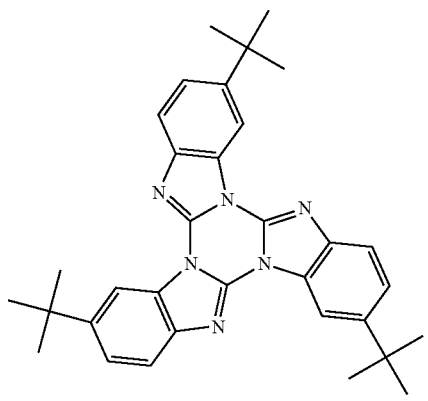
HI-45
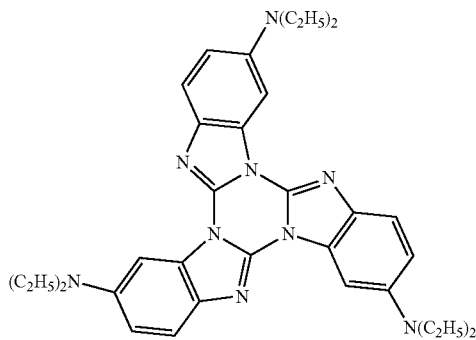
HI-46
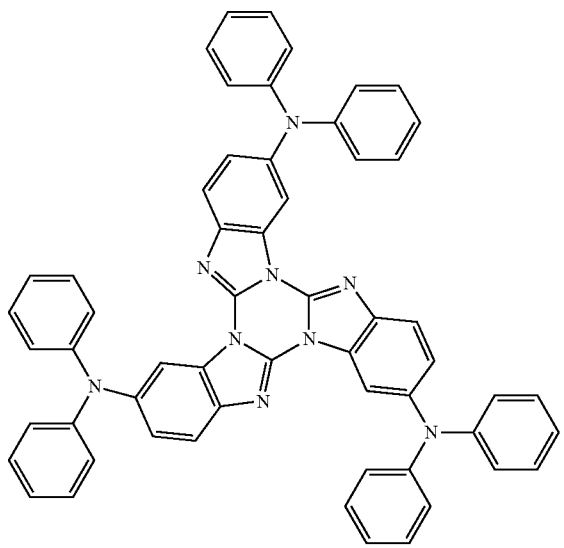

-continued
HI-47
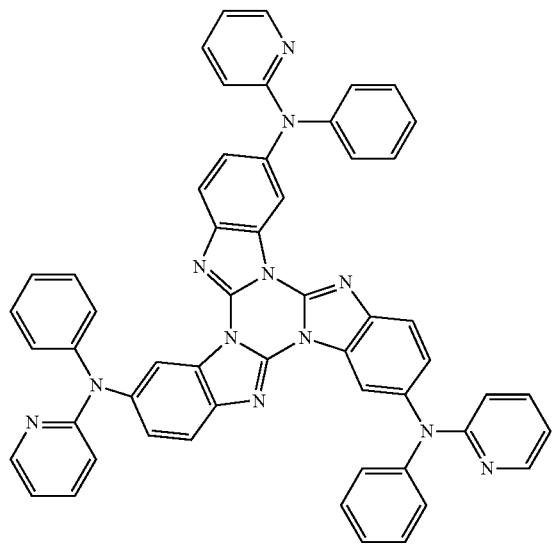
HI-48
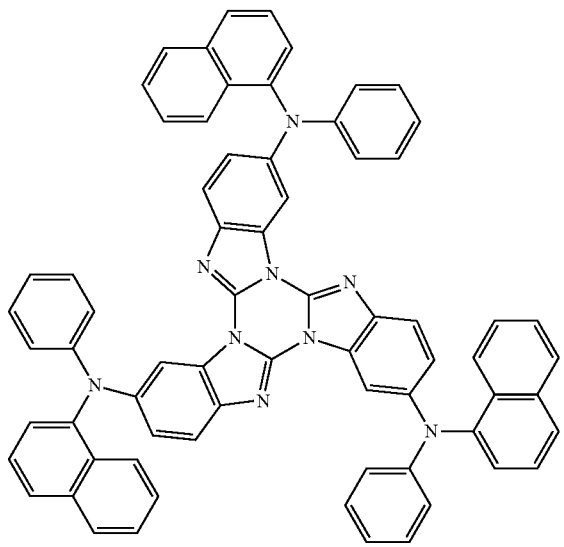
HI-49
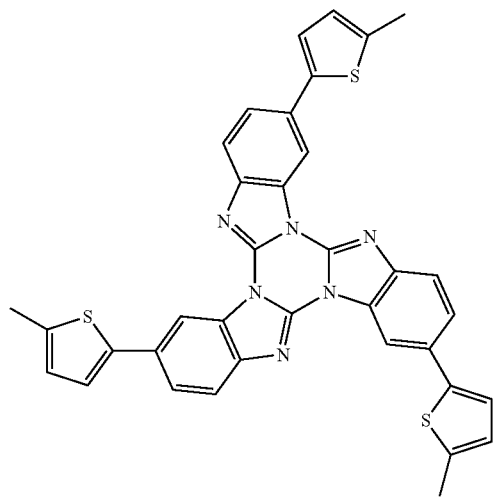
HI-50
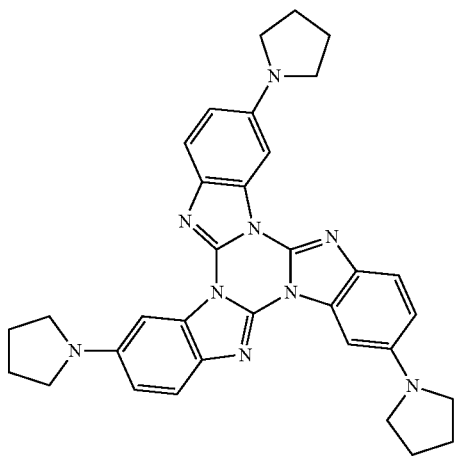
HI-51
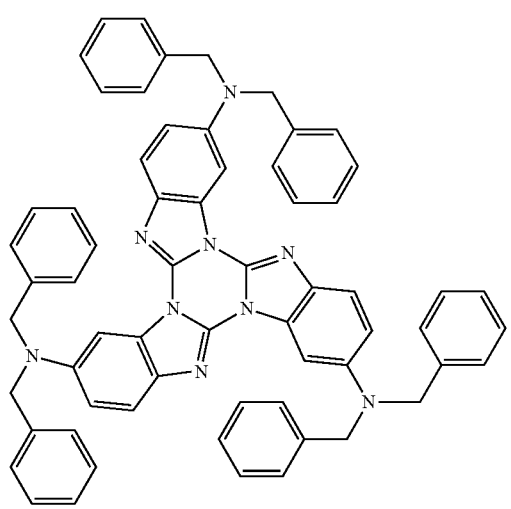
HI-52
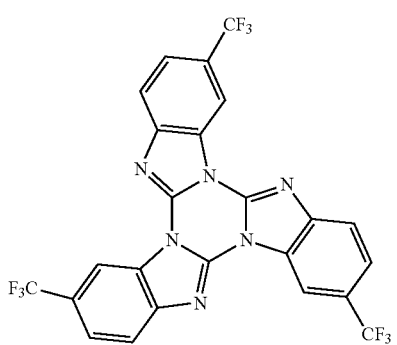

-continued
HI-53
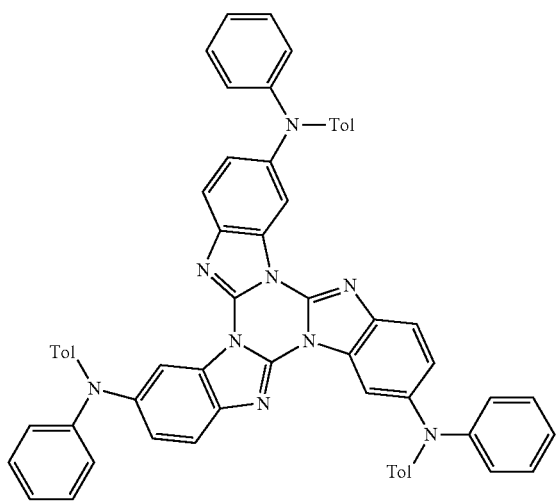
HI-54
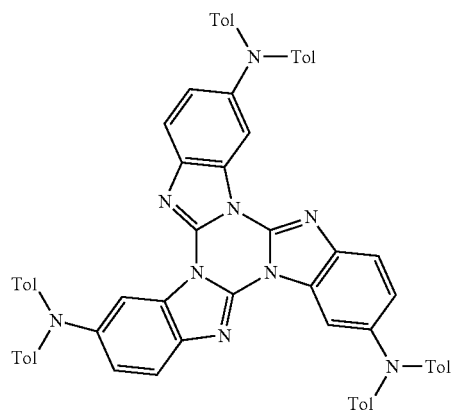
HI-55
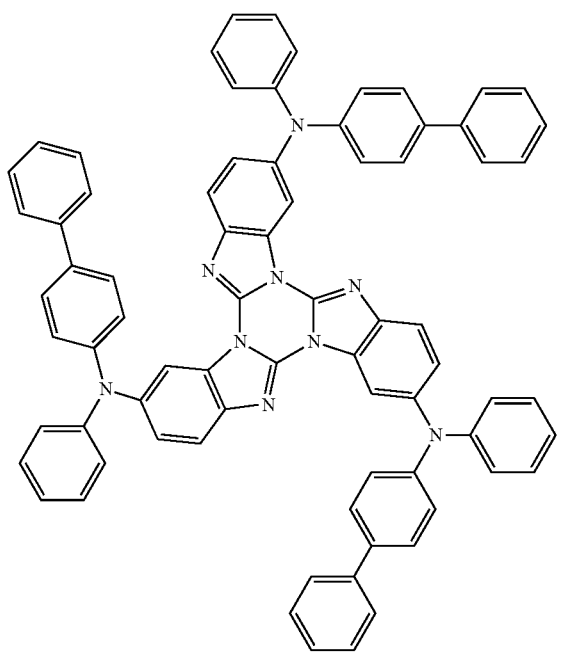
HI-56
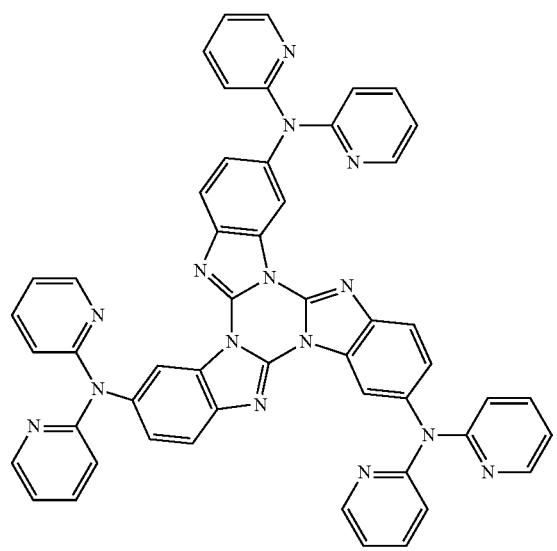
HI-57
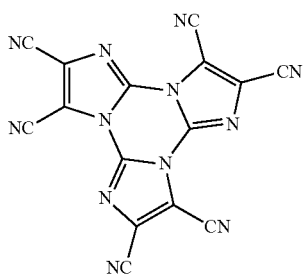
HI-58
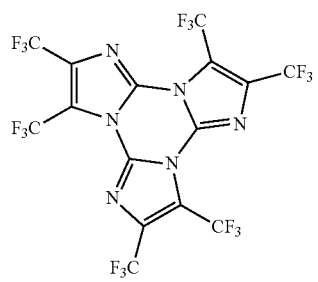

-continued
HI-59
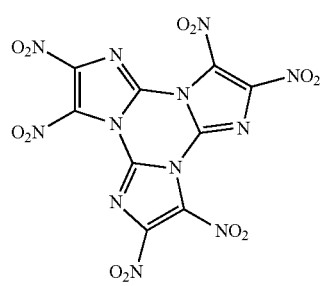
HI-60
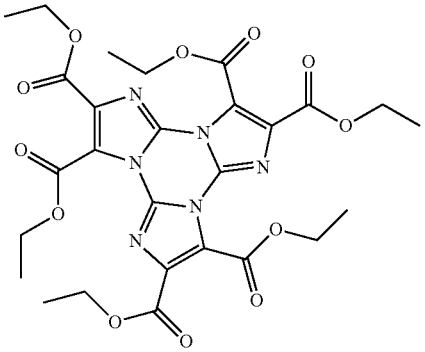
HI-61
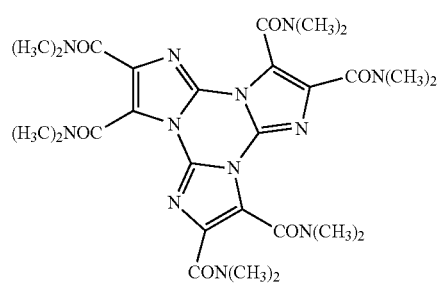
HI-62
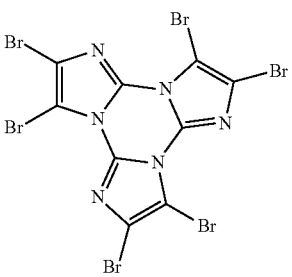
HI-63
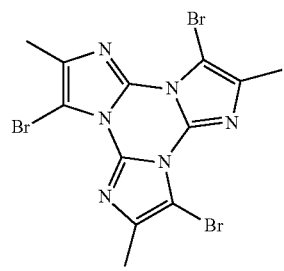
HI-64
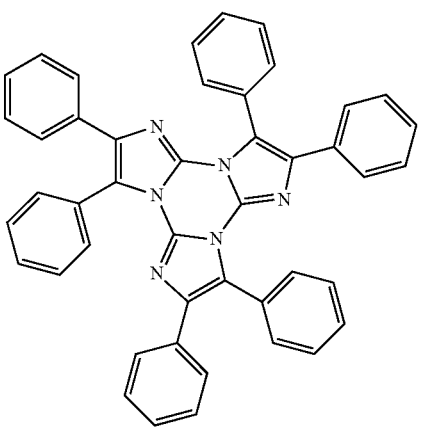
HI-65
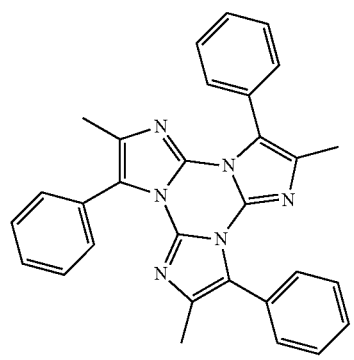
HI-66
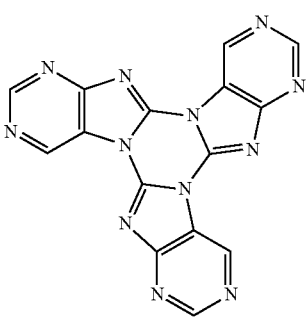

HI-67
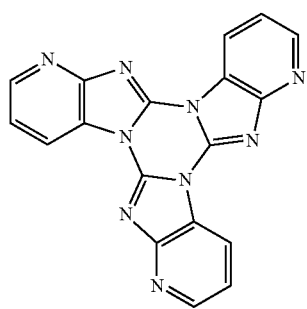
HI-68
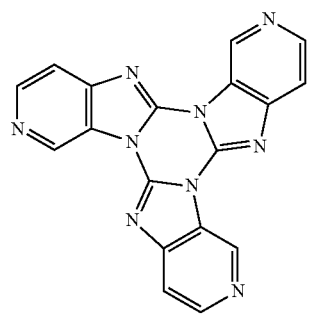
HI-69
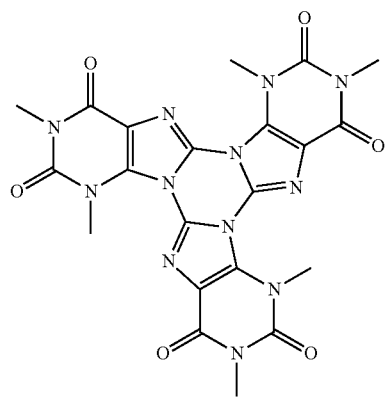
HI-70
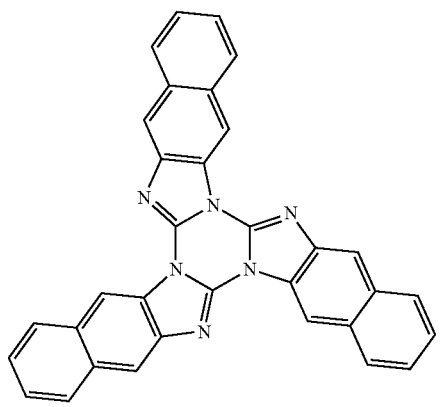
HI-71
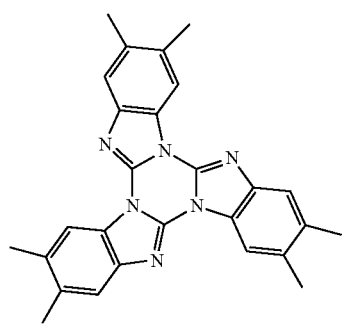
HI-72
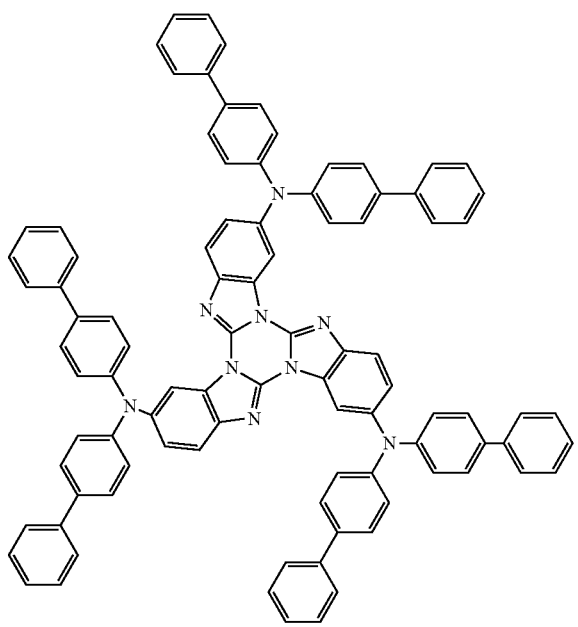

-continued
HI-73
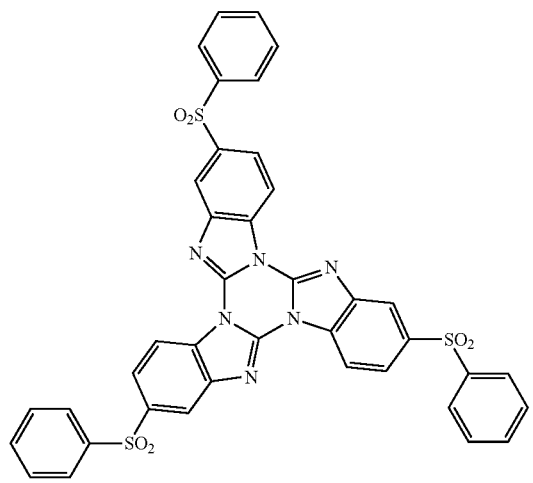
HI-74
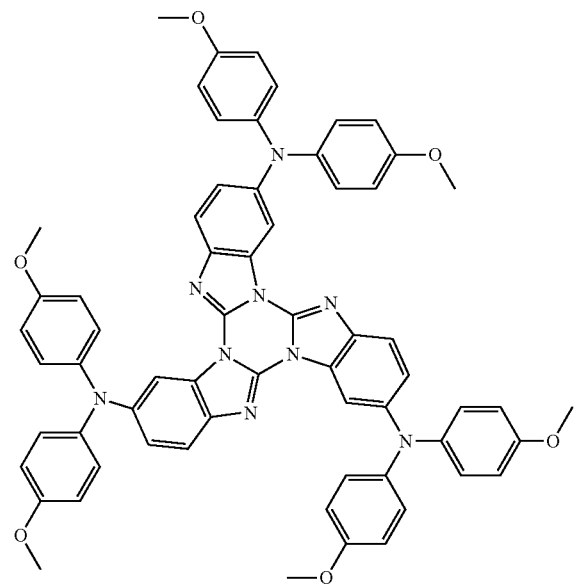
HI-75
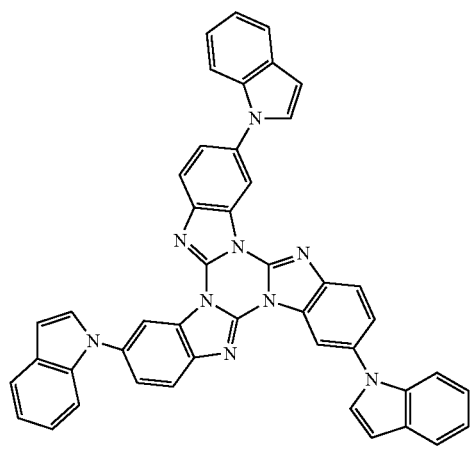
HI-76
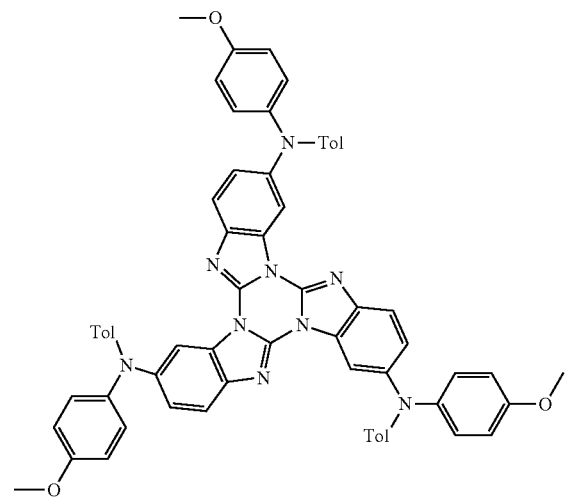
HI-77
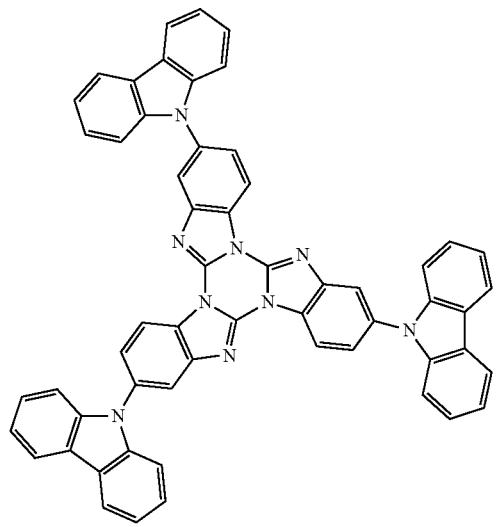
HI-78
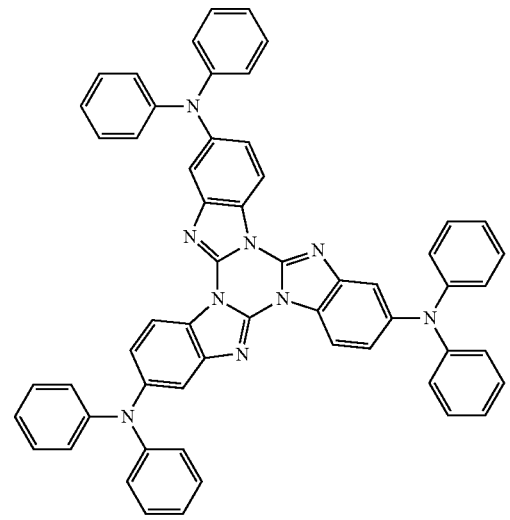

-continued
|  |  |
|---|---|
| HI-79 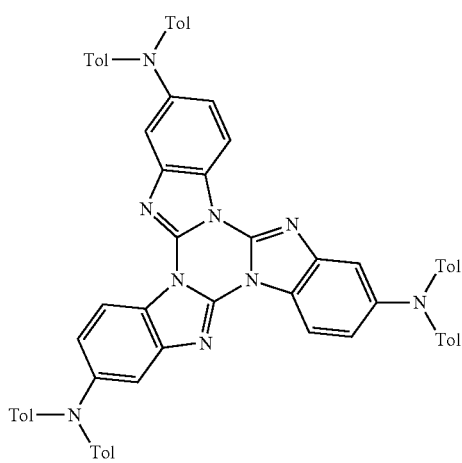 | HI-80 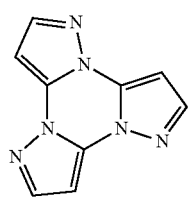 |
| HI-81 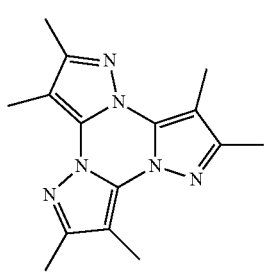 | HI-82 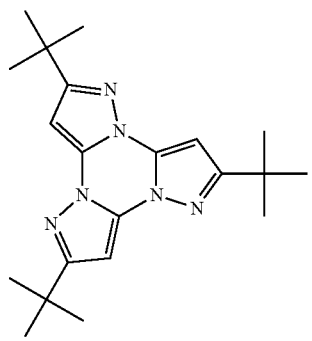 |
| HI-83 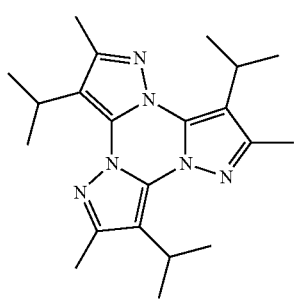 | HI-84 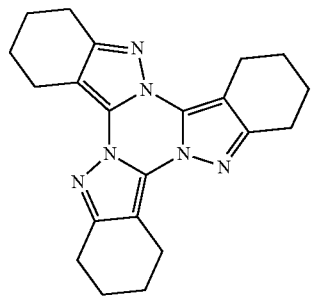 |
| HI-85 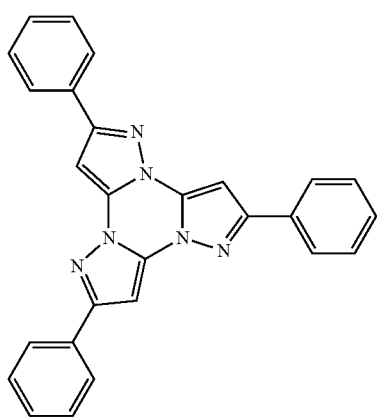 | HI-86 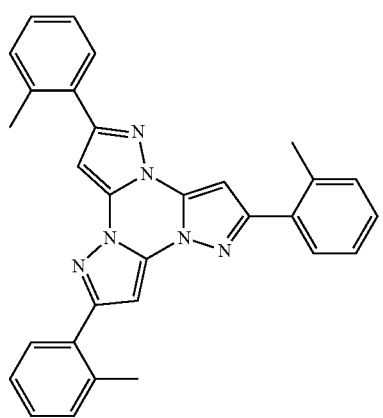 |

-continued
HI-87
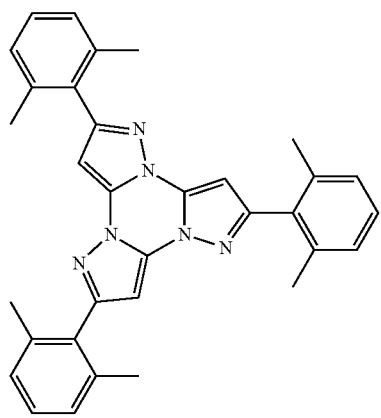
HI-88
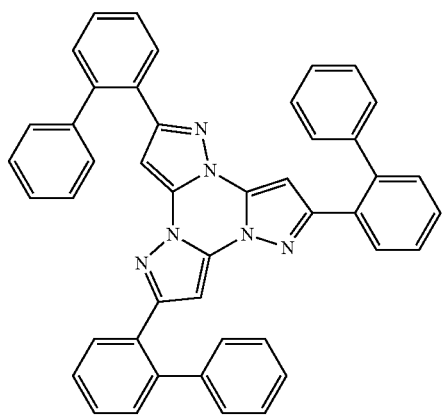
HI-89
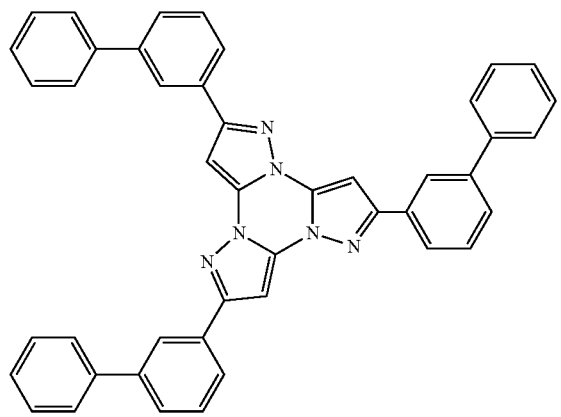
HI-90
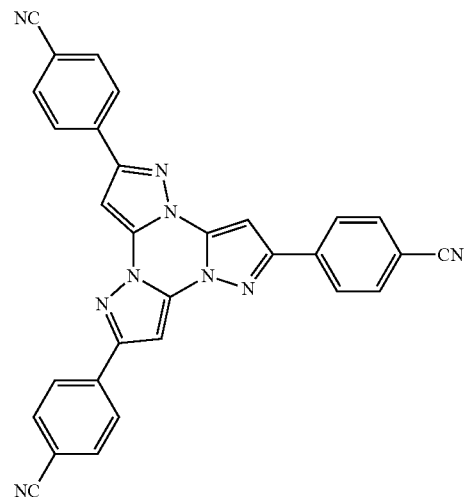
HI-91
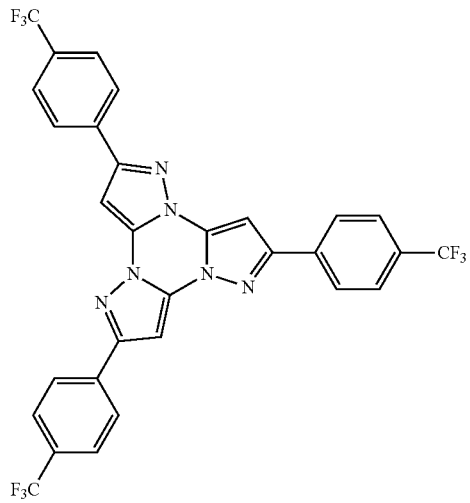
HI-92
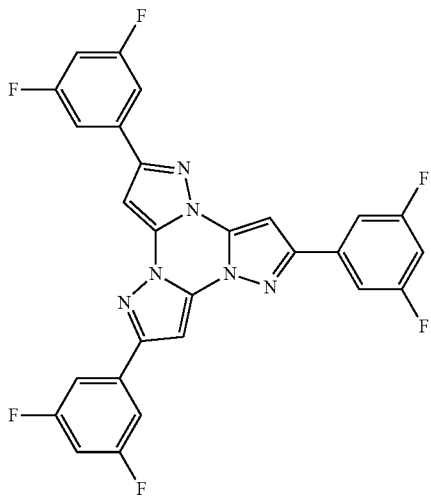

HI-93 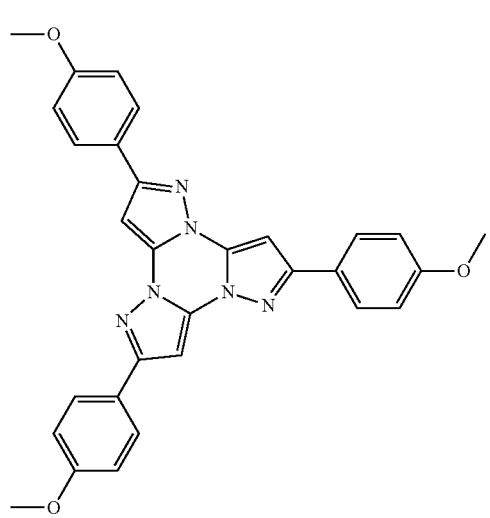
HI-94 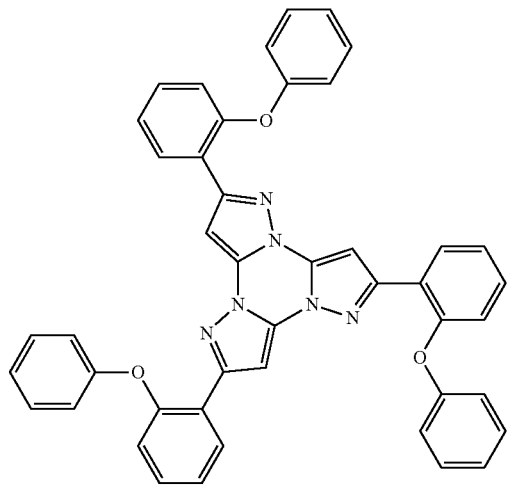
HI-95 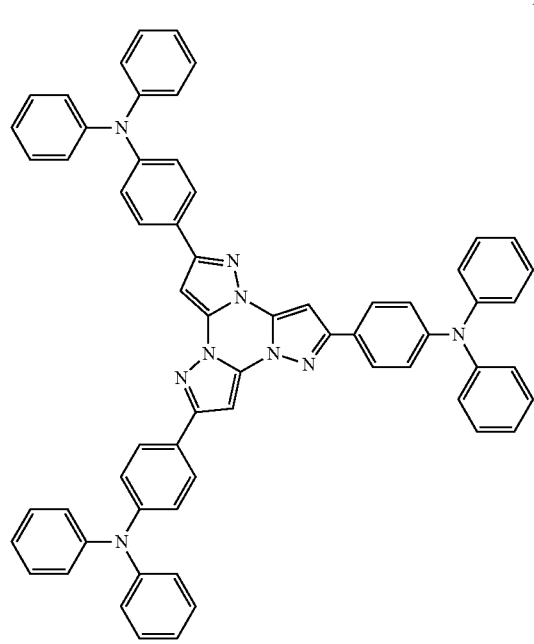
HI-96 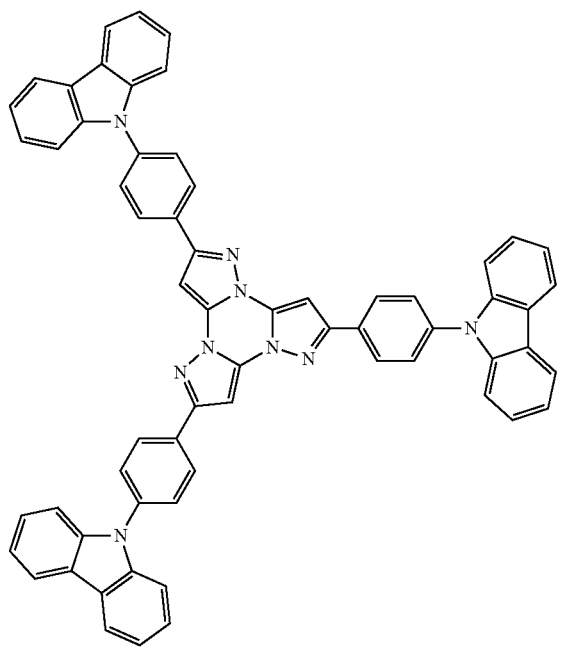

-continued
HI-97
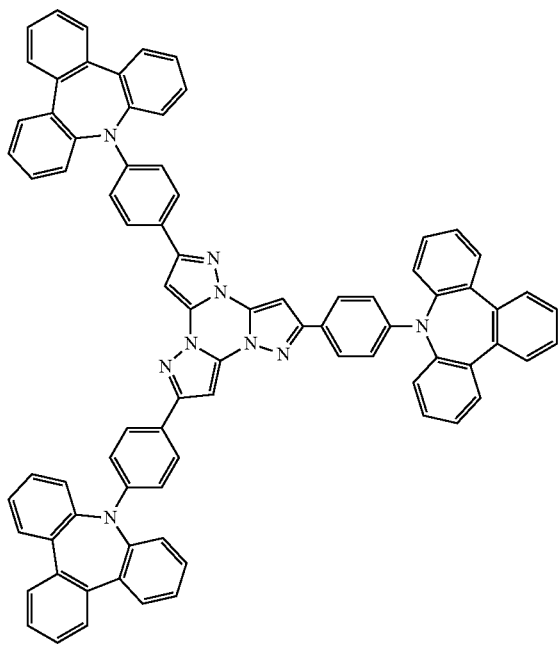
HI-98
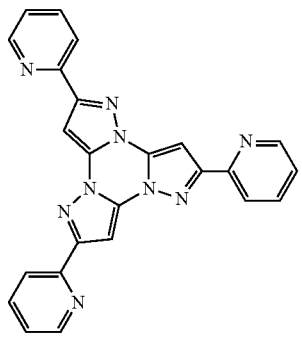
HI-99
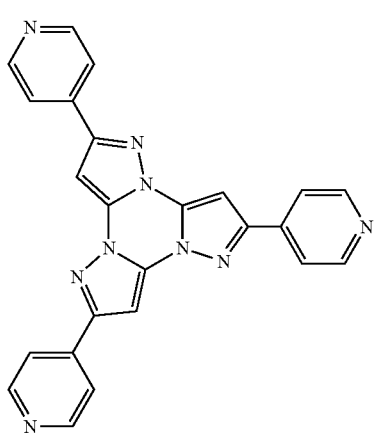
HI-100
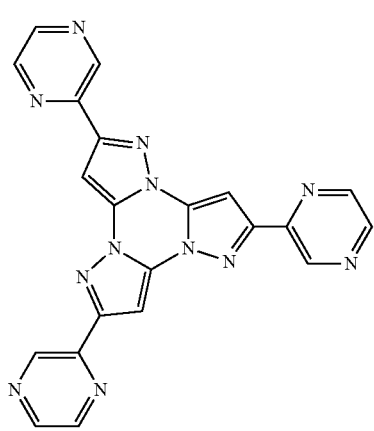
HI-101
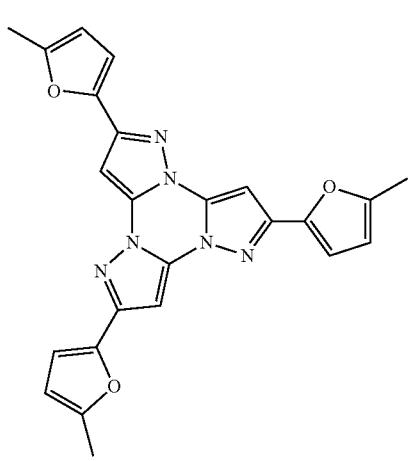
HI-102
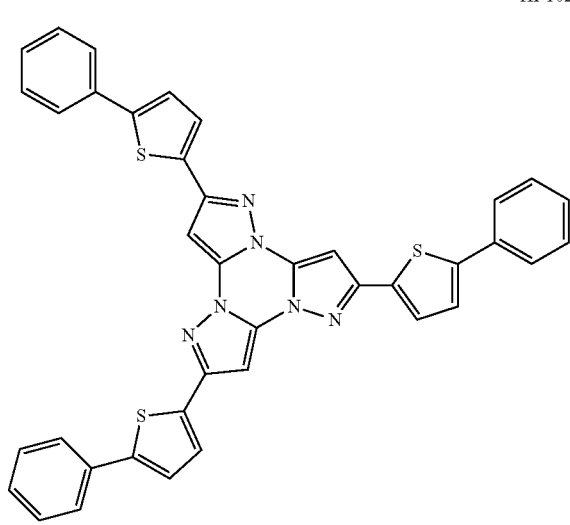

-continued
HI-103
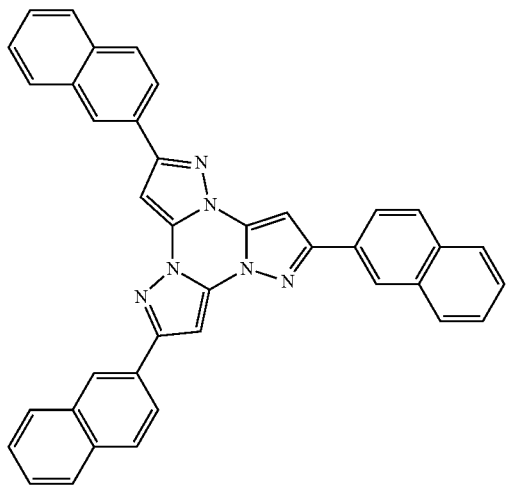
HI-104
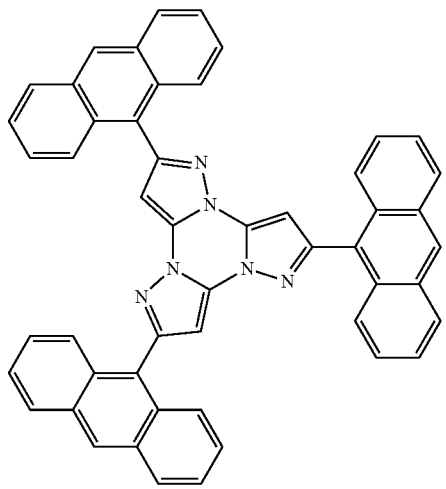
HI-105
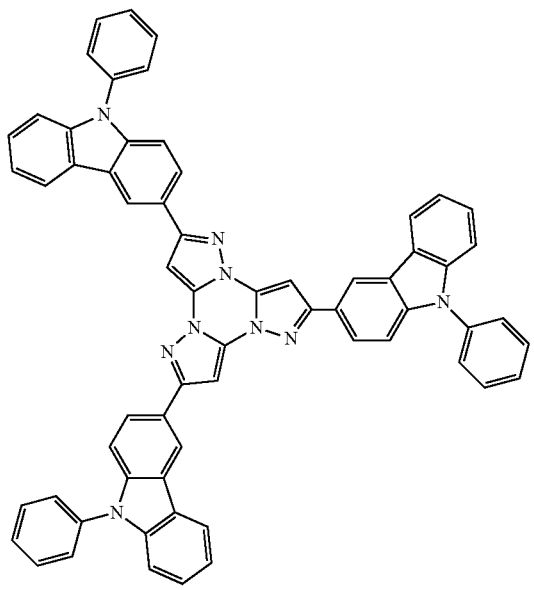
HI-106
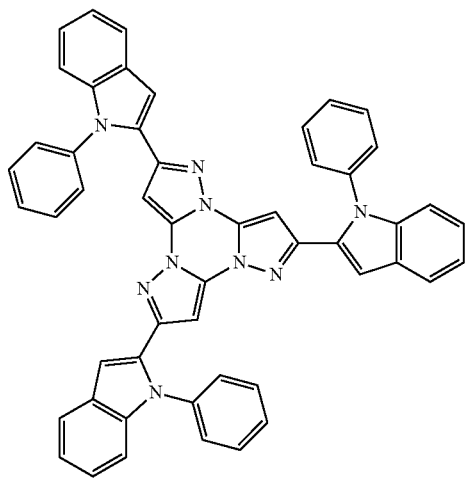
HI-107
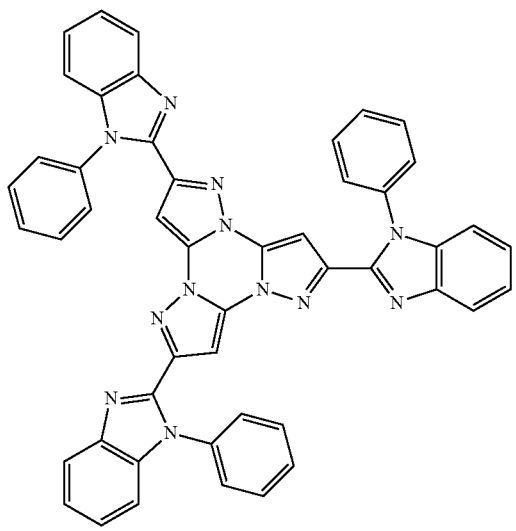
HI-108
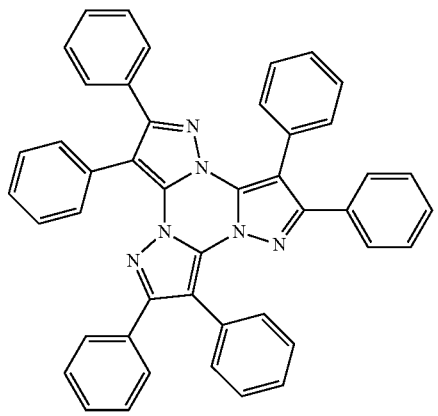

-continued
HI-109
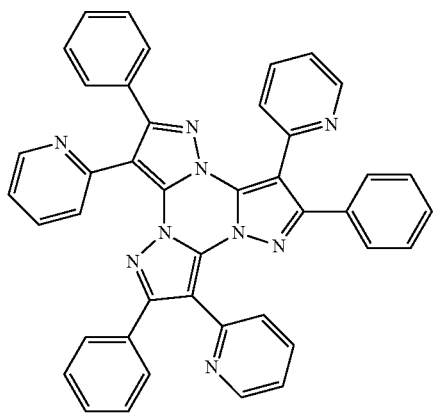
HI-110
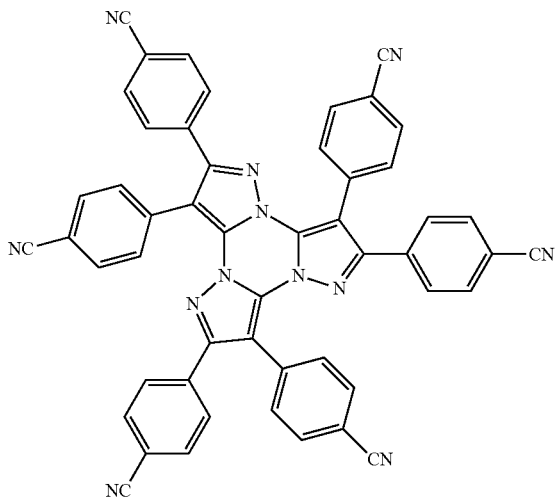
HI-111
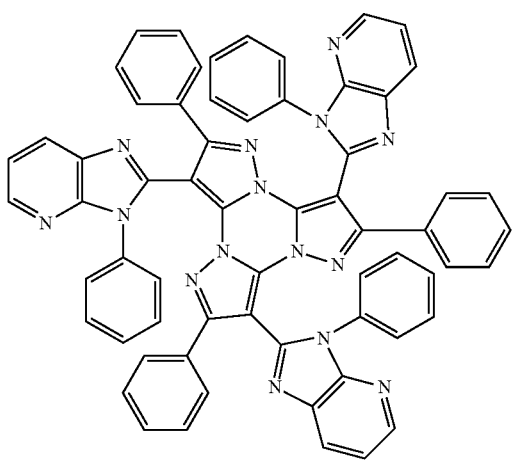
HI-112
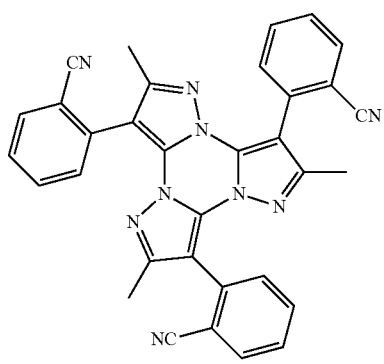
HI-113
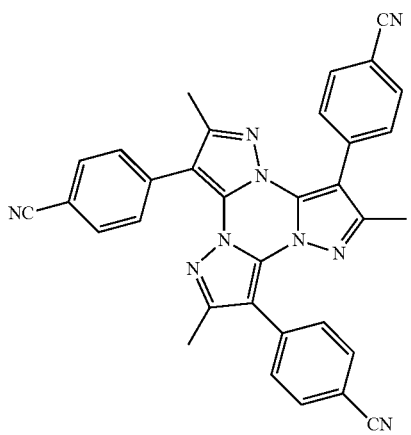
HI-114
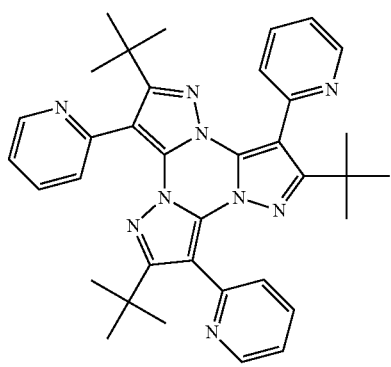

-continued
HI-115
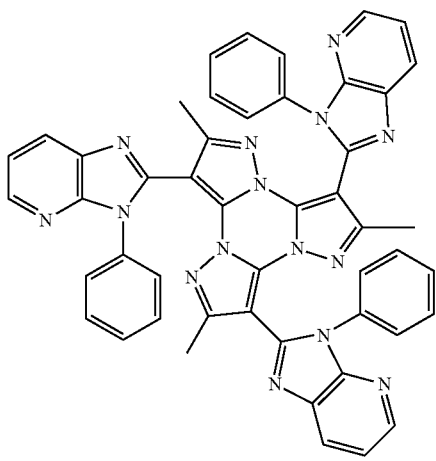
HI-116
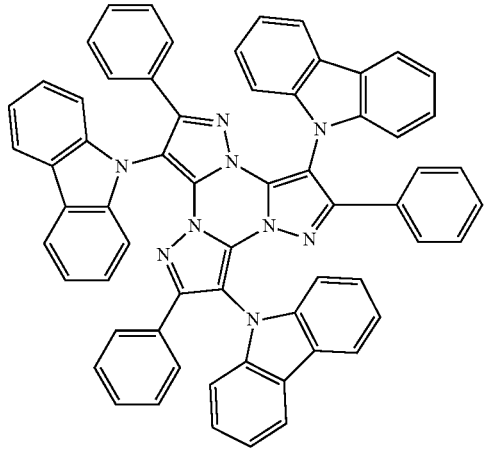
HI-117
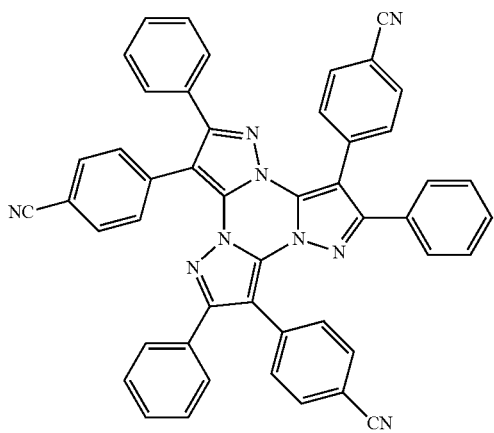
HI-118
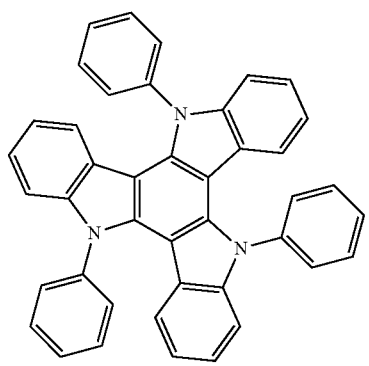
HI-119
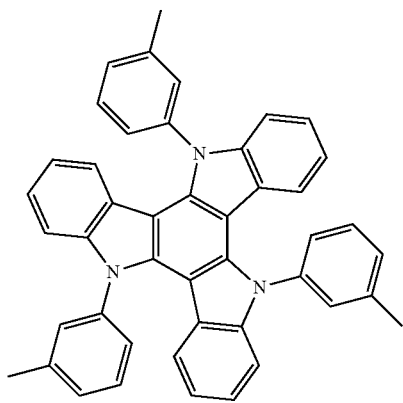
HI-120
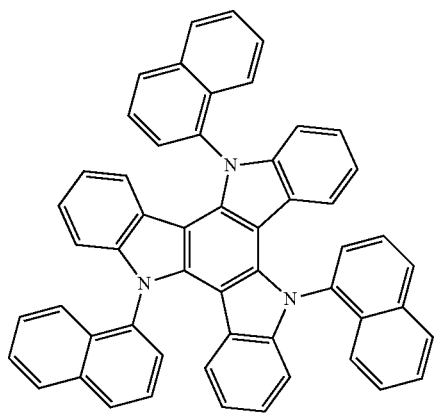

HI-121
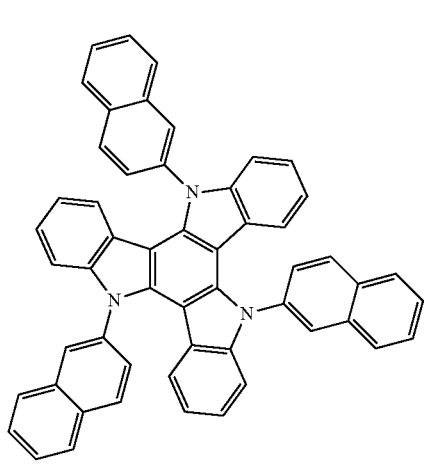
HI-122
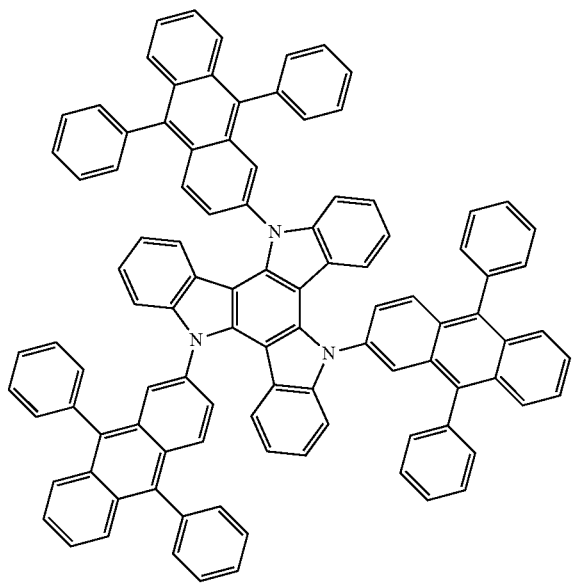
HI-123
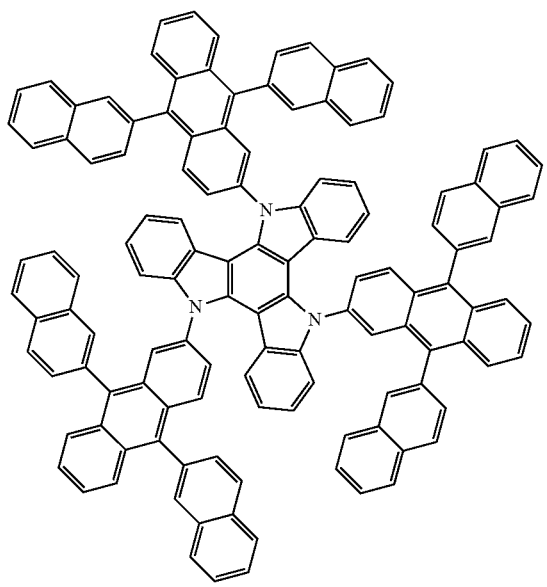
HI-124
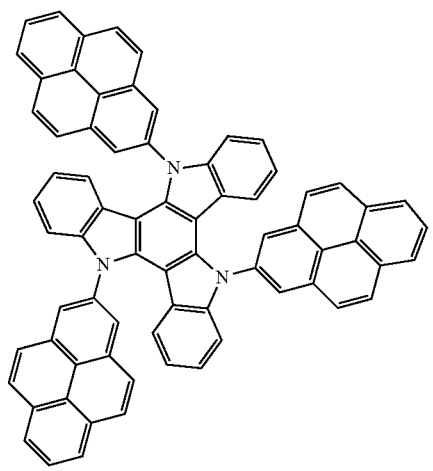

HI-125
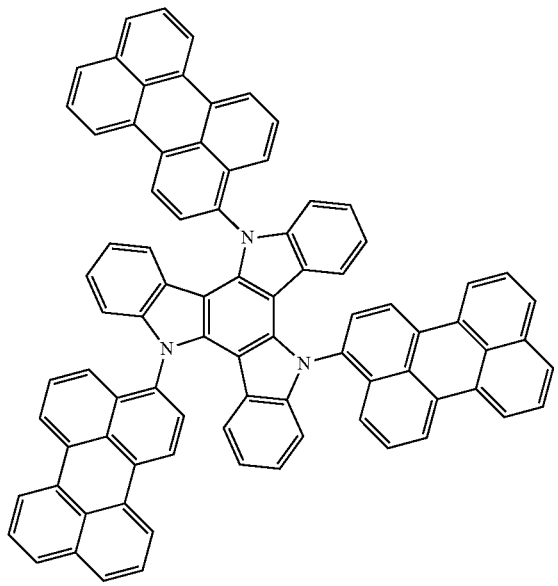
HI-126
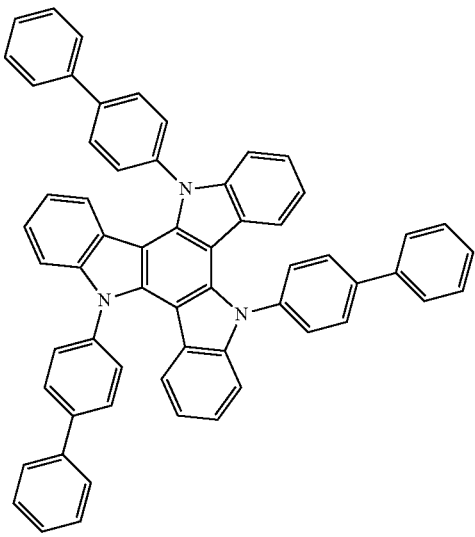
HI-127
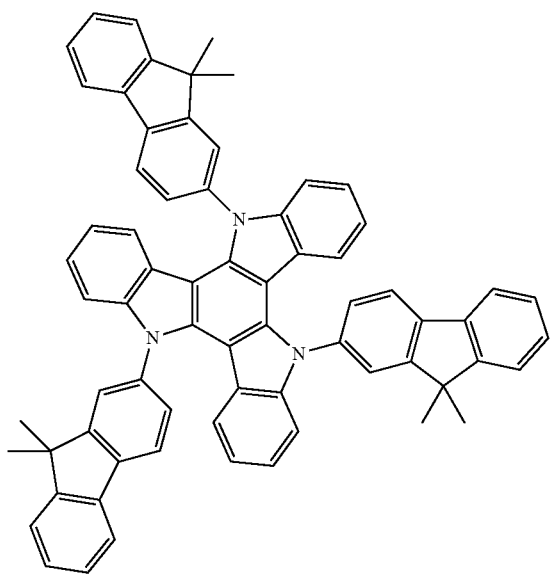
HI-128
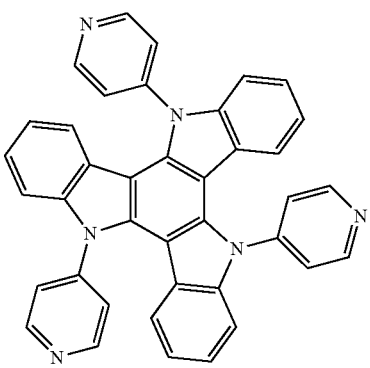

HI-129
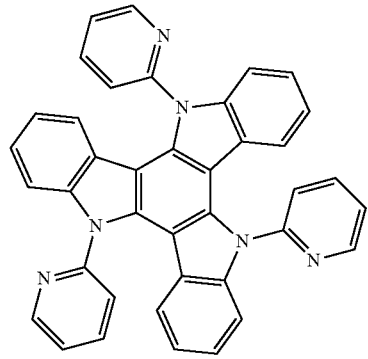
HI-130
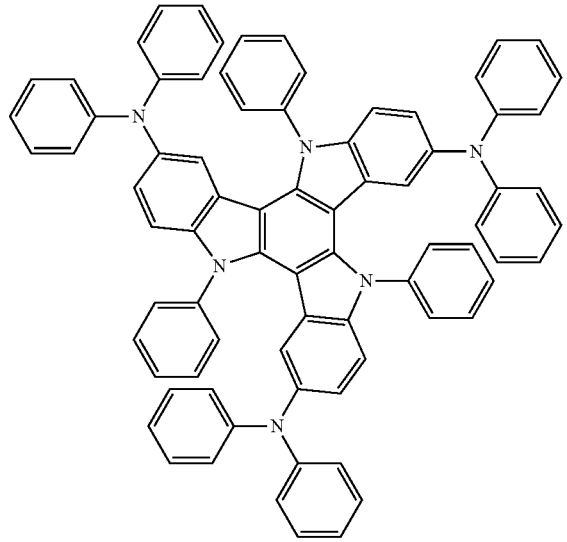
HI-131
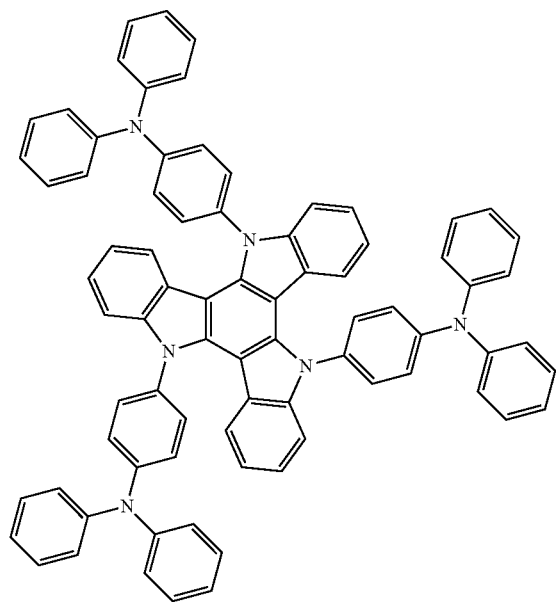
HI-132
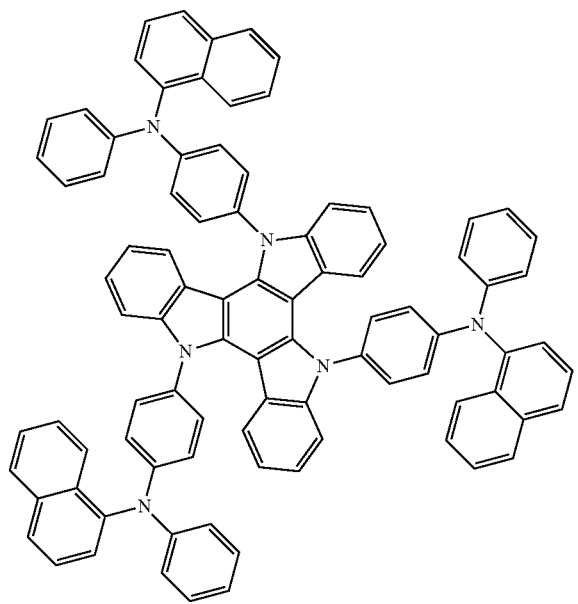

HI-133
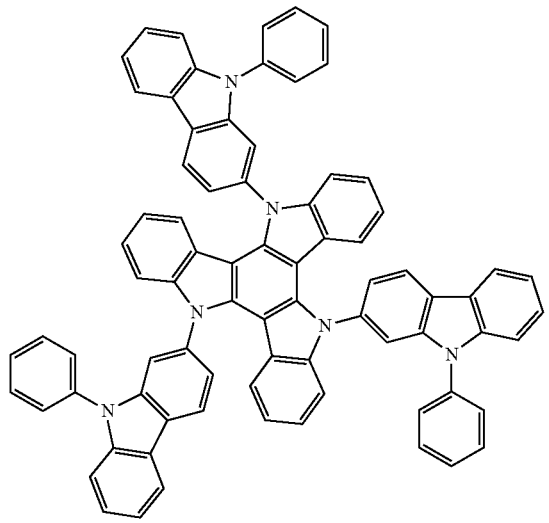
HI-134
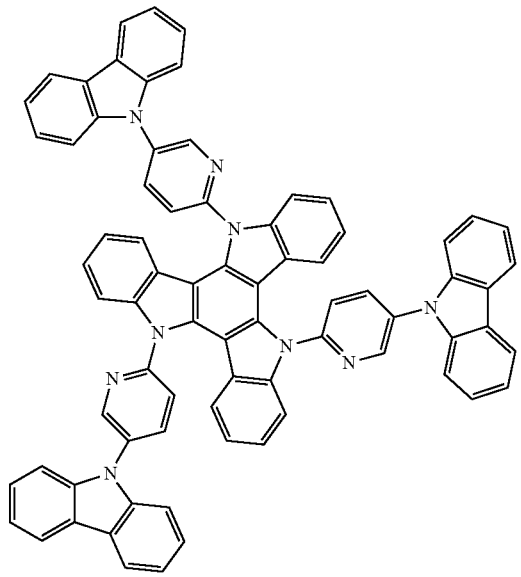
HI-135
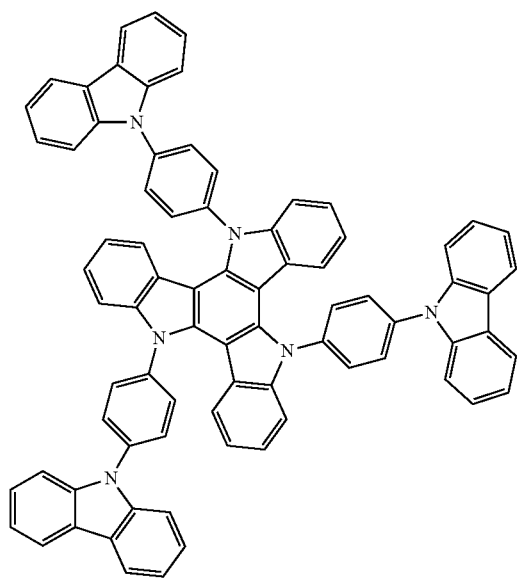
HI-136
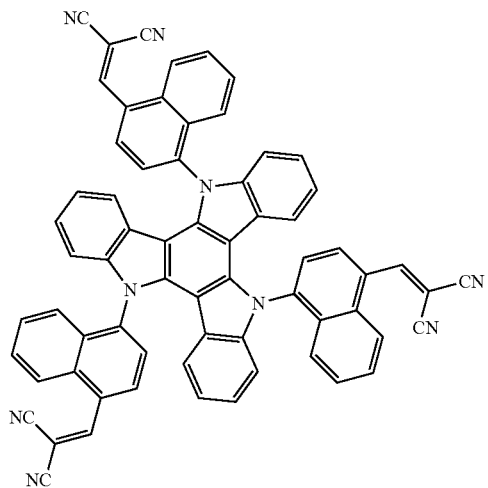

HI-137
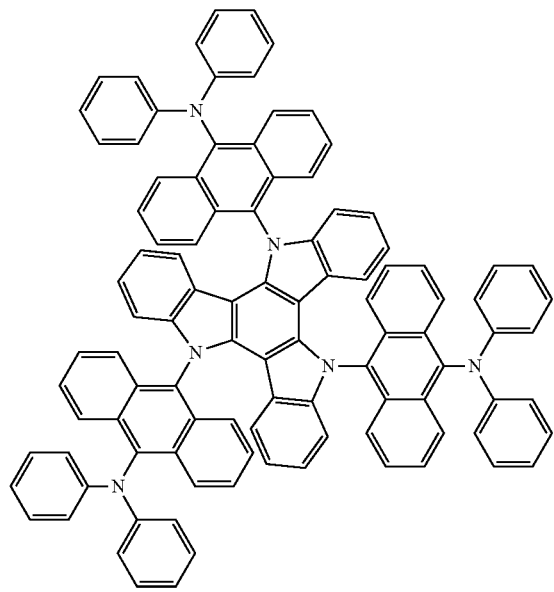
HI-138
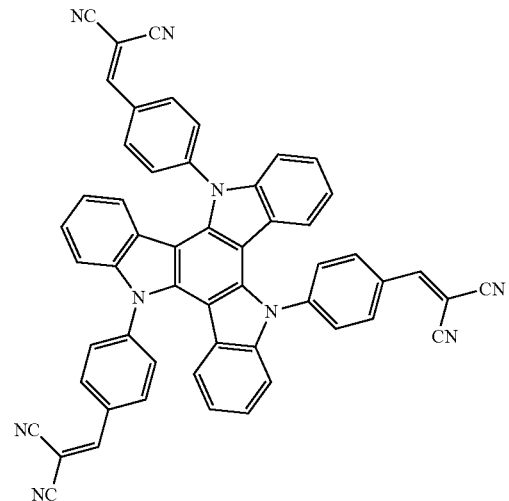
HI-139
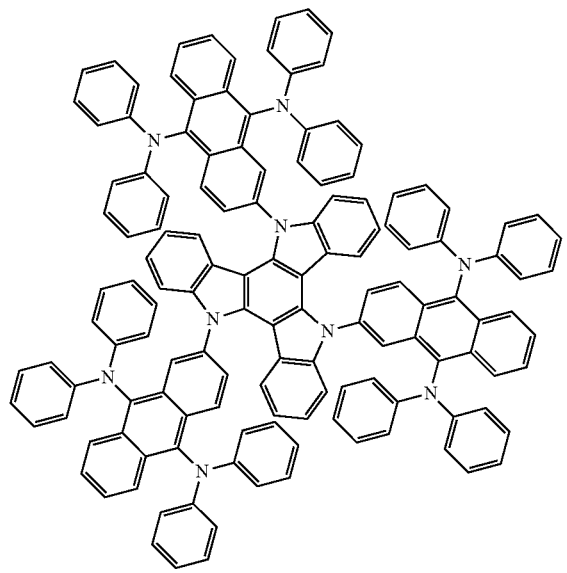

HI-140
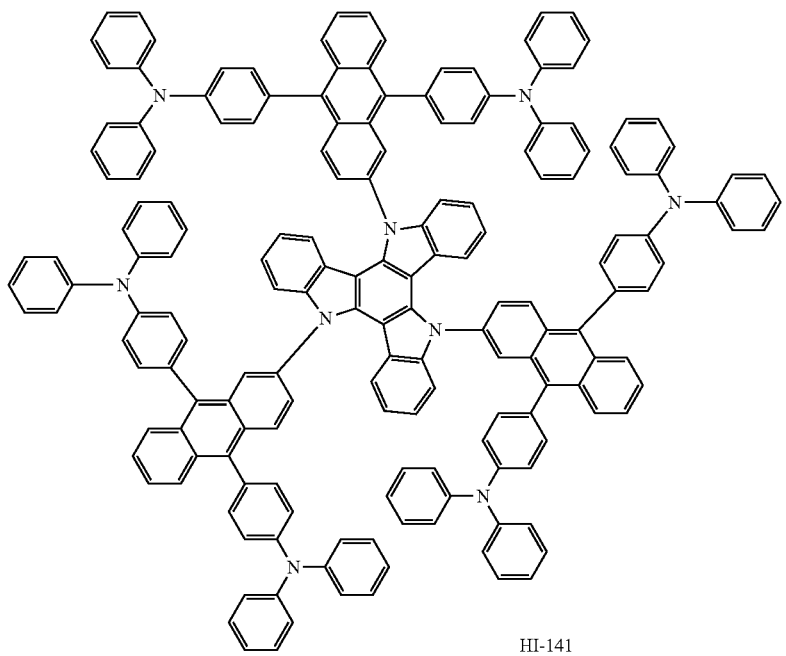
HI-141
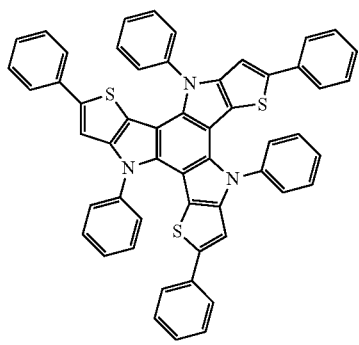
HI-142
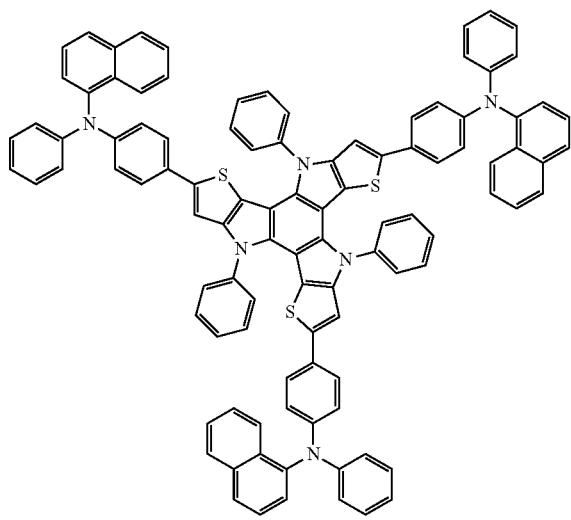
HI-143
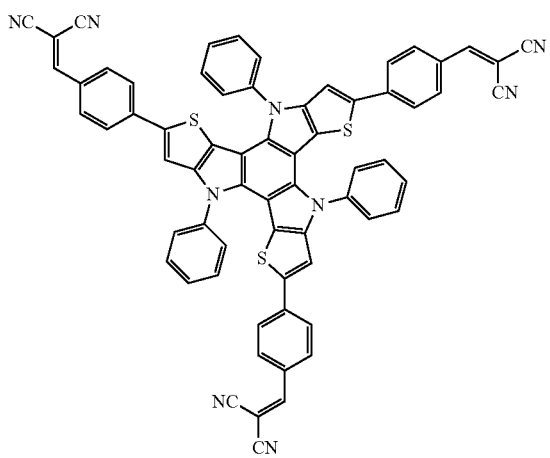
HI-144
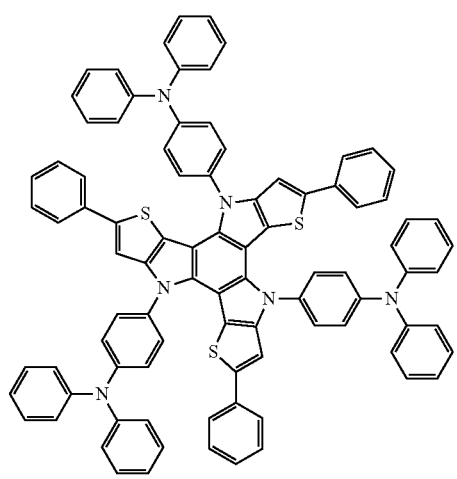

-continued
HI-145
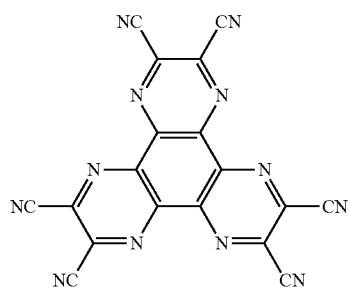
HI-146
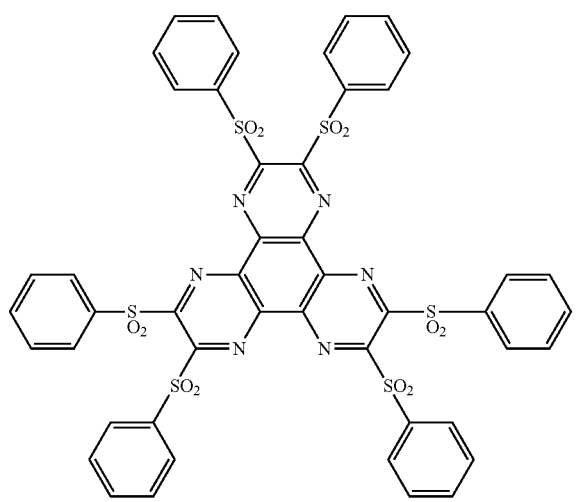
HI-147
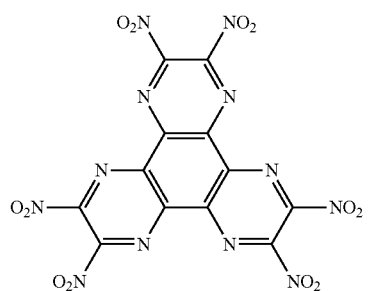
HI-148
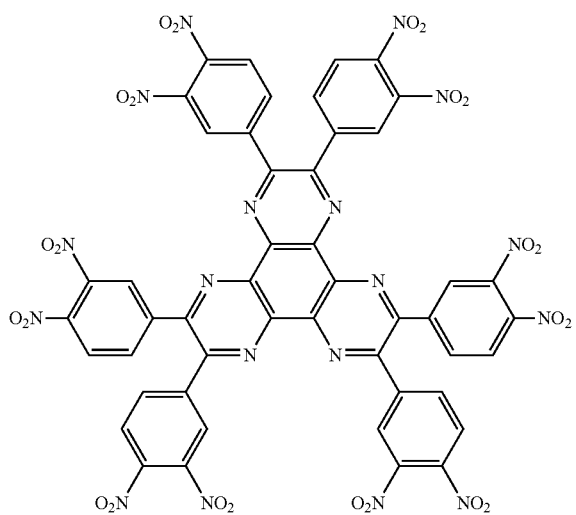
HI-149
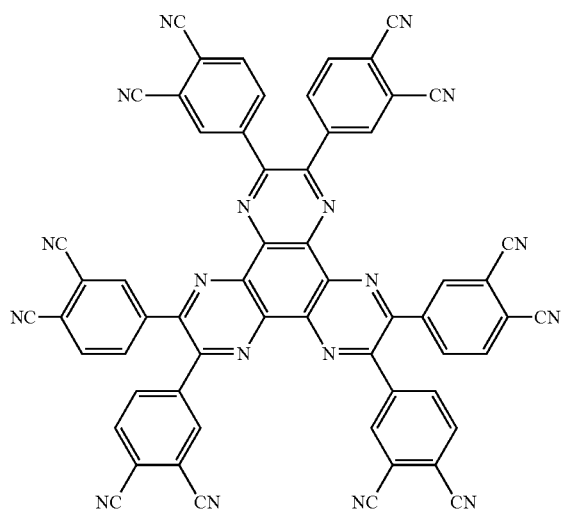
HI-150
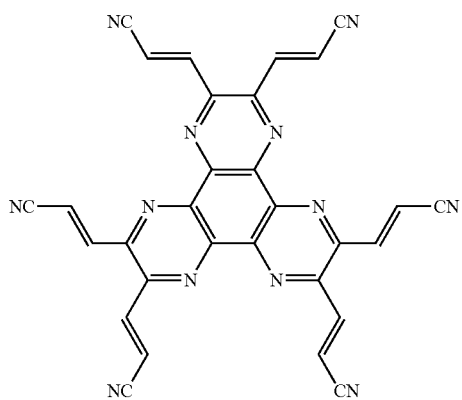

Materials used in the hole injection layer may be the same materials used in the hole transport layer describe later. Among them, preferable materials are: a phthalocyanine derivative represented by copper phthalocyanine; a hexaazatriphenylene derivative described in JP-A Nos. 2003-519432 and 2006-135145; a metal oxide represented by vanadium oxide; a conductive polymer such as amorphous carbon, polyaniline (or called as emeraldine) and polythiophene; an orthometalated complex represented by tris(2-phenylpyridine) iridium complex; and a triarylamine derivative.

The above-described materials used in a hole injection layer may be used singly or plural kinds may be co-used. In the hole injection layer of the present invention, it is preferable that it is made of a single material.

There are generally three types of materials used for a hole injection layer. Cited materials are: (i) a single organic compound; (ii) a single metal oxide; and (iii) a p-type doping material composed of an organic compound with a metal, a metal oxide or biferrocenium-F-TCNQ From the viewpoint of stability (mass production) of the material itself, it is most preferable to use a single organic compound for a hole injection layer. However, when a single organic compound is used, there may appear a defect that a hole transport property in the hole injection layer becomes small compared with a hole transport layer material. Further, as the temperature becomes lower, the hole transport property becomes remarkably a rate limiting process rather than the electron transport property in view of the law of hopping conduction ($p=eR^2v/k_BT\times exp(-2\alpha R)$). As a result, the color of the emission light shifted to the color of the emission light of the light emitting unit having a light emitting layer of high electron transport property among the first light emitting unit and the second light emitting unit.

In view of the above-described points, it is preferable that a thickness ratio ($d_{HIL}/d_{HL}$) is 0.20 or less, more preferably, it is 0.10 or less, provided that, $d_{HIL}$ is a thickness of a hole injection layer; $d_{HL}$ is a total thickness of the hole transport layers interposed between an anode or a charge generating unit and a light emitting layer (for example, a hole injection layer, a hole transport layer, and an electron transport layer). Otherwise, it is preferable that a hole injection layer has a thickness in the range of 1 to 15 nm, more preferably, in the range of 1 to 10 nm. Thereby, a marked decrease of the hole transport property in the hole injection layer under a low temperature condition will be minimized, and it is possible to realize an emitting device achieving a stable recombination of carriers in the light emitting units.

(Hole Transport Layer)

A hole transport layer contains a material having a function of transporting a hole. A hole transport layer is a layer having a function of transporting a hole injected from an anode to a light emitting layer.

A layer thickness of a hole transport layer of an organic EL element of the present invention is not specifically limited, however, it is generally in the range of 5 nm to 5 μm, preferably in the range of 2 to 500 nm, and more preferably in the range of 5 to 200 nm.

A material used in a hole transport layer (hereafter, it is called as a hole transport material) is only required to have any one of properties of injecting a hole, transporting a hole, and a barrier property to an electron. A hole transport material may be suitably selected from the conventionally known compounds. A hole transport material may be used singly or may be used in combination of plural kinds of compounds.

Examples of a hole transport material include: a porphyrin derivative, a phthalocyanine derivative, an oxazole derivative, an oxadiazole derivative, a triazole derivative, an imidazole derivative, a pyrazoline derivative, a pyrazolone derivative, a phenylenediamine derivative, a hydrazone derivative, a stilbene derivative, a polyarylalkane derivative, a triarylamine derivative, a carbazole derivative, an indolocarbazole derivative, an isoindole derivative, an acene derivative of anthracene or naphthalene, a fluorene derivative, a fluorenone derivative, polyvinyl carbazole, a polymer or an oligomer containing an aromatic amine in a side chain or a main chain, polysilane, and a conductive polymer or an oligomer (e.g., PEDOT:PSS, an aniline type copolymer, polyaniline and polythiophene).

Examples of a triarylamine derivative include: a benzidine type represented by α-NPD, a star burst type represented by MTDATA, and a compound having fluorene or anthracene in a triarylamine bonding core.

A hexaazatriphenylene derivative described in JP-A Nos. 2003-519432 and 2006-135145 may be also used as a hole transport material.

In addition, it is possible to employ an electron transport layer of a higher p property which is doped with impurities. As examples, the constitutions described in JP-A Nos. 4-297076, 2000-196140, and 2001-102175, as well as in J. Appl. Phys., 95, 5773 (2004) may be used for an electron transport layer.

Further, it is possible to employ so-called p-type hole transport materials, and inorganic compounds such as p-type Si and p-type SiC, as described in JP-A No. 11-251067, and J. Huang et al. reference (Applied Physics Letters 80 (2002), p. 139). Moreover, an orthometal compounds having Ir or Pt as a center metal represented by Ir(ppy)$_3$ are also preferably used.

Although the above-described compounds may be used as a hole transport material, preferably used are: a triarylamine derivative, a carbazole derivative, an indolocarbazole derivative, an azatriphenylene derivative, an organic metal complex, a polymer or an oligomer incorporated an aromatic amine in a main chain or in a side chain.

Specific examples of a hole transport material are compounds in the aforesaid publications and in the following publications. However, the present invention is not limited to them.

Examples of a publication are: Appl. Phys. Lett. 69, 2160(1996), J. Lumin. 72-74, 985(1997), Appl. Phys. Lett. 78, 673(2001), Appl. Phys. Lett. 90, 183503(2007), Appl. Phys. Lett. 51, 913(1987), Synth. Met. 87, 171(1997), Synth. Met. 91, 209(1997), Synth. Met. 111, 421(2000), SID Symposium Digest, 37, 923(2006), J. Mater. Chem. 3, 319(1993), Adv. Mater. 6, 677(1994), Chem. Mater. 15, 3148(2003), US 2003/0162053, US 2002/0158242, US 2006/0240279, US 2008/0220265, U.S. Pat. No. 5,061,569, WO 2007/002683, WO 2009/018009, EP 650955, US 2008/0124572, US 2007/0278938, US 2008/0106190, US 2008/0018221, WO 2012/115034, JP-A 2003-519432, JP-A 2006-135145, and U.S. patent application Ser. No. 13/585,981.

(Electron Blocking Layer)

An electron blocking layer is a layer provided with a function of a hole transport layer in a broad meaning. Preferably, it contains a material having a function of transporting a hole, and having very small ability of transporting an electron. It will improve the recombination probability of an electron and a hole by blocking an electron while transporting a hole.

Further, a composition of a hole transport layer described above may be appropriately utilized as an electron blocking layer of an organic EL element when needed. An electron blocking layer placed in an organic EL element is preferably arranged at a location in the light emitting layer adjacent to the anode side.

A thickness of an electron blocking layer is preferably in the range of 3 to 100 nm, and more preferably, it is in the range of 5 to 30 nm.

With respect to a material used for an electron blocking layer, the material used in the aforesaid hole transport layer is suitably used, and further, the material used as the aforesaid host compound is also suitably used for an electron blocking layer.

(Hole Blocking Layer)

A hole blocking layer is a layer provided with a function of an electron transport layer in a broad meaning. Preferably, it contains a material having a function of transporting an electron, and having very small ability of transporting a hole. It will improve the recombination probability of an electron and a hole by blocking a hole while transporting an electron.

When the hole blocking layer further has a function of preventing the route to the triplet energy level, it is further effective.

Further, a composition of an electron transport layer described above may be appropriately utilized as a hole blocking layer of the present invention when needed.

A hole blocking layer placed in an organic EL element of the present invention is preferably arranged at a location in the light emitting layer adjacent to the cathode side.

A thickness of a hole blocking layer according to the present invention is preferably in the range of 3 to 100 nm, and more preferably, in the range of 5 to 30 nm.

With respect to a material used for a hole blocking layer, the material used in the electron transport layer described later is suitably used, and further, the material used as the aforesaid host compound is also suitably used for a hole blocking layer.

(Electron Transport Layer)

An electron transport layer used in an organic EL element is composed of a material having a function of transferring an electron. It has a function of transporting an injected electron from a cathode to a light emitting layer.

An electron transport material may be used singly or may be used in combination of plural kinds of compounds.

A total layer thickness of the electron transport layer is not specifically limited, however, it is generally in the range of 2 nm to 5 μm, and preferably, it is in the range of 2 to 500 nm, and more preferably, it is in the range of 5 to 200 nm.

In an organic EL element, it is known that there occurs interference between the light directly taken from the light emitting layer and the light reflected at the electrode located at the opposite side of the electrode from which the light is taken out at the moment of taking out the light which is produced in the light emitting layer.

Consequently, it is preferable to suitably adjust the total thickness of the hole transport layers (e.g., hole injection layer, hole transport layer, and electron blocking layer) and the electron transport layers (e.g., electron injection layer, electron transport layer, and hole blocking layer) in the range of several nm to several μm.

On the other hand, the voltage will be increased when the layer thickness of the electron transport layer is made thick. Therefore, especially when the layer thickness is large, it is preferable that the electron mobility in the electron transport layer is $1\times10^{-5}$ cm$^2$/Vs or more.

As a material used for an electron transport layer (hereafter, it is called as an electron transport material), it is only required to have either a property of ejection or transport of electrons, or a barrier to holes. Any of the conventionally known compounds may be selected and they may be employed. Examples of an electron transport material are: a nitrogen-containing aromatic heterocyclic derivative, an aromatic hydrocarbon ring derivative, a dibenzofuran derivative, a dibenzothiophene derivative, and a silole derivative.

Examples of the nitrogen-containing aromatic heterocyclic derivative are: a carbazole derivative, an azacarbazole derivative (a compound in which one or more carbon atoms constituting the carbazole ring are substituted with nitrogen atoms), a pyridine derivative, a pyrimidine derivative, a pyrazine derivative, a pyridazine derivative, a triazine derivative, a quinoline derivative, a quinoxaline derivative, a phenanthroline derivative, an azatriphenylene derivative, an oxazole derivative, a thiazole derivative, an oxadiazole derivative, a thiadiazole derivative, a triazole derivative, a benzimidazole derivative, a benzoxazole derivative, and a benzothiazole derivative.

Examples of the aromatic hydrocarbon ring derivative are: a naphthalene derivative, an anthracene derivative, and a triphenylene derivative.

Further, metal complexes having a ligand of a 8-quinolinol structure or dibenzoquinolinol structure such as tris(8-quinolinol)aluminum (Alq$_3$), tris(5,7-dichloro-8-quinolinol) aluminum, tris(5,7-dibromo-8-quinolinol)aluminum, tris(2-methyl-8-quinolinol)aluminum, tris(5-methyl-8-quinolinol) aluminum, and bis(8-quinolinol)zinc (Znq); and metal complexes in which a central metal of the aforesaid metal complexes is substituted by In, Mg, Cu, Ca, Sn, Ga or Pb, may be also utilized as an electron transport material.

Further, a metal-free or metal phthalocyanine, or a compound whose terminal is substituted by an alkyl group or a sulfonic acid group, may be preferably utilized as an electron transport material. A distyryl pyrazine derivative, which is exemplified as a material for a light emitting layer, may be used as an electron transport material. Further, in the same manner as used for a hole injection layer and a hole transport layer, an inorganic semiconductor such as an n-type Si and an n-type SiC may be also utilized as an electron transport material.

It may be used a polymer material introduced these compounds in the polymer side-chain or a polymer material having any one of these substance in a polymer main chain.

In an organic EL element, it may be formed an electron transport layer of a higher n property (electron rich) by doping a dope material as a guest material into an electron transport layer. Examples of a dope material are: a metal compound such as a metal complex and a metal halide; and an n-type dopant. As specific examples of a dope material, listed are those described in each of JP-A Nos. 4-297076, 10-270172, 2000-196140, 2001-102175, as well as in J. Appl. Phys., 95, 5773 (2004).

Although the present invention is not limited thereto, preferable examples of a known electron transport material used in an organic EL element of the present invention are compounds described in the following publications.

U.S. Pat. No. 6,528,187, U.S. Pat. No. 7,230,107, US 2005/0025993, US 2004/0036077, US 2009/0115316, US 2009/0101870, US 2009/0179554, WO 2003/060956, WO 2008/132085, Appl. Phys. Lett. 75, 4 (1999), Appl. Phys. Lett. 79, 449 (2001), Appl. Phys. Lett. 81, 162 (2002), Appl. Phys. Lett. 81, 162 (2002), Appl. Phys. Lett. 79, 156 (2001), U.S. Pat. No. 7,964,293, US 2009/030202, WO 2004/080975, WO 2004/063159, WO 2005/085387, WO 2006/067931, WO 2007/086552, WO 2008/114690, WO 2009/069442, WO 2009/066779, WO 2009/054253, WO 2011/

086935, WO 2010/150593, WO 2010/047707, EP 2311826, JP-A 2010-251675, JP-A 2009-209133, JP-A 2009-124114, JP-A 2008-277810, JP-A 2006-156445, JP-A 2005-340122, JP-A 2003-45662, JP-A 2003-31367, JP-A 2003-282270, and WO 2012/115034.

As a preferable electron transport material, it may be cited: a pyridine derivative, a pyrimidine derivative, a pyrazine derivative, a triazine derivative, a dibenzofuran derivative, a dibenzothiophene derivative, a carbazole derivative, an azacarbazole derivative, and a benzimidazole derivative.

(Electron Injection Layer)

An electron injection layer (it is also called as "a cathode buffer layer") is a layer which is arranged between a cathode and a light emitting layer to decrease an operating voltage and to improve an emission luminance. An example of an electron injection layer is detailed in volume 2, chapter 2 "Electrode materials" (pp. 123-166) of "Organic EL Elements and Industrialization Front thereof (Nov. 30, 1998, published by N.T.S. Co. Ltd.)".

In an organic EL element of the present invention, an electron injection layer is provided according to necessity, and as described above, it is placed between a cathode or a charge generating unit and a light emitting layer, or between a cathode or a charge generating unit and an electron transport layer.

An electron injection layer is preferably a very thin layer. The layer thickness thereof is preferably in the range of 0.1 to 5 nm depending on the materials used. It may be an unhomogeneous layer in which the composing material is located intermittently.

An election injection layer is detailed in JP-A Nos. 6-325871, 9-17574, and 10-74586. Examples of a material preferably used in an election injection layer include: a metal such as strontium and aluminum; an alkaline metal compound such as lithium fluoride, sodium fluoride, or potassium fluoride; an alkaline earth metal compound such as magnesium fluoride; a metal oxide such as aluminum oxide; and a metal complex such as lithium 8-hydroxyquinolate (Liq). It is possible to use the aforesaid electron transport materials.

The above-described materials may be used singly or plural kinds may be used together in an election injection layer.

<Charge Generating Unit>

In an organic EL element of the present invention, a non-light-emitting charge generating unit is provided between the light emitting units. The charge generating unit is a layer having an interface with an organic compound layer which electrically connects a plurality of light emitting units in series in an electric field.

As a charge generating unit, an organic compound or an inorganic compound may be used singly or in combination with several kinds.

The charge generating unit is composed of at least one layer. However, it is preferably composed of at least two layers. It is particularly preferable to contain a p-type semiconductor layer, or an n-type semiconductor layer, or both of them.

The charge generating unit may be a bipolar layer that can generate and transport holes and electrons inside of the layer by an outer electric field. It is suitable to use a metal, a metal oxide, or an alloy thereof, which may be used as a usual electrode material.

As described above, the charge generating unit may be made to be a charge generating layer having a function of injecting electrons to one light emitting unit, and also having a function of injecting holes to another light emitting unit.

Further, the charge generating unit may be formed with the same material as the anode or the cathode, and it may be formed with a material having lower conductivity than the anode and the cathode.

In the charge generating unit, it may be used an insulator or a semiconductor such as lithium oxide, lithium fluoride, and cesium carbonate as a layer having a function of injecting holes. Alternatively, it may be used a material containing a substance having a high electron transport property added with an electron donating substance.

Examples of an organic compound used in a charge generating layer include: a nanocarbon material, an organic metal complex compound functioning as an organic semiconductor material (an organic acceptor, and an organic donor), an organic salt, an aromatic hydrocarbon compound and a derivative thereof, a heteroaromatic hydrocarbon compound and a derivative thereof.

Examples of an inorganic compound include: a metal, a metal oxide, and an inorganic salt.

As a substance having a high electron transport property, it may be used a metal complex containing a quinoline structure or a benzoquinoline structure such as:
tris(8-quinolinolato)aluminum ($Alq_3$),
tris(4-methyl-8-quinolinolato)aluminum ($Almq_3$),
bis(10-hydroxybenzo[h]quinolinato) beryllium ($BeBq_2$), and
bis(2-methyl-8-quinolinolato)(4-phenylphenolato)aluminum (BAlq).

It may be used a metal complex containing an oxazole or a thiazole ligand other than these. Examples thereof are:
bis[2-(2-hydroxyphenyl)benzoxazolato]zinc ($Zn(BOX)_2$),
bis[2-(2-hydroxyphenyl)benzothiazolato]zinc ($Zn(BTZ)_2$))

It may be used the following compounds other than a metal complex:
2-(4-biphenylyl)-5-(4-tert-butylphenyl)-1,3,4-oxadiazole (PBD),
1,3-bis[5-(p-tert-butylphenyl)-1,3,4-oxadiazol-2-yl] benzene (OXD-7),
3-(4-biphenylyl)-4-phenyl-5-(4-tert-butylphenyl)-1,2,4-triazole (TAZ), bathophenanthroline (BPhen), and bathocuproin (BCP).

The above-described substance having a high electron transport property designates a compound having an electron mobility of $1 \times 10^{-6}$ cm$^2$/Vs or more. Any compound exhibiting a higher transport property of electron than hole may be used instead of the above-described substances.

It is possible to increase an electron injection property by adding an electron donating substance to the substance having a high electron transport property. By this, a driving voltage of a light emitting element may be decreased. As an electron donating substance, it may be cited: an alkali metal, an alkaline earth metal, a rare earth metal, a metal belonging to Group 13 of the Periodic Table of the Elements, an oxide thereof, and a carbonate thereof.

Specifically preferable examples are: lithium (Li), cesium (Cs), magnesium (Mg), calcium (Ca), ytterbium (Yb), indium (In), lithium oxide, and cesium carbonate. Further, it may be used an organic compound such as tetrathianaphthacene as a donor.

Semiconductors such as molybdenum oxide, vanadium oxide, rhenium oxide, ruthenium oxide or an insulator may be used as a layer having a function of injecting holes among the charge generating unit. Alternatively, it may be used a material containing a substance having a high hole transport property added with a substance having a high electron accepting property. Further, it may be used a layer composed of an electron accepting substance.

Examples of a substance having high hole transport property include aromatic amine compounds as follows:

(4,4'-bis[N-(1-naphthyl)-N-phenyamino]biphenyl) (NBP or α-NPD);

N,N'-bis(3-methylphenyl)-N,N'-diphenyl-(1,1'-biphenyl)-4,4'-diamine (TPD);

(4,4',4''-tris(N,N-diphenylamino)triphenylamine) (TDATA); and (4,4',4''-tris(N-(3-methylphenyl)-N-phenylamino) triphenylamine) (MTDATA).

The above-described substance having a high hole transport property designates a compound having a hole mobility of $1\times10^{-6}$ cm$^2$/Vs or more. Any compound exhibiting a higher transport property of hole than electron may be used instead of the above-described substances. In addition, the above-described host compound may be used.

It is possible to increase a hole injection property by adding an electron accepting substance to the substance having a high hole transport property. By this, a driving voltage of a light emitting element may be decreased. As an electron accepting substance, it may be cited: 7,7,8,8-tetracyano-2,3,5,6-tetrafluoroquinodimethane (F4-TCNQ) and Chloranil. It may be used a transition metal oxide. Further, it may be used an oxide of a metal belonging to Group 4 to Group 8 of the Periodic Table of the Elements. Specific examples are: vanadium oxide, niobium oxide, tantalum oxide, chromium oxide, molybdenum oxide, tungsten oxide, manganese oxide, and rhenium oxide. These substances are preferable since they have a high electron accepting property. In particular, molybdenum oxide is preferable since it is stable in the air and it has low hygroscopic property, and it is easy to handle.

An increase of a driving voltage may be avoided even when the thickness of the charge generating unit is increased by adopting one or both of the following constitutions. One constitution is to add an electron accepting substance to a substance having a high hole transport property. The other constitution is to add an electron accepting substance to a substance having a high electron transport property. Therefore, it can prevent a short circuit caused by a minute foreign substance or an impact by increasing the thickness of the charge generating unit. As a result, it can achieve a light emitting element of high reliability without increasing the driving voltage.

In the charge generating unit, it may be introduced another layer between the layer having the function of injecting holes and the layer having the function of injecting electrons, when needed. For example, it may be placed an conductive layer such as ITO, or an electron relay layer. The electron relay layer has a function of reducing a voltage loss generated between a layer having a function of injecting holes and a layer having a function of injecting electrons. Specifically, it is preferable to use a material having a LUMO level of about −5.0 eV or more. It is more preferable to use a material having a LUMO level of about −5.0 eV to −3.0 eV. For example, it may be used: 3,4,9,10-perylenetetracarboxylic dianhydride (PTCDA) and 3,4,9,10-perylenetetracarboxylic bisbenzimidazole (PTCBI).

(Other Additive)

The light emitting unit composing the organic EL element may further contain other additive.

Examples of an additive are: halogen elements such as bromine, iodine and chlorine, and a halide compound; and a compound, a complex and a salt of an alkali metal, an alkaline earth metal and a transition metal such as Pd, Ca and Na.

Although a content of an additive may be arbitrarily decided, preferably, it is 1,000 ppm or less based on the total mass of the layer containing the additive, more preferably, it is 500 ppm or less, and still more preferably, it is 50 ppm or less.

In order to improve a transporting property of an electron or a hole, or to facilitate energy transport of an exciton, the content of the additive is not necessarily within these range, and other range of content may be used.

<Anode>

As an anode of an organic EL element, a metal having a large work function (4 eV or more, preferably, 4.3 eV or more), an alloy, and a conductive compound and a mixture thereof are utilized as an electrode substance.

Specific examples of an electrode substance are: metals such as Au, and an alloy thereof; transparent conductive materials such as CuI, indium tin oxide (ITO), SnO$_2$, and ZnO. Further, a material such as IDIXO (In$_2$O$_3$—ZnO), which may form an amorphous and transparent electrode, may also be used.

As for an anode, these electrode substances may be made into a thin layer by a method such as a vapor deposition method or a sputtering method; followed by making a pattern of a desired form by a photolithography method. Otherwise, when the requirement of pattern precision is not so severe (about 100 μm or more), a pattern may be formed through a mask of a desired form at the time of layer formation with a vapor deposition method or a sputtering method using the above-described material.

Alternatively, when a coatable substance such as an organic conductive compound is employed, it is possible to employ a wet film forming method such as a printing method or a coating method.

When emitted light is taken out from the anode, the transmittance is preferably set to be 10% or more. A sheet resistance of the anode is preferably a few hundred Ω/sq or less. Further, although a layer thickness of the anode depends on a material, it is generally selected in the range of 10 nm to 1 μm, and preferably in the range of 10 to 200 nm.

<Cathode>

As a cathode, a metal having a small work function (4 eV or less) (it is called as an electron injective metal), an alloy, a conductive compound and a mixture thereof are utilized as an electrode substance. Specific examples of the aforesaid electrode substance includes: sodium, sodium-potassium alloy, magnesium, lithium, a magnesium/copper mixture, a magnesium/silver mixture, a magnesium/aluminum mixture, a magnesium/indium mixture, an aluminum/aluminum oxide (Al$_2$O$_3$) mixture, indium, a lithium/aluminum mixture, aluminum, silver, a silver alloy containing silver as a main component, an aluminum/solver mixture, and a rare earth metal.

A cathode may be made by using these electrode substances with a method such as a vapor deposition method or a sputtering method to form a thin film. A sheet resistance of the cathode is preferably a few hundred Ω/sq or less. A layer thickness of the cathode is generally selected in the range of 10 nm to 5 μm, and preferably in the range of 50 to 200 nm.

<Substrate>

A substrate which may be used for an organic EL element is not specifically limited with respect to types such as glass and plastics. They may be transparent or opaque. However, a transparent substrate is preferable when the emitting light is taken from the side of the substrate. Transparent substrates preferably utilized includes such as glass, quartz and transparent resin film. A specifically preferable substrate is a resin film which is capable of providing an organic EL element with a flexible property.

Examples of a resin film include: polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, polyamide, fluororesin, Nylon, polymethyl methacrylate, acrylic resin, polyallylates and cycloolefin resins such as ARTON (trade name, made by JSR Co. Ltd.) and APEL (trade name, made by Mitsui Chemicals, Inc.).

On the surface of a resin film, it may be formed a film incorporating an inorganic or an organic compound or a hybrid film incorporating both compounds. Barrier films are preferred with a water vapor permeability of 0.01 g/(m$^2$·24 h) or less (at 25±0.5° C., and 90±2% RH) determined based on JIS K 7129-1992. Further, high barrier films are preferred to have an oxygen permeability of $1\times10^{-3}$ ml/(m$^2$·24 h·atm) or less determined based on JIS K 7126-1987, and a water vapor permeability 1 of $1\times10^{-5}$ g/(m$^2$·24 h) or less.

As materials that form a gas barrier film, employed may be those which retard penetration of moisture and oxygen, which deteriorate the element. For example, it is possible to employ silicon oxide, silicon dioxide, and silicon nitride. Further, in order to improve the brittleness of the gas barrier film, it is more preferable to achieve a laminated layer structure of inorganic layers and organic layers. The laminating order of the inorganic layer and the organic layer is not particularly limited, but it is preferable that both are alternatively laminated a plurality of times.

Gas barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143.

Examples of opaque support substrates include metal plates such aluminum or stainless steel films, opaque resin substrates, and ceramic substrates.

<Sealing>

As sealing means employed in the present invention, listed may be, for example, a method in which sealing members, electrodes, and a supporting substrate are subjected to adhesion via adhesives. The sealing members may be arranged to cover the display region of an organic EL element, and may be a concave plate or a flat plate. Neither transparency nor electrical insulation is limited.

Specifically listed are glass plates, polymer plate-films, and metal plate-films.

Specifically, as glass plates, listed are: soda-lime glass, barium-strontium containing glass, lead glass, aluminosilicate glass, borosilicate glass, barium borosilicate glass, and quartz.

Further, as polymer plates, listed are: polycarbonate, acryl, polyethylene terephthalate, polyether sulfide, and polysulfone.

As metal plates, listed are: those composed of at least one metal selected from the group consisting of stainless steel, iron, copper, aluminum magnesium, nickel, zinc, chromium, titanium, molybdenum, silicon, germanium, and tantalum, or alloys thereof.

Since it is possible to achieve a thin organic EL element, it is preferable to employ a polymer film or a metal film. Further, it is preferable that the polymer film has an oxygen permeability of $1\times10^{-3}$ ml/(m$^2$·24 h·atm) or less, and a water vapor permeability of $1\times10^{-3}$ g/(m$^2$·24 h) or less. It is more preferable that the polymer film has a water vapor permeability of $1\times10^{-5}$ g/(m$^2$·24 h) or less, and an oxygen permeability of $1\times10^{-5}$ ml/(m$^2$·24 h·atm) or less.

Conversion of the sealing member into concave is carried out by employing a sand blast process or a chemical etching process. In practice, as adhesives, listed may be photo-curing and heat-curing types having a reactive vinyl group of acrylic acid based oligomers and methacrylic acid, as well as moisture curing types such as 2-cyanoacrylates. Further listed may be thermal and chemical curing types (mixtures of two liquids) such as epoxy based ones. Still further listed may be hot-melt type polyamides, polyesters, and polyolefins. Yet further listed may be cationically curable type UV curable epoxy resin adhesives.

In addition, since an organic EL element is occasionally deteriorated via a thermal process, preferred are those which enable adhesion and curing between a room temperature (25° C.) and 80° C. Further, desiccating agents may be dispersed into the aforesaid adhesives. Adhesives may be applied onto sealing portions via a commercial dispenser or printed on the same in the same manner as screen printing.

It is preferable to inject a gas phase and a liquid phase material of inert gases such as nitrogen or argon, and inactive liquids such as fluorinated hydrocarbon or silicone oil into the space between the space formed with the sealing member and the display region of the organic EL element. Further, it is possible to form vacuum in the space. Still further, it is possible to enclose hygroscopic compounds in the interior of the space.

Examples of a hygroscopic compound include: metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In sulfates, metal halides, and perchlorates, suitably employed are anhydrides. For sulfate salts, metal halides and perchlorates, suitably used are anhydrous salts.

<Protective Film and Protective Plate>

On the outer surface of the sealing, a protective or a protective plate may be arranged to enhance the mechanical strength of the organic EL element. Specifically, when sealing is achieved via the aforesaid sealing film, the resulting mechanical strength is not always high enough, therefore it is preferable to arrange the protective film or the protective plate described above. Usable materials for these include glass plates, polymer plate-films, and metal plate-films which are similar to those employed for the aforesaid sealing. However, from the viewpoint of reducing weight and thickness, it is preferable to employ a polymer film.

<Improving Method of Light Extraction>

It is generally known that an organic EL element emits light in the interior of the layer exhibiting the refractive index (being about 1.6 to 2.1) which is greater than that of air, whereby only about 15% to 20% of light generated in the light emitting layer is extracted. This is due to the fact that light incident to an interface (being an interlace of a transparent substrate to air) at an angle of e which is at least critical angle is not extracted to the exterior of the element due to the resulting total reflection, or light is totally reflected between the transparent electrode or the light emitting layer and the transparent substrate, and light is guided via the transparent electrode or the light emitting layer, whereby light escapes in the direction of the element side surface.

Means to enhance the efficiency of the aforesaid light extraction include, for example: a method in which roughness is formed on the surface of a transparent substrate, whereby total reflection is minimized at the interface of the transparent substrate to air (U.S. Pat. No. 4,774,435), a method in which efficiency is enhanced in such a manner that a substrate results in light collection (JP-A No. 63-314795), a method in which a reflection surface is formed on the side of the element (JP-A No. 1-220394), a method in which a flat layer of a middle refractive index is introduced between the substrate and the light emitting body and an antireflection film is formed (JP-A No. 62-172691), a method in which a flat layer of a refractive index which is equal to or less than the substrate is introduced between the substrate and the light emitting body (JP-A No. 2001-202827), and a method in which a diffraction grating is formed between the substrate and any of the layers such as the transparent electrode layer or the light emitting layer (including between the substrate and the outside) (JP-A No. 11-283751).

«Production Method of Organic EL Element»

Subsequently, it is described a production method of an organic EL element having a constitution of:

anode/first light emitting unit/charge generating unit/second light emitting unit/cathode.

First, a thin film made of an anode substance is formed on an appropriate substrate using a required electrode substance with a vapor deposition method or a sputtering method in such a manner to have a thickness of 1 μm or less, preferably to have a thickness of 10 to 200 nm. Thus an anode is formed.

Then, on this, it is formed a first light emitting unit composed of: a hole injection layer, a hole transport layer, an electron blocking layer, a light emitting layer, an electron injection layer, and an electron transport layer.

Examples of a method of forming an organic compound thin are: a vapor deposition method, a wet process (a spin coating method, a cast method, an inkjet method, a printing method, a LB method (Langmuir Blodgett method), a spray coating method, a printing method, and a slot coater method. From the viewpoint of getting a uniform thin layer and hardly generating pinholes, specifically preferable methods are: a vacuum vapor deposition method, a spin coating method, an inkjet method, a printing method, and a slot coater method. A different film forming method may be applied to every organic layer.

When a vapor deposition method is adopted for forming each layer, the vapor deposition conditions may be changed depending on the compounds used. Generally, the following ranges are suitably selected for the conditions, heating temperature of boat: 50 to 450° C., level of vacuum: $1\times10^{-6}$ to $1\times10^{-2}$ Pa, vapor deposition rate: 0.01 to 50 nm/sec, temperature of substrate: −50 to 300° C., and layer thickness: 0.1 nm to 5 μm, preferably in the range of 5 to 200 nm.

Subsequently, a charge generating unit is formed on the first light emitting unit.

A method of forming a charge generating unit is not specifically limited as long as a thin film is formed. Examples thereof are: a vapor deposition method, a sputtering method, a wet process (a spin coating method, a cast method, an inkjet method, a LB method, a spray coating method, a printing method, and a slot coater method.

Subsequently, a second light emitting unit is formed on the charge generating unit in the same way as forming the first light emitting unit.

Then, a thin film made of a cathode substance is formed thereon with a vapor deposition method or a sputtering method in such a manner to have a thickness of 1 μm or less, preferably to have a thickness of in the range of 50 to 200 nm. Thus a cathode is formed.

By this, a required organic EL element is obtained.

Formation of this organic El element of the present invention is preferably continuously carried out from a first light emitting layer to a cathode with one time vacuuming. It may be taken out on the way, and a different layer forming method may be employed. In that case, it is required to make attention that the operation is done under a dry inert gas atmosphere.

Next, the organic El element may be sealed and protected. For example, the organic El element is covered with a heat curable resin under the condition that a part of or a whole portion of the anode and the cathode is exposed. The heat curable resin is heated to be cured, and the organic El element is sealed.

Then, the sealed body of the organic El element and the part of or the whole portion of the anode and the cathode exposed are covered with a protective member. The overlapped portion of the protective member is heated at a predetermined temperature with giving pressure. It may be used two sheets of protective members to cover the sealed body of the organic El element, and the edge portions of the protective members may be heated and pressed. Otherwise, it may be used one sheet of protective member to cover the sealed body of the organic El element by folding the protective member, and the edge portions (in particular, the opened portion) of the protective members may be heated and pressed.

By the above-described process, it may be produced an organic EL module containing an organic EL element sealed and protected.

«Other Constitution»

In the embodiment as described above, it is described an organic EL element of a bottom emission type. It has a constitution sequentially laminated on a substrate with: an anode composed of a transparent electrode, a first light emitting unit, a charge generating unit, a second light emitting unit, and a cathode that functions as a reflective electrode. The present invention is not limited to this constitution. For example, the order of layers may be reverse, and the position of the anode and the cathode may be switched. It is sufficient that the organic EL element has at least two light emitting layers.

Therefore, the layer constitution of the light emitting layer and laminated number are not limited in particular as long as the above-described conditions are satisfied. It may be use a constitution enabling to achieve a required organic EL element.

For example, the light emitting layers constituting the organic EL element may be two layers, or they may be three layers. In the light emitting layers, the light emitting material may be a single species, or a plurality of light emitting layers may be laminated directly or through an organic layer.

They may be suitably made in combination of these structures.

«Light Emitting Device—1»

As one embodiment of an electronic device provided with an organic EL element of the present invention, it is described a light emitting device.

An organic EL element used for a light emitting device may be provided with a rasonator structure on the organic EL element having the above-described configuration. The intended uses of the organic EL element provided with a rasonator structure are: a light source of a light memory media, a light source of an electrophotographic copier, a light source of a light communication processor, and a light source of a light sensor, however, it is not limited to them. It may be used for the above-described purposes by making to emit a laser.

A combination of the light emitting materials may be the following: a combination of a plurality of materials that emit phosphorescence or fluorescence; or a combination of a plurality of materials that emit phosphorescence or fluorescence and a color material that emits light excited by the light from the light emitting material. In the organic EL element of the present invention, it may be used a combination of a plurality of emission dopant in the light emitting layer.

The above-described organic EL element emits light by itself. This is different from the array constitution for obtaining an emission light by arranging the organic EL elements that emit each color light in parallel. Therefore, it is not required a mask for forming layers that compose the element. As a result, for example, a conductive layer may be formed with a vapor deposition method, a cast method a spin coating method, an inkjet method, or a printing method on the whole surface. This increases productivity of the element.

By employing the organic EL element described above, it is possible to produce a light emitting device having an emission light of substantially the same emission color.

«Light Emitting Device-2»

A light emitting device may be formed in a state of a large area by using a plurality of organic EL elements. In this case, the state of a large area is achieved: by making a plurality of light emitting panels placed on a substrate, then, by arranging these panels on a support substrate (namely, by tiling). The support substrate may be served as a sealing member. Each light emitting panel is tiled in a manner that the organic EL elements are interposed between the support substrate and the substrate of the light emitting panel. In the space between the support substrate and the substrate, it may be filled with an adhesive. The organic EL elements may be sealed by this adhesive.

In addition, terminals of the anode and the cathode are made exposed in the surroundings of the light emitting panel.

In the light emitting device having the above-described constitution, the center of each light emitting panel becomes alight emitting area, and there are produced non-light emitting areas between the light emitting panels. Therefore, a light extraction member may be placed in the non-light emitting areas of the light extraction surface for increasing the amount of light extraction from the non-light emitting areas. A light collection sheet or a light diffusion sheet may be used for a light extraction member.

EXAMPLES

Hereafter, the present invention will be described specifically by referring to examples, however, the present invention is not limited to them. In examples, the indication of "%" is used. Unless particularly mentioned, it represents "mass %".

«Preparation of Organic EL Element»

Each sample was prepared to have a light emitting are of 5 cm×5 cm.

(1) Preparation of Organic EL Element 101 (Red Color Type)

(1.1) Anode

As a transparent support substrate, it was arranged a glass substrate with a thickness of 0.7 mm. A film of ITO (indium tin oxide) with a thickness of 110 nm was formed on this transparent support substrate, then by making patterning to it. Thus an anode made of an ITO transparent electrode was prepared. The transparent support substrate provided with the ITO transparent electrode was subjected to ultrasonic washing with isopropyl alcohol, followed by drying with desiccated nitrogen gas, and it was subjected to UV ozone washing for 5 minutes.

Subsequently, the transparent support substrate formed an anode thereon was fixed to a substrate holder of a commercial vacuum deposition apparatus. The constituting materials for each layer of an organic EL element were loaded in each heating boat for vapor deposition in the vacuum deposition apparatus with an optimum amount. As a heating boat for vapor deposition, it was used a resistance heating boat made of molybdenum or tungsten.

(1.2) First Light Emitting Unit (1.2.1) Hole Injection Layer

After reducing the pressure of a vacuum tank to $4 \times 10^{-4}$ Pa, the heating boat containing an exemplified compound HI-145 (HAT-CN) was heated via application of electric current and vapor deposition was made onto the anode at a deposition rate of 0.1 nm/second, whereby it was produced a hole injection layer having a thickness of 5 nm.

(1.2.2) Hole Transport Layer

Subsequently, a compound 1-A (glass transition temperature (Tg) of 140° C.) having the following structure was vapor-deposited to form a layer having a thickness of 65 nm. Thus it was produced a hole transport layer.

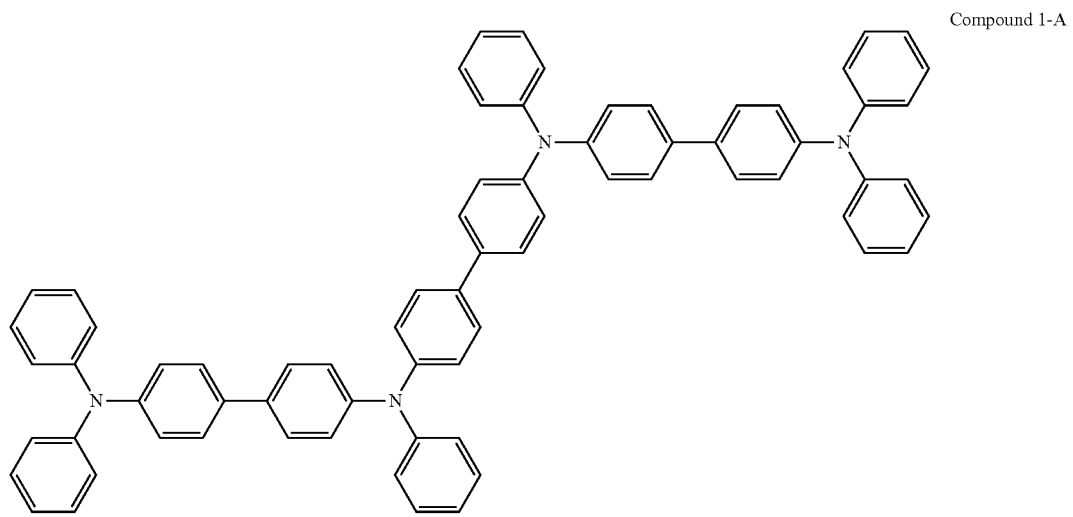 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]

Compound 1-A

(1.2.3) Electron Blocking Layer

Subsequently, a compound 1-B having the following structure was vapor-deposited to form a layer having a thickness of 20 nm. Thus it was produced an electron blocking layer.

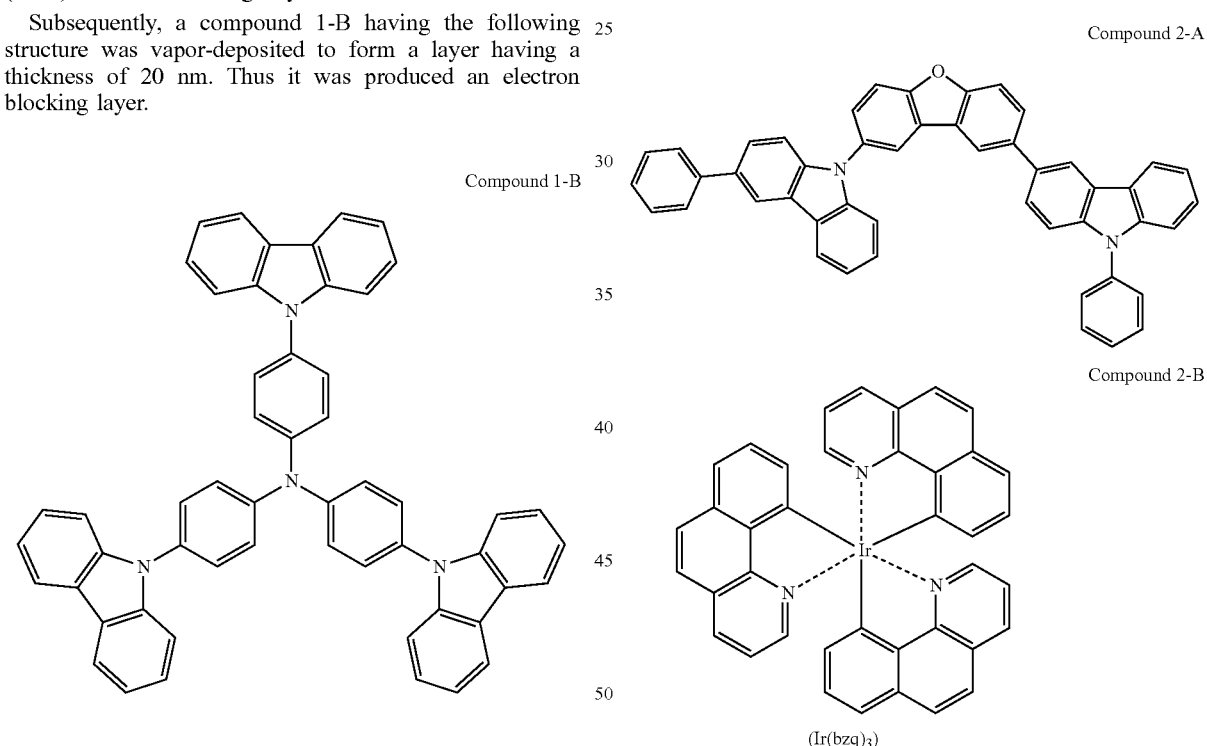

Compound 1-B

Compound 2-A

Compound 2-B (Ir(bzq)₃)

By the above-described processes, there was formed a layer having a hole transport property. The layer was made by sequentially laminating on the anode side: the exemplified compound HI-145; the compound 1-A; and the compound 1-B.

(1.2.4) Light Emitting Layer

Subsequently, there were vapor-deposited: a compound 2-A (Tg=143° C.) having the following structure as a host compound to be 77 vol %; a compound 2-B (Ir(bzq)₃) having the following structure as an assist dopant to be 15 vol %; and a compound pq (Orange 1) having the following structure as an emission dopant emitting orange phosphorescence to be 8 vol %. Thus it was produced a phosphorescence emitting layer having a thickness of 30 nm that emitted orange color.

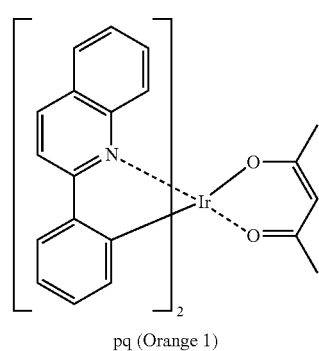

pq (Orange 1)

(1.2.5) Electron Transport Layer

Subsequently, there were vapor-deposited: a compound 3 having the following structure to be 86 vol %; and LiF to be 14 vol %. A layer having a thickness of 10 nm was formed. Further, there were vapor-deposited: a compound 3 to be 98 vol %; and Li to be 2 vol %. Another layer having a thickness of 10 nm was formed. By this, it was produced an electron transport layer (also served as an electron injection layer) composed of 2 layers, one layer being composed of the compound 3 and LiF, and another layer being composed of the compound 3 and Li.

Compound 3

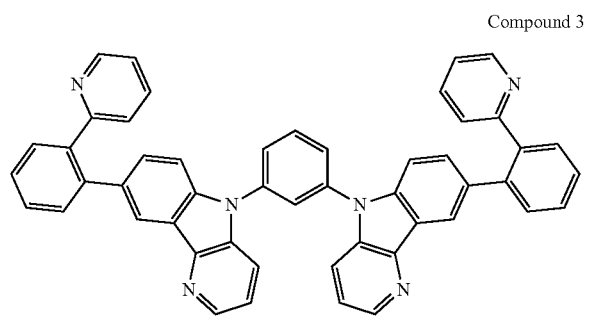 [SMILES: c1ccc(-c2ccccc2-c2ccc3c(c2)c2ncccc2n3-c2cccc(-n3c4ccc(-c5ccccc5-c5ccccn5)cc4c4ncccc43)c2)nc1]

By the above-described processes, it was prepared a first light emitting unit composed of: a hole injection layer, a hole transport layer, an electron blocking layer, a light emitting layer, and an electron transport layer.

(1.3) Charge Generating Unit

Subsequently, a charge generating unit was formed by forming a layer made of Ag with a thickness of 1 nm on the first light emitting unit.

(1.4) Second Light Emitting Unit (1.4.1) Layer Having a Hole Transport Property

Subsequently, in the same manner as forming the layer having a hole transport property in the first light emitting unit, the heating boat containing an exemplified compound HI-145 (HAT-CN) was heated via application of electric current and vapor deposition was made onto the charge generating unit at a deposition rate of 0.1 nm/second, whereby it was produced a hole injection layer having a thickness of 15 nm.

Then, the compound 1-A was vapor-deposited to have a thickness of 100 nm, and a hole transport layer was formed.

Further, the compound 1-B was vapor-deposited to have a thickness of 10 nm, and an electron blocking layer was formed.

By the above-described processes, there was formed a layer having a hole transport property. The layer was made by sequentially laminating on the charge generation unit side: the exemplified compound HI-145; the compound 1-A; and the compound 1-B.

(1.4.2) Light Emitting Layer

Subsequently, there were vapor-deposited: a compound 2-A (Tg=143° C.) as a host compound to be 77 vol %; a compound 2-B as an assist dopant to be 15 vol %; and a compound pq (Orange 1) as an emission dopant emitting orange phosphorescence to be 8 vol %. Thus it was produced a phosphorescence emitting layer having a thickness of 20 nm that emitted orange color.

(1.4.3) Electron Transport Layer

Subsequently, in the same manner as forming the electron transport layer of the first light emitting unit, there were vapor-deposited: a compound 3 to be 86 vol %; and LiF to be 14 volt. A layer having a thickness of 10 nm was formed. Further, there were vapor-deposited: a compound 3 to be 98 vol %; and Li to be 2 vol %. Another layer having a thickness of 10 nm was formed. By this, it was produced an electron transport layer composed of 2 layers, one layer being composed of the compound 3 and LiF, and another layer being composed of the compound 3 and Li.

(1.5) Cathode and Sealing

Subsequently, aluminum was vapor-deposited with a thickness of 150 nm to form a cathode.

Subsequently, the non-light emitting surface of the organic EL element which had been formed till the cathode was covered with a glass case, and glass case was contacted with the glass substrate on which was prepared the organic EL element. An epoxy based light curable type adhesive (LUXTRACK LC0629B produced by Toagosei Co., Ltd.) was employed in the periphery of the glass case as a sealing material. The sealing material was superimposed on the cathode side of the organic EL element to be brought into close contact with the glass substrate. Then, curing and sealing of the organic EL element were carried out via exposure of UV radiation onto the glass case side. Thus, an organic EL element 101 was prepared.

Incidentally, the sealing operation by the glass case was carried out in a glove box under nitrogen ambience (under an ambience of high purity nitrogen gas at a purity of at least 99.999%) so that the organic EL element was not brought into contact with the atmosphere.

(2) Preparation of Organic EL Elements 102 to 106 (Red Color Type)

Organic EL elements 102 to 106 were prepared in the same manner as preparation of the organic EL element 101 except that the emission dopant in the first and the second light emitting units was changed as described in Tables 1 and 2.

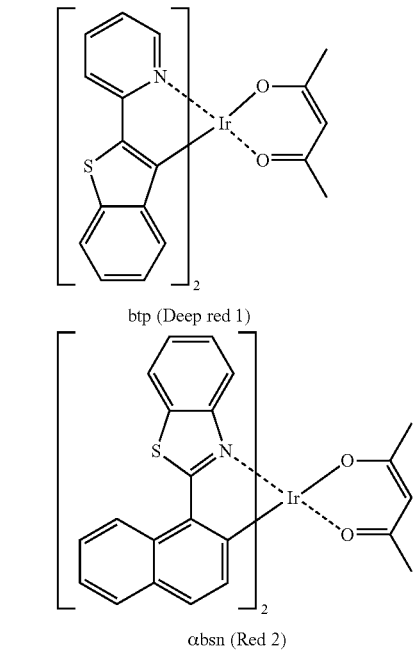

btp (Deep red 1)

αbsn (Red 2)

(3) Preparation of Organic EL Element 201 (Green Color Type)

(3.1) Anode

As a transparent support substrate, it was arranged a glass substrate with a thickness of 0.7 mm. A film of ITO (indium tin oxide) with a thickness of 110 nm was formed on this transparent support substrate, then by making patterning to it. Thus an anode made of an ITO transparent electrode was prepared. The transparent support substrate provided with the ITO transparent electrode was subjected to ultrasonic washing with isopropyl alcohol, followed by drying with desiccated nitrogen gas, and it was subjected to UV ozone washing for 5 minutes.

Subsequently, the transparent support substrate formed an anode thereon was fixed to a substrate holder of a commercial vacuum deposition apparatus. The constituting materials for each layer of an organic EL element were loaded in each heating boat for vapor deposition in the vacuum deposition apparatus with an optimum amount. As a heating boat for vapor deposition, it was used a resistance heating boat made of molybdenum or tungsten.

(3.2) First Light Emitting Unit
(3.2.1) Hole Injection Layer

After reducing the pressure of a vacuum tank to $4 \times 10^{-4}$ Pa, the heating boat containing an exemplified compound HI-145 (HAT-CN) was heated via application of electric current and vapor deposition was made onto the anode at a deposition rate of 0.1 nm/second, whereby it was produced a hole injection layer having a thickness of 5 nm.

(3.2.2) Hole Transport Layer

Subsequently, a compound 1-A (glass transition temperature (Tg) of 140° C.) was vapor-deposited to form a layer having a thickness of 55 nm. Thus it was produced a hole transport layer.

(3.2.3) Electron Blocking Layer

Subsequently, a compound 1-B having the following structure was vapor-deposited to form a layer having a thickness of 20 nm. Thus it was produced an electron blocking layer.

By the above-described processes, there was formed a layer having a hole transport property. The layer was made by sequentially laminating on the anode side: the exemplified compound HI-145; the compound 1-A; and the compound 1-B.

(3.2.4) Light Emitting Layer

Subsequently, there were vapor-deposited: a compound 2-A (Tg=143° C.) as a host compound to be 85 vol %; and a compound bt (Yellow 1) having the following structure as an emission dopant emitting yellow phosphorescence to be 15 vol %. Thus it was produced a phosphorescence emitting layer having a thickness of 30 nm that emitted yellow color.

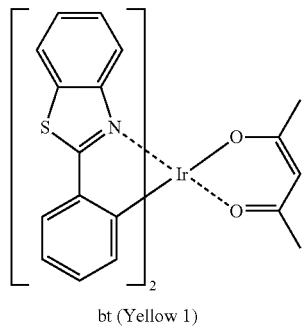

bt (Yellow 1)

(3.2.5) Electron Transport Layer

Subsequently, there were vapor-deposited: a compound 3 to be 86 vol %; and LiF to be 14 vol %. A layer having a thickness of 10 nm was formed. Further, there were vapor-deposited: a compound 3 to be 98 vol %; and Li to be 2 vol %. Another layer having a thickness of 10 nm was formed. By this, it was produced an electron transport layer (also served as an electron injection layer) composed of 2 layers, one layer being composed of the compound 3 and LiF, and another layer being composed of the compound 3 and Li.

By the above-described processes, it was prepared a first light emitting unit composed of: a hole injection layer, a hole transport layer, an electron blocking layer, a light emitting layer, and an electron transport layer.

(3.3) Charge Generating Unit

Subsequently, a charge generating unit was formed by forming a layer made of Ag with a thickness of 1 nm on the first light emitting unit.

(3.4) Second Light Emitting Unit
(3.4.1) Layer Having a Hole Transport Property

Subsequently, in the same manner as forming the layer having a hole transport property in the first light emitting unit, the heating boat containing an exemplified compound HI-145 (HAT-CN) was heated via application of electric current and vapor deposition was made onto the charge generating unit at a deposition rate of 0.1 nm/second, whereby it was produced a hole injection layer having a thickness of 15 nm.

Then, the compound 1-A was vapor-deposited to have a thickness of 75 nm, and a hole transport layer was formed.

Further, the compound 1-B was vapor-deposited to have a thickness of 10 nm, and an electron blocking layer was formed.

By the above-described processes, there was formed a layer having a hole transport property. The layer was made by sequentially laminating on the charge generation unit side: the exemplified compound HI-145; the compound 1-A; and the compound 1-B.

(3.4.2) Light Emitting Layer

Subsequently, there were vapor-deposited: a compound 2-A (Tg=143° C.) as a host compound to be 85 vol %; and a compound bt (Yellow 1) as an emission dopant emitting yellow phosphorescence to be 15 vol %. Thus it was produced a phosphorescence emitting layer having a thickness of 20 nm that emitted yellow color.

(3.4.3) Electron Transport Layer

Subsequently, in the same manner as forming the electron transport layer of the first light emitting unit, there were vapor-deposited: a compound 3 to be 86 vol %; and LiF to be 14 vol %. A layer having a thickness of 10 nm was formed. Further, there were vapor-deposited: a compound 3 to be 98 vol %; and Li to be 2 vol %. Another layer having a thickness of 10 nm was formed. By this, it was produced an electron transport layer composed of 2 layers, one layer being composed of the compound 3 and LiF, and another layer being composed of the compound 3 and Li.

(3.5) Cathode and Sealing

Subsequently, aluminum was vapor-deposited with a thickness of 150 nm to form a cathode.

Subsequently, the non-light emitting surface of the organic EL element which had been formed till the cathode was covered with a glass case, and glass case was contacted with the glass substrate on which was prepared the organic EL element. An epoxy based light curable type adhesive (LUXTRACK LC0629B produced by Toagosei Co., Ltd.) was employed in the periphery of the glass case as a sealing material. The sealing material was superimposed on the cathode side of the organic EL element to be brought into close contact with the glass substrate. Then, curing and sealing of the organic EL element were carried out via exposure of UV radiation onto the glass case side. Thus, an organic EL element 201 was prepared.

Incidentally, the sealing operation by the glass case was carried out in a glove box under nitrogen ambience (under an ambience of high purity nitrogen gas at a purity of at least 99.999%) so that the organic EL element was not brought into contact with the atmosphere.

(4) Preparation of Organic EL Element 202 (Green Color Type)

An organic EL element 202 was prepared in the same manner as preparation of the organic EL element 201 except that a light emitting layer of a second light emitting unit was changed as described below.

There were vapor-deposited: a compound 2-A (Tg=143° C.) as a host compound to be 77 vol %; a compound 2-B as an assist dopant to be 15 vol %; and a compound pq (Orange 1) as an emission dopant emitting orange phosphorescence to be 8 vol %. Thus it was produced a phosphorescence emitting layer having a thickness of 20 nm that emitted orange color.

(5) Preparation of Organic EL Elements 203 and 204 (Green Color Type)

Organic EL elements 203 and 204 were prepared in the same manner as preparation of the organic EL element 201 except that an emission dopant in a light emitting layer of a first and second light emitting unit each was changed as described in Table 4.

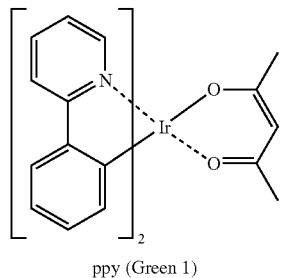

ppy (Green 1)

(6) Preparation of Organic EL Element 301 (Blue Color Type)

(6.1) Anode

As a transparent support substrate, it was arranged a glass substrate with a thickness of 0.7 mm. A film of ITO (indium tin oxide) with a thickness of 110 nm was formed on this transparent support substrate, then by making patterning to it. Thus an anode made of an ITO transparent electrode was prepared. The transparent support substrate provided with the ITO transparent electrode was subjected to ultrasonic washing with isopropyl alcohol, followed by drying with desiccated nitrogen gas, and it was subjected to UV ozone washing for 5 minutes.

Subsequently, the transparent support substrate formed an anode thereon was fixed to a substrate holder of a commercial vacuum deposition apparatus. The constituting materials for each layer of an organic EL element were loaded in each heating boat for vapor deposition in the vacuum deposition apparatus with an optimum amount. As a heating boat for vapor deposition, it was used a resistance heating boat made of molybdenum or tungsten.

(6.2) First Light Emitting Unit (6.2.1) Hole Injection Layer

After reducing the pressure of a vacuum tank to $4\times10^{-4}$ Pa, the heating boat containing an exemplified compound HI-145 (HAT-CN) was heated via application of electric current and vapor deposition was made onto the anode at a deposition rate of 0.1 nm/second, whereby it was produced a hole injection layer having a thickness of 5 nm.

(6.2.2) Hole Transport Layer

Subsequently, a compound 1-A (glass transition temperature (Tg) of 140° C.) having the following structure was vapor-deposited to form a layer having a thickness of 43 nm. Thus it was produced a hole transport layer.

(6.2.3) Electron Blocking Layer

Subsequently, a compound 1-B having the following structure was vapor-deposited to form a layer having a thickness of 20 nm. Thus it was produced an electron blocking layer.

By the above-described processes, there was formed a layer having a hole transport property. The layer was made by sequentially laminating on the anode side: the exemplified compound HI-145; the compound 1-A; and the compound 1-B.

(6.2.4) Light Emitting Layer

Subsequently, there were vapor-deposited: a compound 4-A (Tg=143° C.) having the following structure as a host compound to be 98 vol %; and a compound 4-B (Blue 1) having the following structure as an emission dopant emitting blue fluorescence to be 2 vol %. Thus it was produced a fluorescence emitting layer having a thickness of 30 nm that emitted blue color.

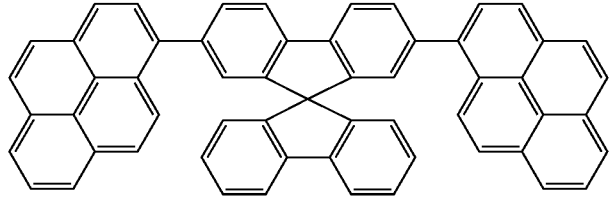

Compound 4-A

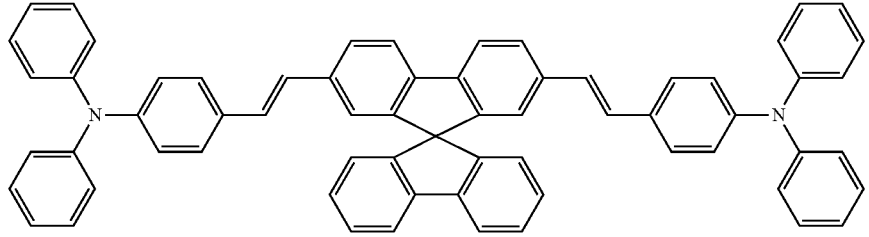

Compound 4-B (Blue 1)

(6.2.5) Electron Transport Layer

Subsequently, there were vapor-deposited: a compound 3 to be 86 vol %; and LiF to be 14 vol %. A layer having a thickness of 10 nm was formed. Further, there were vapor-deposited: a compound 3 to be 98 vol %; and Li to be 2 vol %. Another layer having a thickness of 10 nm was formed. By this, it was produced an electron transport layer (also served as an electron injection layer) composed of 2 layers, one layer being composed of the compound 3 and LiF, and another layer being composed of the compound 3 and Li.

By the above-described processes, it was prepared a first light emitting unit composed of: a hole injection layer, a hole transport layer, an electron blocking layer, a light emitting layer, and an electron transport layer.

(6.3) Charge Generating Unit

Subsequently, a charge generating unit was formed by forming a layer made of Ag with a thickness of 1 nm on the first light emitting unit.

(6.4) Second Light Emitting Unit (6.4.1) Layer Having a Hole Transport Property

Subsequently, in the same manner as forming the layer having a hole transport property in the first light emitting unit, the heating boat containing an exemplified compound HI-145 (HAT-CN) was heated via application of electric current and vapor deposition was made onto the charge generating unit at a deposition rate of 0.1 nm/second, whereby it was produced a hole injection layer having a thickness of 15 nm.

Then, the compound 1-A was vapor-deposited to have a thickness of 57 nm, and a hole transport layer was formed.

Further, the compound 1-B was vapor-deposited to have a thickness of 10 nm, and an electron blocking layer was formed.

By the above-described processes, there was formed a layer having a hole transport property. The layer was made by sequentially laminating on the charge generation unit side: the exemplified compound HI-145; the compound 1-A; and the compound 1-B.

(6.4.2) Light Emitting Layer

Subsequently, there were vapor-deposited: a compound 4-A (Tg=143° C.) as a host compound to be 98 vol %; and a compound 4-B (Blue 1) as an emission dopant emitting blue fluorescence to be 2 vol %. Thus it was produced a fluorescence emitting layer having a thickness of 20 nm that emitted blue color.

(6.4.3) Electron Transport Layer

Subsequently, in the same manner as forming the electron transport layer of the first light emitting unit, there were vapor-deposited: a compound 3 to be 86 vol %; and LiF to be 14 vol %. A layer having a thickness of 10 nm was formed. Further, there were vapor-deposited: a compound 3 to be 98 vol %; and Li to be 2 vol %. Another layer having a thickness of 10 nm was formed. By this, it was produced an electron transport layer composed of 2 layers, one layer being composed of the compound 3 and LiF, and another layer being composed of the compound 3 and Li.

(6.5) Cathode and Sealing

Subsequently, aluminum was vapor-deposited with a thickness of 150 nm to form a cathode.

Subsequently, the non-light emitting surface of the organic EL element which had been formed till the cathode was covered with a glass case, and glass case was contacted with the glass substrate on which was prepared the organic EL element. An epoxy based light curable type adhesive (LUXTRACK LC0629B produced by Toagosei Co., Ltd.) was employed in the periphery of the glass case as a sealing material. The sealing material was superimposed on the cathode side of the organic EL element to be brought into close contact with the glass substrate. Then, curing and sealing of the organic EL element were carried out via exposure of UV radiation onto the glass case side. Thus, an organic EL element 301 was prepared.

Incidentally, the sealing operation by the glass case was carried out in a glove box under nitrogen ambience (under an ambience of high purity nitrogen gas at a purity of at least 99.9990) so that the organic EL element was not brought into contact with the atmosphere.

(7) Preparation of Organic EL Element 302 (Blue Color Type)

Organic EL element 302 was prepared in the same manner as preparation of the organic EL element 101 except that the emission dopant in the second light emitting unit was changed as described in Table 5.

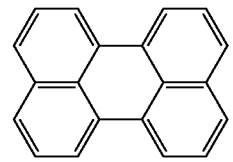

Perylene (Pale blue 1)

《Evaluation of Organic EL Element》

The prepared organic EL elements were subjected to the following evaluation tests.

The obtained evaluation results are listed in Tables 1 to 5.

(1) Measurement of Power Efficiency

The prepared organic EL elements were lighted. A front brightness of each organic EL element at a different voltage was measured with Spectroradiometer CS-1000 (made by Konica Minolta Inc.). A current efficiency of the organic EL element at a front brightness of 1,000 cd/m$^2$ was measured.

Here, the power efficiency values of the organic EL elements 102, 103, 105, 106, 202, 204, and 302 were indicated as a relative value when the power efficiency of the organic EL elements 101, 104, 201, 203, and 301 each were set to be 100.

(2) Lifetime at Normal Temperature

The prepared organic EL elements were lighted at normal temperature (25° C.) to exhibit an initial brightness of 4,000 cd/m$^2$. A lifetime of reaching the residual rate (brightness) of 70% of the initial brightness was measured.

Here, the lifetime at normal temperature values of the organic EL elements 102, 103, 105, 106, 202, 204, and 302 were indicated as a relative value when the lifetime value of the organic EL elements 101, 104, 201, 203, and 301 each were set to be 100.

(3) Driving Lifetime at 85° C.

The prepared organic EL elements were stored in a thermostatic chamber. The temperature of the thermostatic chamber was set to be 85° C., and the organic EL elements were continuously driven with an initial front brightness of 1,000 cd/m². A lifetime of reaching the residual rate (brightness) of 70% of the initial brightness was measured.

Here, the driving lifetime values of the organic EL elements 102, 103, 105, 106, 202, 204, and 302 were indicated as a relative value when t the driving lifetime value of the organic EL elements 101, 104, 201, 203, and 301 each were set to be 100.

(4) Measurement of UV and Visible (UV-Vis) Light Absorption Spectrum

The same organic layers (the layers from the hole injection layer of the first light emitting unit to the electron blocking layer of the second light emitting unit) were produced on a glass substrate. A UV-Vis light absorption spectrum was measured with Spectrophotometer U-3300 (made by Hitachi High-Technologies Co. Ltd.). A terminal wavelength $\lambda_{Am(lw)}$ of a longer wavelength side of a UV-Vis light absorption spectrum was calculated from the obtained UV-Vis light absorption spectrum The UV-Vis light absorption spectrum is represented to have a vertical axis of absorption intensity and a horizontal axis of wavelength. Tangential lines were drawn by moving from the longer wavelength side of the absorption spectrum to the maximum absorption intensity located at the longest wavelength among the maximum value of the absorption intensity of the UV-Vis light absorption spectrum. The tangential line drawn at the point exhibiting a maximum slope value (an inflection point) is made to be a tangential line drawn at the rising point of a longer wavelength side of a UV-Vis light absorption spectrum among the tangential lines on the curve of the spectrum. An intersection point of this tangential line with the horizontal line was determined to be a terminal wavelength $\lambda_{Am(lw)}$ of a longer wavelength side of a UV-Vis light absorption spectrum (refer to FIG. 3B).

Here, the local maximum point having an absorption intensity of 10% or less of the maximum absorption of the UV-Vis light absorption spectrum is not included in the maximum value of the above-described longest wavelength side.

In the same manner as production of each prepared organic EL element, only a light emitting layer containing a host compound and an emission dopant was prepared on a glass substrate with a thickness of 30 nm. A UV-Vis light absorption spectrum of the emission dopant was measured by using this light emitting layer.

(5) Measurement of PL Spectrum

A PL spectrum of an emission dopant was measured with Fluorophotometer F-4500 (made by Hitachi High-Technologies Co. Ltd.). Based on the result of the UV-Vis light absorption spectrum, it was used an excitation light that absorbs light an amount of 50 to 100% as light for exciting the PL spectrum.

Specifically, the measurement was done as follows. In the same manner as forming each organic EL element, only a light emitting layer containing a host compound and an emission dopant was prepared on a glass substrate with a thickness of 30 nm. The prepared emitting layer was measured.

When the single emission dopant was measured, there may occur a large difference between the PL spectrum in practice. Therefore, the measurement was done to a layer constitution similar to the light emitting layer used for the practical organic EL element (a layer that contains a host compound and an emission dopant. The host compound mainly absorbs light. After absorption of light, the excited host compound transfer energy to the emission dopant, and the emission dopant emits light.)

From the obtained PL spectrum, the largest emission maximum wavelengths $\lambda_{1(max)}$ and $\lambda_{2(max)}$ of the emission dopant in the light emitting layers of the first light emitting unit and the second light emitting unit were determined. Further, as described below, it was calculated a terminal wavelength $\lambda_{2(SW)}$ of a shorter wavelength side of a PL spectrum of the emission dopant of the second light emitting unit.

The PL spectrum is represented to have a vertical line of emission intensity and a horizontal line of wavelength. From the sorter wavelength side of the PL spectrum to the maximum value of the PL spectrum located at the shortest wavelength, a tangential line is drawn at each point of the spectrum while moving to the shortest maximum wavelength of the PL spectrum. These tangential lines increase their slope when the curve rises. The tangential line drawn at the point exhibiting a maximum slope value (an inflection point) is made to be a tangential line drawn at the rising point of a shorter wavelength side of a PL spectrum. An intersection point of this tangential line with a horizontal axis is made to be a terminal wavelength $A_{2(SW)}$ of a shorter wavelength side of a PL spectrum (refer to FIG. 3B).

Here, the local maximum point having an emission intensity of 10% or less of the maximum emission intensity of a PL spectrum is not included in the maximum value of the above-described shortest wavelength side.

TABLE 1

| Organic EL element No. | Emission dopant (First light emitting unit) Material | $\lambda_{1\ (max)}$ (nm): A | Emission dopant (Second light emitting unit) Material | $\lambda_{2\ (max)}$ (nm): B | $\lambda_{Am\ (lw)}$ (nm): C | $\lambda_{2\ (sw)}$ (nm): D | B − A (nm) | C − D (nm) | Current efficiency | Lifetime at normal temperature | Driving lifetime (85° C.) | Remarks |
|---|---|---|---|---|---|---|---|---|---|---|---|---|
| 101 | pq (Orange 1) | 595 | pq (Orange 1) | 595 | 599 | 548 | 0 | 51 | 100 | 100 | 100 | Comp. |
| 102 | pq (Orange 1) | 595 | btp (Deep red 1) | 634 | 599 | 594 | 39 | 5 | 101 | 115 | 130 | Inv. |
| 103 | btp (Deep red 1) | 634 | pq (Orange 1) | 595 | 638 | 548 | −39 | 90 | 95 | 93 | 90 | Comp. |

Comp. = Comparative example
Inv. = Inventive example

TABLE 2

| Organic EL element No. | Emission dopant (First light emitting unit) Material | $\lambda_{1\,(max)}$ (nm): A | Emission dopant (Second light emitting unit) Material | $\lambda_{2\,(max)}$ (nm): B | $\lambda_{Am\,(lw)}$ (nm): C | $\lambda_{2\,(sw)}$ (nm): D | B − A (nm) | C − D (nm) | Current efficiency | Lifetime at normal temperature | Driving lifetime (85° C.) | Remarks |
|---|---|---|---|---|---|---|---|---|---|---|---|---|
| 104 | αbsn (Red 2) | 605 | αbsn (Red 2) | 605 | 619 | 565 | 0 | 54 | 100 | 100 | 100 | Comp. |
| 105 | pq (Orange 1) | 595 | αbsn (Red 2) | 605 | 599 | 565 | 10 | 34 | 102 | 106 | 125 | Inv. |
| 106 | αbsn (Red 2) | 605 | pq (Orange 1) | 595 | 619 | 548 | −10 | 71 | 94 | 95 | 89 | Comp. |

Comp. = Comparative example
Inv. = Inventive example

TABLE 3

| Organic EL element No. | Emission dopant (First light emitting unit) Material | $\lambda_{1\,(max)}$ (nm): A | Emission dopant (Second light emitting unit) Material | $\lambda_{2\,(max)}$ (nm): B | $\lambda_{Am\,(lw)}$ (nm): C | $\lambda_{2\,(sw)}$ (nm): D | B − A (nm) | C − D (nm) | Current efficiency | Lifetime at normal temperature | Driving lifetime (85° C.) | Remarks |
|---|---|---|---|---|---|---|---|---|---|---|---|---|
| 201 | bt (Yellow 1) | 560 | bt (Yellow 1) | 560 | 550 | 500 | 0 | 50 | 100 | 100 | 100 | Comp. |
| 202 | bt (Yellow 1) | 560 | pq (Orange 1) | 595 | 550 | 548 | 35 | 2 | 103 | 118 | 127 | Inv. |

Comp. = Comparative example
Inv. = Inventive example

TABLE 4

| Organic EL element No. | Emission dopant (First light emitting unit) Material | $\lambda_{1\,(max)}$ (nm): A | Emission dopant (Second light emitting unit) Material | $\lambda_{2\,(max)}$ (nm): B | $\lambda_{Am\,(lw)}$ (nm): C | $\lambda_{2\,(sw)}$ (nm): D | B − A (nm) | C − D (nm) | Current efficiency | Lifetime at normal temperature | Driving lifetime (85° C.) | Remarks |
|---|---|---|---|---|---|---|---|---|---|---|---|---|
| 203 | ppy (Green 1) | 517 | ppy (Green 1) | 517 | 545 | 485 | 0 | 60 | 100 | 100 | 100 | Comp. |
| 204 | ppy (Green 1) | 517 | bt (Yellow 1) | 560 | 545 | 500 | 43 | 45 | 102 | 106 | 120 | Inv. |

Comp. = Comparative example
Inv. = Inventive example

TABLE 5

| Organic EL element No. | Emission dopant (First light emitting unit) Material | $\lambda_{1\,(max)}$ (nm): A | Emission dopant (Second light emitting unit) Material | $\lambda_{2\,(max)}$ (nm): B | $\lambda_{Am\,(lw)}$ (nm): C | $\lambda_{2\,(sw)}$ (nm): D | B − A (nm) | C − D (nm) | Current efficiency | Lifetime at normal temperature | Driving lifetime (85° C.) | Remarks |
|---|---|---|---|---|---|---|---|---|---|---|---|---|
| 301 | Compound 4-B (Blue 1) | 445 | Compound 4-B (Blue 1) | 445 | 454 | 400 | 0 | 54 | 100 | 100 | 100 | Comp. |
| 302 | Compound 4-B (Blue 1) | 445 | Perylene (Pale blue 1) | 465 | 454 | 410 | 20 | 44 | 103 | 105 | 118 | Inv. |

Comp. = Comparative example
Inv. = Inventive example (6) Summary

As is apparent from the results indicated in Tables 1 to 5, the organic EL element of the present invention is superior to the organic EL element of the comparative example in terms of power efficiency, driving lifetime at normal temperature, and driving lifetime at 85° C.

From the above-described results, it is proved that it is useful to make the following embodiment: a largest emission maximum wavelength in a photoluminescent spectrum of the emission dopant in the light emitting layer of the Nth light emitting unit is shorter than a largest emission maximum wavelength in a photoluminescent spectrum of the emission dopant in the light emitting layer of the (N+1)-th light emitting unit.

INDUSTRIAL APPLICABILITY

The present invention may be suitably applied to provide an organic EL element of high efficiency and long life.

DESCRIPTION OF SYMBOLS

1: Organic EL element
10: Transparent substrate
20: Anode
30: First light emitting unit
32: Hole transport layer
34: Light emitting layer
36: Electron transport layer
40: Charge generating unit
50: Second light emitting unit
52: Hole transport layer
54: Light emitting layer
56: Electron transport layer
60: Cathode
$A_N$ and $A_m$: Absorption spectrum
$P_N$, $P_{N+1}$, $P_1$, and $P_2$: PL spectrum
S and T: Overlapped portion
$t_2$ and $t_{Am}$: Tangential line

The invention claimed is:

1. An organic electroluminescent element comprising: a plurality of light emitting units interposed between a pair of an anode and a cathode; and a charge generating unit formed between the light emitting units,
   wherein a light emitting layer of a light emitting unit located in an N-th order from the anode and a light emitting layer of a light emitting unit located in an (N+1)-th order from the anode each contain an emission dopant to emit light of the same emission color,
   wherein a largest maximum emission wavelength in a photoluminescent spectrum of the emission dopant in the light emitting layer of the N-th light emitting unit is shorter than a largest maximum emission wavelength in a photoluminescent spectrum of the emission dopant in the light emitting layer of the (N+1)-th light emitting unit, and
   wherein the largest maximum emission wavelength in the photoluminescent spectrum of the emission dopant in the light emitting layer of the N-th light emitting unit is shorter by 20 to 50 nm than the largest maximum emission wavelength in the photoluminescent spectrum of the emission dopant in the light emitting layer of the (N+1)-th light emitting unit.

2. An organic electroluminescent element of claim 1, wherein an absorption spectrum of a material incorporated from the anode till the light emitting layer of the (N+1)-th light emitting unit and the photoluminescent spectrum of the emission dopant contained in the light emitting layer of the (N+1)-th light emitting unit satisfy the following conditional expression (1), $$\lambda_{Am(lw)} - \lambda_{N+1(sw)} \leq 50 \text{ nm} \quad \text{Conditional expression (1):}$$

wherein,
   $\lambda_{Am(lw)}$ (nm) is a terminal wavelength of a longer wavelength side of the absorption spectrum of the material incorporated from the anode till the light emitting layer of the (N+1)-th light emitting unit; and
   $\lambda_{N+1(sw)}$ (nm) is a terminal wavelength of a shorter wavelength side of the photoluminescent spectrum of the emission dopant contained in the light emitting layer of the (N+1)-th light emitting unit.

3. An organic electroluminescent element of claim 1, wherein all of the light emitting layers in the plurality of light emitting units contain the emission dopant to emit light of the same emission color.

4. An organic electroluminescent element comprising: a plurality of light emitting units interposed between a pair of an anode and a cathode; and a charge generating unit formed between the light emitting units,
   wherein a light emitting layer of a light emitting unit located in an N-th order from the anode and a light emitting layer of a light emitting unit located in an (N+1)-th order from the anode each contain an emission dopant to emit light of the same emission color,
   wherein a largest maximum emission wavelength in a photoluminescent spectrum of the emission dopant in the light emitting layer of the N-th light emitting unit is shorter than a largest maximum emission wavelength in a photoluminescent spectrum of the emission dopant in the light emitting layer of the (N+1)-th light emitting unit, and
   wherein an absorption spectrum of a material incorporated from the anode till the light emitting layer of the (N+1)-th light emitting unit and the photoluminescent spectrum of the emission dopant contained in the light emitting layer of the (N+1)-th light emitting unit satisfy the following conditional expression (1), $$\lambda_{Am(lw)} - \lambda_{N+1(sw)} \leq 50 \text{ nm} \quad \text{Conditional expression (1):}$$

wherein,
   $\lambda_{Am(lw)}$ (nm) is a terminal wavelength of a longer wavelength side of the absorption spectrum of the material incorporated from the anode till the light emitting layer of the (N+1)-th light emitting unit; and
   $\lambda_{N+1(sw)}$ (nm) is a terminal wavelength of a shorter wavelength side of the photoluminescent spectrum of the emission dopant contained in the light emitting layer of the (N+1)-th light emitting unit.

* * * * *